(12) United States Patent
Koo et al.

(10) Patent No.: US 12,156,438 B2
(45) Date of Patent: Nov. 26, 2024

(54) DISPLAY DEVICE WITH PROTRUSION ON INCLINED SIDE OF BANK

(71) Applicant: LG Display Co., Ltd., Seoul (KR)

(72) Inventors: ByoungHyun Koo, Seoul (KR); SungWook Yoon, Goyang-si (KR); Chung Hoon Lee, Paju-si (KR); DongMin Jang, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/540,249

(22) Filed: Dec. 14, 2023

(65) Prior Publication Data

US 2024/0130169 A1 Apr. 18, 2024

Related U.S. Application Data

(62) Division of application No. 17/336,253, filed on Jun. 1, 2021, now Pat. No. 11,925,069.

(30) Foreign Application Priority Data

Jun. 16, 2020 (KR) ........................ 10-2020-0073199

(51) Int. Cl.
*H01L 27/32* (2006.01)
*H10K 59/122* (2023.01)
*H10K 59/35* (2023.01)

(52) U.S. Cl.
CPC ......... *H10K 59/122* (2023.02); *H10K 59/352* (2023.02)

(58) Field of Classification Search
CPC .................... H01L 27/3246; H01L 27/3216
See application file for complete search history.

(56) References Cited

U.S. PATENT DOCUMENTS

| 8,324,806 | B2 | 12/2012 | Kaneta et al. |
| 9,087,964 | B2 | 7/2015 | Hatano et al. |

(Continued)

FOREIGN PATENT DOCUMENTS

| CN | 103781215 A | 5/2014 |
| CN | 107799564 A | 3/2018 |

(Continued)

OTHER PUBLICATIONS

China National Intellectual Property Administration, Office Action, Chinese Patent Application No. 202110655428.X, Dec. 27, 2023, 19 pages.

(Continued)

*Primary Examiner* — Peter Bradford
(74) *Attorney, Agent, or Firm* — Fenwick & West LLP

(57) ABSTRACT

A display device includes a substrate including an emission area and a non-emission area and in which a plurality of sub-pixels are defined, first electrodes disposed in the plurality of sub-pixels, respectively, a bank that is disposed in the non-emission area between the plurality of sub-pixels, and exposes the first electrode through an opening, a protrusion disposed in a second non-emission area of the non-emission area which is divided into a first non-emission area at a flat top surface of the bank and the second non-emission area at an inclined top surface of the bank, an organic layer disposed on the first electrodes, and a second electrode disposed on the organic layer.

9 Claims, 66 Drawing Sheets

(56) References Cited

U.S. PATENT DOCUMENTS

| | | |
|---|---|---|
| 9,614,180 B2 | 4/2017 | Kang |
| 10,084,019 B2 | 9/2018 | Shim et al. |
| 10,084,154 B2 | 9/2018 | Kang |
| 10,622,586 B2 | 4/2020 | Kang |
| 10,680,046 B2 | 6/2020 | Moon et al. |
| 10,903,283 B2 | 1/2021 | Choi |
| 10,903,448 B2 | 1/2021 | Kang |
| 11,088,232 B2 | 8/2021 | Choi et al. |
| 2011/0241027 A1 | 10/2011 | Kaneta et al. |
| 2012/0313123 A1 | 12/2012 | Kim |
| 2014/0103368 A1 | 4/2014 | Hatano et al. |
| 2014/0252321 A1* | 9/2014 | Pyon ............... H10K 50/8428 257/89 |
| 2015/0014636 A1 | 1/2015 | Kang |
| 2016/0190218 A1* | 6/2016 | Jeong ............... H10K 59/122 257/40 |
| 2016/0254476 A1 | 9/2016 | Park |
| 2017/0179431 A1 | 6/2017 | Kang |
| 2018/0061904 A1 | 3/2018 | Shim et al. |
| 2018/0366682 A1 | 12/2018 | Kang |
| 2019/0081117 A1 | 3/2019 | Moon et al. |
| 2019/0189706 A1 | 6/2019 | Choi |
| 2020/0083306 A1 | 3/2020 | Choi et al. |
| 2020/0105845 A1 | 4/2020 | Yang et al. |
| 2020/0220102 A1 | 7/2020 | Kang |
| 2021/0159285 A1 | 5/2021 | Choi |
| 2021/0335948 A1 | 10/2021 | Choi et al. |
| 2021/0391397 A1 | 12/2021 | Koo et al. |
| 2021/0408181 A1 | 12/2021 | Luo et al. |

FOREIGN PATENT DOCUMENTS

| | | |
|---|---|---|
| CN | 110137374 A | 8/2019 |
| CN | 110880524 A | 3/2020 |
| EP | 3499576 A1 | 6/2019 |
| JP | H08-315981 A | 11/1996 |
| JP | 2003-229267 A | 8/2003 |
| JP | 2004-039316 A | 2/2004 |
| JP | 2010-033971 A | 2/2010 |
| JP | 2011-154797 A | 8/2011 |
| JP | 2011-216267 A | 10/2011 |
| JP | 2012-216324 A | 11/2012 |
| JP | 2014-082133 A | 5/2014 |
| JP | 2014-235862 A | 12/2014 |
| JP | 2015-064391 A | 4/2015 |
| JP | 2015-170416 A | 9/2015 |
| JP | 2016-110942 A | 6/2016 |
| JP | 2019-110106 A | 7/2019 |
| JP | 2020-057599 A | 4/2020 |
| JP | 7193579 B2 | 12/2022 |
| KR | 20160053343 A * | 5/2016 |
| KR | 20170041370 A * | 4/2017 |
| KR | 10-2018-0025053 A | 3/2018 |
| KR | 10-2019-0029178 A | 3/2019 |
| KR | 10-2019-0057550 A | 5/2019 |

OTHER PUBLICATIONS

The Japan Patent Office, Office Action, Japanese Patent Application No. 2021-100405, Jun. 21, 2022, eight pages.

The Japan Patent Office, Office Action, Japanese Patent Application No. 2022-196478, Nov. 7, 2023, six pages.

United States Office Action, U.S. Appl. No. 17/336,253, filed Jun. 8, 2023, 15 pages.

The Japan Patent Office, Notice of Allowance, Japanese Patent Application No. 2022-196478, Apr. 30, 2024, six pages.

German Patent and Trade Mark Office, Office Action, German Patent Application No. 102021114876.6, Sep. 18, 2024, seven pages.

\* cited by examiner

DISPLAY DEVICE WITH PROTRUSION ON INCLINED SIDE OF BANK

CROSS-REFERENCE TO RELATED APPLICATIONS

This application is a divisional of U.S. patent application Ser. No. 17/336,253 filed on Jun. 1, 2021, which claims the priority of Republic of Korea Patent Application No. 10-2020-0073199 filed on Jun. 16, 2020, in the Korean Intellectual Property Office, each of which is incorporated herein by reference in its entirety.

BACKGROUND

Field

The present disclosure relates to a display device, and more particularly, to a display device in which light emission from a light emitting element caused by a leakage current can be reduced.

Description of the Related Art

As the world has reached a full-scale information age, the field of display devices for visually displaying electric information signals has grown rapidly. Thus, a great deal of research to increase performance such as thinning, weight lightening and low power consumption of various display devices continues.

Among these display devices, an organic light emitting diode display device is a self-light emitting display device that does not need a separate light source unlike a liquid crystal display device. Thus, the organic light emitting diode display device can be manufactured into a lightweight and thin form. Further, the organic light emitting diode display device is advantageous in terms of power consumption since it is driven with a low voltage. Also, the organic light emitting diode display device has excellent color expression ability, a high response speed, a wide viewing angle, and a high contrast ratio CR. Therefore, the organic light emitting diode display device has been researched as a next-generation display device.

SUMMARY

An object to be achieved by the present disclosure is to provide a display device that has a multi-stack structure in which a plurality of light emitting units is laminated to achieve improved efficiency and lifespan.

Another object to be achieved by the present disclosure is to provide a display device in which light emission from some of a plurality of light emitting elements, which has a common layer, caused by a leakage current may be reduced.

Yet another object to be achieved by the present disclosure is to provide a display device in which a disconnection structure of an organic layer may be stably secured.

Objects of the present disclosure are not limited to the above-mentioned objects, and other objects, which are not mentioned above, can be clearly understood by those skilled in the art from the following descriptions.

According to an aspect of the present disclosure, the display device includes: a substrate which includes an emission area and a non-emission area and in which a plurality of sub-pixels is defined. Further, the display device includes first electrodes disposed in the plurality of sub-pixels, respectively. Furthermore, the display device includes a bank which is disposed in the non-emission area between the plurality of sub-pixels and exposes the first electrode through an opening. Also, the display device includes a protrusion disposed in a second non-emission area of the non-emission area which is divided into a first non-emission area at a flat top surface of the bank and the second non-emission area at an inclined top surface of the bank. Moreover, the display device includes an organic layer disposed on the plurality of first electrodes and a second electrode disposed on the organic layer.

According to another aspect of the present disclosure, the display device includes first electrodes disposed in a plurality of sub-pixels, respectively. Further, the display device includes a bank which is disposed to cover a part of edges of the first electrode and includes a first area at a flat top surface and a second area at an inclined top surface. Furthermore, the display device includes a protrusion disposed on the bank and an organic layer disposed on the first electrodes. Also, the display device includes a second electrode disposed on the organic layer. The protrusion is disposed in the second area, and the organic layer and the second electrode are disconnected from each other at a side surface of the protrusion between adjacent sub-pixels.

Other detailed matters of the exemplary embodiments are included in the detailed description and the drawings.

According to the present disclosure, an organic light emitting element has a multi-stack structure and thus may achieve high efficiency and may be driven at a low current. Therefore, the lifespan of the organic light emitting element may be improved.

According to the present disclosure, it is possible to suppress a leakage current caused by a common layer of a plurality of lighting emitting elements.

According to the present disclosure, when a display device having a multi-stack structure is driven, light emission from an unintended light emitting element may be reduced. Thus, it is possible to enhance color reproduction properties.

According to the present disclosure, a disconnection structure of an organic layer may be stably secured. Thus, it is possible to improve production yield and processability.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
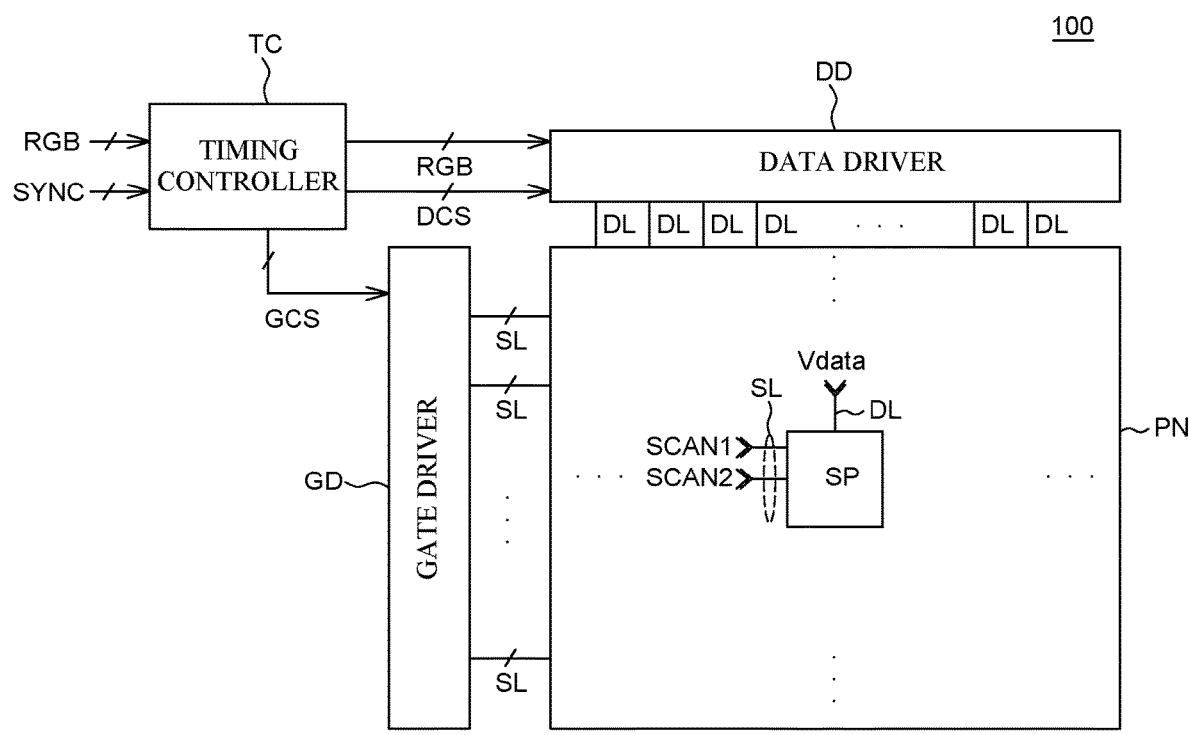
FIG. 1 is a schematic system configuration view of a display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a schematic system configuration view of a display device according to a first exemplary embodiment of the present disclosure.

For convenience in explanation, FIG. 1 illustrates only a display panel PN, a gate driver GD, a data driver DD and a timing controller TC from among various components of a display device 100. However, the present disclosure is not limited thereto.

Referring to FIG. 1, the display device 100 may include a display panel PN including a plurality of sub-pixels SP. The display device 100 may also include a gate driver GD and a data driver DD configured to supply various signals to the display panel PN, and a timing controller TC configured to control the gate driver GD and the data driver DD.

The gate driver GD may supply a plurality of scan signals to a plurality of scan lines SL in response to a plurality of gate control signals GCS supplied from the timing controller TC. The plurality of scan signals may include first and second scan signals SCAN1 and SCAN2. Although FIG. 1 illustrates that one gate driver GD is disposed on one side of the display panel PN as being spaced apart from the display panel PN, the present disclosure is not limited thereto.

The gate driver GD may also be disposed in a GIP (Gate In Panel) manner, and the present disclosure is not limited to the number and position of gate drivers GD.

The data driver DD may convert image data RGB input from the timing controller TC into a data signal by using a reference gamma voltage in response to a plurality of data control signals DCS supplied from the timing controller TC. Further, the data driver DD may supply the converted data signal to a plurality of data lines DL.

The timing controller TC may control the image data RGB input from the outside and supply the image data RGB to the data driver DD.

The timing controller TC may generate a gate control signal GCS and a data control signal DCS by using synchronization signals SYNC, such as a dot clock signal, a data enable signal and horizontal/vertical synchronization signals, input from the outside. The timing controller TC may supply the generated gate control signal GCS and data control signal DCS to the gate driver GD and data driver DD to control the gate driver GD and data driver DD, respectively.

The display panel PN is configured to display images to a user, and may include the plurality of sub-pixels SP. The display panel PN may include a plurality of scan lines SL and a plurality of data lines DL that intersect each other, and each of the plurality of sub-pixels SP may be connected to a scan line SL and a data line DL. Although not illustrated in the drawing, each of the plurality of sub-pixels SP may be further connected to a high potential power line, a low potential power line, an initialization signal line, a light emission control signal line, and the like.

Each of the plurality of sub-pixels SP is a minimum unit for displaying an image, and may include a light emitting element and a pixel circuit for driving the light emitting element. A plurality of light emitting elements may be defined variously depending on the type of the display panel PN. For example, if the display panel PN is an organic light emitting display panel, the light emitting element may be an organic light emitting element including an anode, a light emitting unit, and a cathode. Hereinafter, descriptions will be made assuming that the light emitting element is an organic light emitting element, but the light emitting element is not limited thereto.

The pixel circuit is configured to control driving of the light emitting element. The pixel circuit may be composed of a plurality of transistors and a capacitor, but is not limited thereto.

Hereinafter, the pixel circuit of the sub-pixel SP will be described in more detail with reference to FIG. 2.

Figure 2:
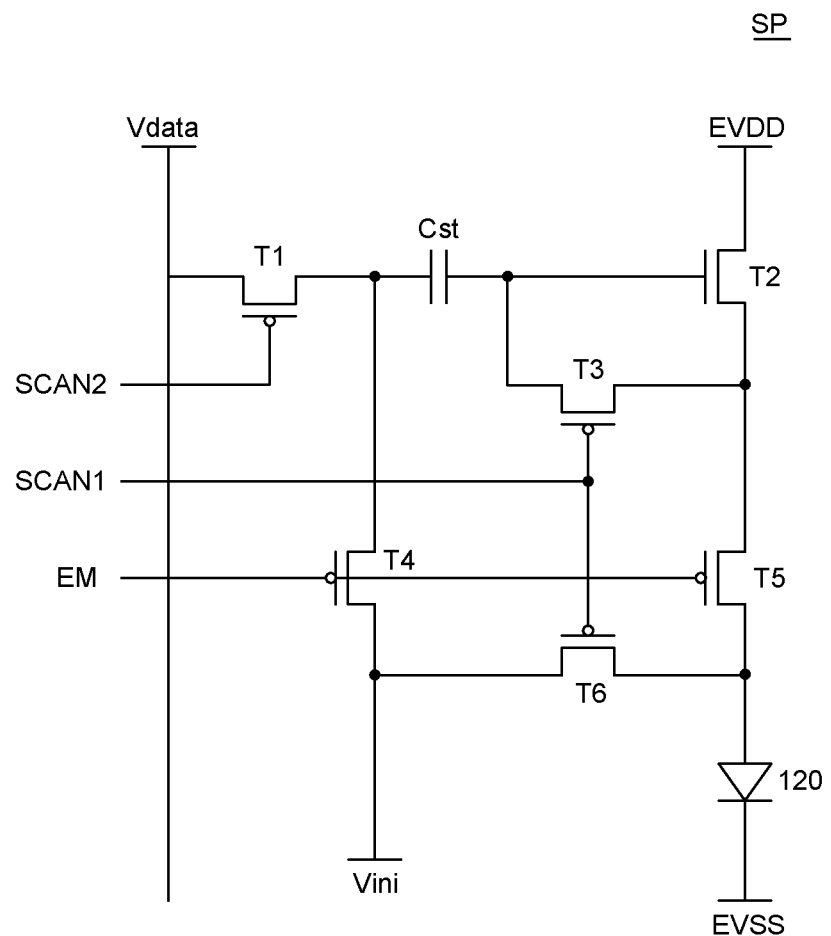
FIG. 2 is a circuit diagram of a sub-pixel of the display device according to the first exemplary embodiment of the present disclosure.

FIG. 2 is a circuit diagram of a sub-pixel of the display device according to the first exemplary embodiment of the present disclosure.

Referring to FIG. 2, a pixel circuit of each of the plurality of sub-pixels SP may include first to sixth transistors T1, T2, T3, T4, T5 and T6, and a capacitor Cst.

The first transistor T1 may be connected to a second scan line and controlled by a second scan signal SCAN2 supplied through the second scan line. The first transistor T1 may be electrically connected between a data line that supplies a data signal Vdata and the capacitor Cst. When the second scan signal SCAN2 of a turn-on level voltage is applied through the second scan line, the first transistor T1 may transfer the data signal Vdata, supplied from the data line, to the capacitor Cst. The first transistor T1 may be referred to as a switching transistor that controls timing of applying the data signal Vdata to the capacitor Cst.

The second transistor T2 may be electrically connected between a high potential power line that supplies a high potential power signal EVDD and the fifth transistor T5. Further, a gate electrode of the second transistor T2 may be electrically connected to the capacitor Cst. The second transistor T2 may be referred to as a driving transistor that controls the brightness of a light emitting element 130 by controlling a current flowing to the light emitting element 130 depending on a voltage applied to the gate electrode.

Also, the third transistor T3 may be controlled by a first scan signal SCAN1 supplied through a first scan line. The third transistor T3 may be electrically connected between the gate electrode and a drain electrode or between the gate electrode and a source electrode of the second transistor T2 depending on the type of the third transistor T3.

The second transistor T2 as the driving transistor is configured to control a current flowing to the light emitting element 130 depending on the data signal Vdata applied to the sub-pixel SP. However, due to a threshold voltage difference between the second transistors T2 disposed in the respective sub-pixels SP, there may be a difference in brightness between the light emitting elements 130 disposed in the respective sub-pixels SP.

In this case, the third transistor T3 may be disposed to compensate for a threshold voltage of the second transistor T2, and the third transistor T3 may be referred to as a compensating transistor. For example, if the first scan signal SCAN1 that turns on the third transistor T3 is applied, a voltage obtained by deducting the threshold voltage of the second transistor T2 from the high potential power signal EVDD may be applied to the gate electrode of the second transistor T2. In a state where the high potential power signal EVDD from which the threshold voltage is deducted is applied to the gate electrode of the second transistor T2, the data signal Vdata may be applied to the capacitor Cst. As such, the threshold voltage of the second transistor T2 may be compensated for.

The third transistor T3 and the first transistor T1 are illustrated as receiving different scan signals SCAN1 and SCAN2 through different scan lines, respectively. However, the third transistor T3 and the first transistor T1 may be connected to the same scan line and may receive the same scan signal SCAN1 or SCAN2, but the present disclosure is not limited thereto.

The fourth transistor T4 may be electrically connected to the capacitor Cst and an initialization signal line that supplies an initialization signal Vini. Further, the fourth transistor T4 may be controlled by a light emission control signal EM supplied through a light emission control signal line. When the light emission control signal EM of a turn-on level voltage is applied through the light emission control signal line, the fourth transistor T4 may initialize a voltage of the capacitor Cst. Alternatively, the fourth transistor T4 may allow a current depending on the data signal Vdata to flow in the light emitting element 130 while slowly discharging the data signal Vdata applied to the capacitor Cst.

The fifth transistor T5 may be electrically connected between the second transistor T2 and the light emitting element 130. Further, the fifth transistor T5 may be controlled by the light emission control signal EM supplied through the light emission control signal line. When the data signal Vdata is applied to the capacitor Cst and the high potential power signal EVDD with the compensated threshold voltage is applied to the gate electrode of the second transistor T2, the light emission control signal EM of a turn-on level voltage may be applied. In this case, the fifth transistor T5 may be turned on to allow a current to flow in the light emitting element 130 connected to low potential power signal EVS S.

The sixth transistor T6 may be electrically connected between the initialization signal line that supplies the initialization signal Vini and an anode of the light emitting element 130. Further, the sixth transistor T6 may be controlled by the first scan signal SCAN1 supplied through the first scan line. If the first scan signal SCAN1 of a turn-on level voltage is applied through the first scan line, the sixth transistor T6 may use the initialization signal Vini to initialize the anode of the light emitting element 130. Alternatively, the sixth transistor T6 may use the initialization signal Vini to initialize a node between the second transistor T2 and the fifth transistor T5.

The capacitor Cst may be a storage capacitor Cst that stores a voltage to be applied to the gate electrode of the second transistor T2 which is a driving transistor. Here, the capacitor Cst may be electrically connected between the gate electrode of the second transistor T2 and the anode of the light emitting element 130. Therefore, the capacitor Cst may store a difference between a voltage of the gate electrode of the second transistor T2 and a voltage applied to the anode of the light emitting element 130.

In the above description, the pixel circuit of each of the plurality of sub-pixels SP is illustrated as including, for example, the first to sixth transistors T1, T2, T3, T4, T5 and T6, and the capacitor Cst. However, as described above, the present disclosure is not limited thereto.

Hereinafter, the sub-pixel SP of the display device 100 according to the first exemplary embodiment of the present disclosure will be described in more detail with reference to FIG. 3A, FIG. 3B and FIG. 4.

Figure 3A:
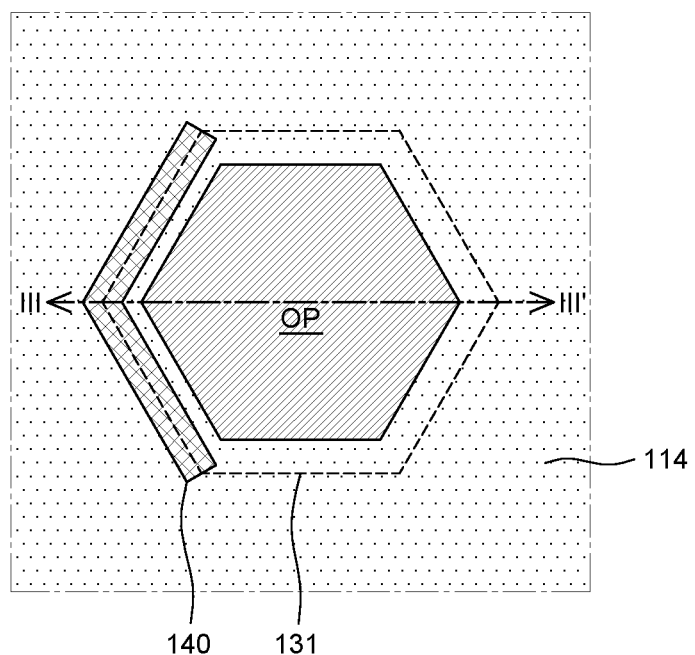
FIG. 3A is an enlarged plan view of a sub-pixel according to the first exemplary embodiment of the present disclosure.

FIG. 3A is an enlarged plan view of a sub-pixel according to the first exemplary embodiment of the present disclosure.

Figure 3B:
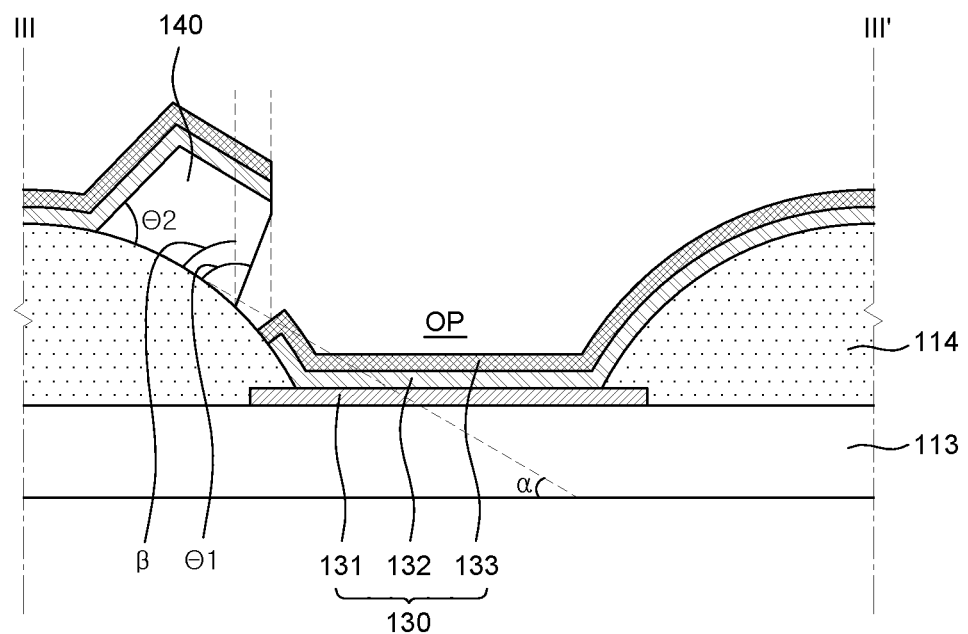
FIG. 3B is a cross-sectional view as taken along a line III-III' of FIG. 3A according to one embodiment.

FIG. 3B is a cross-sectional view as taken along a line III-IIP of FIG. 3A according to one embodiment.

Figure 4:
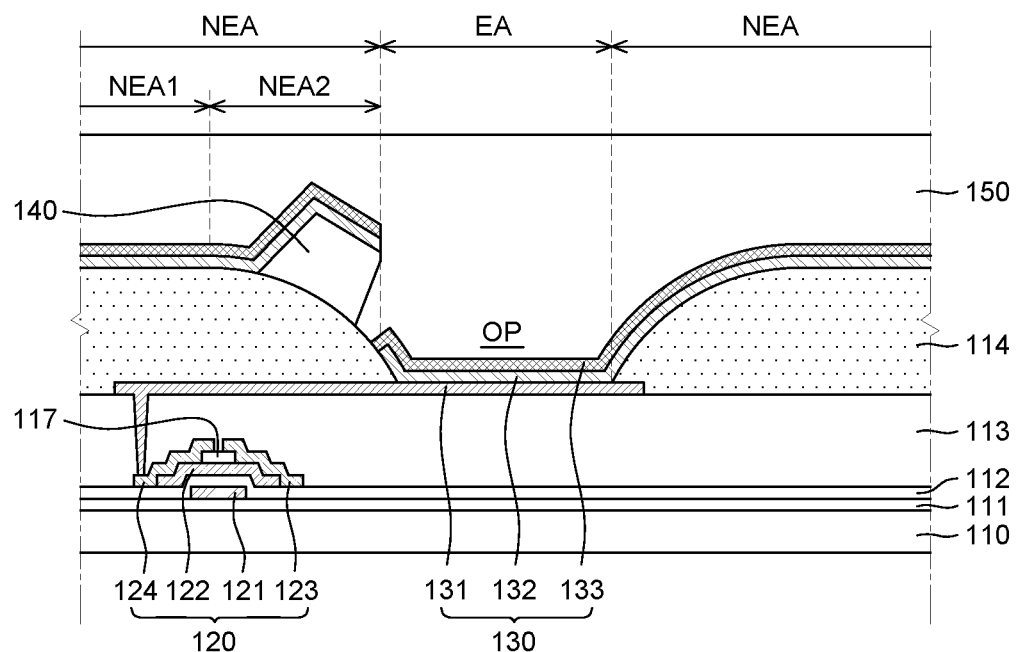
FIG. 4 is a cross-sectional view of the sub-pixel according to the first exemplary embodiment of the present disclosure.

FIG. 4 is a cross-sectional view of the sub-pixel according to the first exemplary embodiment of the present disclosure.

FIG. 3A illustrates an example where the sub-pixel has a hexagonal shape, but the present disclosure is not limited to the shape of the sub-pixel. FIG. 3B does not illustrate a lower structure under an overcoating layer 113, and FIG. 4 illustrates a lower structure including a transistor 120 shown in the cross-sectional view of FIG. 3B. However, the present disclosure is not limited to the lower structure shown in FIG. 4.

For convenience in explanation, FIG. 3A illustrates only a first electrode 131 and a bank 114 from among the components of the light emitting element 130. The bank 114 may be disposed on the first electrode 131 except a region exposed through an opening OP. For convenience in explanation, FIG. 4 illustrates only one transistor 120 from among the plurality of transistors T1, T2, T3, T4, T5 and T6 and the capacitor Cst of the pixel circuit of the sub-pixel.

Referring to FIG. 3A, FIG. 3B and FIG. 4, the display device according to the first exemplary embodiment of the present disclosure may include a substrate 110, the transistor 120, the light emitting element 130, the overcoating layer 113, the bank 114 and a sealing member 150. The display device may be a top emission type display device, but is not limited thereto.

Each of a plurality of sub-pixels is a unit that emits light, and the light emitting element 130 may be disposed in each of the plurality of sub-pixels. The plurality of sub-pixels may include first sub-pixels, second sub-pixels and third sub-pixels that emit light of different colors. For example, the first sub-pixels may be blue sub-pixels, the second sub-pixels may be green sub-pixels and the third sub-pixels may be red sub-pixels. However, the present disclosure is not limited thereto.

A plurality of sub-pixels may be defined by the bank 114. That is, the bank 114 may be disposed to overlay the overcoating layer 113 and a part of the first electrode 131 of the light emitting element 130 in the plurality of sub-pixels. The substrate 110 may be divided into an emission area EA and a non-emission area NEA. For example, in the non-emission area NEA, the bank 114 may be disposed on the first electrode 131 to block generation of light in the non-emission area NEA. Since the bank 114 is not disposed in the emission area EA, an organic layer 132 is directly positioned on the first electrode 131. Thus, light may be generated from the organic layer 132.

The non-emission area NEA may be divided into a first non-emission area NEA1 and a second non-emission area NEA2.

The first non-emission area NEA1 refers to an area at a flat top (upper) surface of the bank 114, and the second non-emission area NEA2 refers to an area at an inclined top surface of the bank 114. The second non-emission area NEA2 may be located between the first non-emission area NEA1 and the emission area EA.

According to the present disclosure, at least one protrusion 140 is disposed in the second non-emission area NEA2. FIG. 3A, FIG. 3B and FIG. 4 illustrate an example where one protrusion 140 is disposed at one side surface of the bank 114 (i.e., in the second non-emission area NEA2), but the present disclosure is not limited thereto. The protrusion 140 of the present disclosure may be disposed at both side surfaces of the bank 114 (i.e., in the second non-emission area NEA2), or two or more protrusions 140 may be disposed on at least one side surface of the bank 114.

As shown in FIG. 3A, the protrusion 140 may be disposed to surround a part of the first electrode 131 of the sub-pixel. Alternatively, the protrusion 140 may be disposed at the edges of the first electrode 131 along the shape of the opening OP of the sub-pixel, but is not limited thereto. FIG. 3A illustrates an example where the protrusion 140 is disposed only at a part of the edges of the first electrode 131 of the sub-pixel, but is not limited thereto. The protrusion 140 of the present disclosure may not be disposed on a part of the edges of the first electrode 131 of the sub-pixel for connection of a second electrode 133 between the adjacent sub-pixels. In the followings, the second electrode 133 is sometimes referred to be the cathode 133. Alternatively, at least a part of the protrusion 140 of the present disclosure may be disposed in the first non-emission area NEA1 rather than in the second non-emission area NEA2. Alternatively, the protrusion 140 of the present disclosure may be disposed along edges of the opening OP, and at least one part is disposed in the first non-emission area NEA1 and the other part is disposed in the second non-emission area NEA2, and the other part disposed in the second non-emission area NEA2 is greater in length than the at least one part of the protrusion disposed in the first non-emission area NEA1.

The protrusion 140 may be divided into a plurality of parts. That is, the protrusion 140 may be disconnected at a part of the edges of the first electrode 131 and divided into a plurality of parts. However, the present disclosure is not limited thereto.

Further, the protrusion 140 may be disposed to overlap in part the first electrode 131 under the protrusion 140, but is not limited thereto.

The protrusion 140 of the present disclosure may have a substantially trapezoidal shape in a cross-sectional view, but is not limited thereto. In this case, two angles θ1 and θ2 at the ends of the lower edge, i.e., the lower base may be acute or obtuse in a predetermined range. The protrusion 140 of the present disclosure may have various shapes such as a polygonal shape, for example, a triangular or rectangular shape, or a bell shape in a cross-sectional view.

The protrusion 140 of the present disclosure may function to suppress a lateral leakage current that occurs in, for example, a multi-stack structure. That is, the protrusion 140 of the present disclosure may disconnect the organic layer 132 and the cathode 133 from each other between adjacent sub-pixels. However, the present disclosure is not limited to the multi-stack structure, and may be effectively applied to a case where a lateral leakage current occurs in a general organic light emitting diode display device.

To suppress the influence of current leakage that occurs by the use of a common layer in an organic light emitting diode display device and occurs mainly due to a strong current path in a low-gray region, a route of the current path may be increased or disconnected. The present disclosure is more effective in disconnecting the current path.

Particularly, according to the present disclosure, the protrusion 140 is disposed at an inclined side surface of the bank 114, i.e., in the second non-emission area NEA2. Therefore, it is possible to disconnect the organic layer 132 not only at an obtuse angle but also at an acute angle of 90° or less as a taper angle. Herein, the taper angle (or tangent angle) refers to an angle between the substrate 110 and a tangent of the top surface of the bank 114 on which the protrusion 140 is disposed in the second non-emission area NEA2.

The protrusion 140 of the present disclosure may be made of a different material from the bank 114, but is not limited thereto. The protrusion 140 of the present disclosure may be made of the same material as the bank 114, and in this case, the protrusion 140 and the bank 114 may be formed in the same process.

The protrusion 140 may be patterned together with the bank 114.

The method of disconnecting the current path according to the present disclosure is performed under simple process conditions and has a high degree of freedom in selecting materials, as compared with a previous method using an etch rate difference.

Referring to FIG. 3B and FIG. 4, the substrate 110 is a supporting member for supporting the other components of the display device and may be made of an insulating material.

For example, the substrate 110 may be made of glass, resin, or the like. Also, the substrate 110 may be made of a material including plastic such as polymer or polyimide PI, or may be made of a material having flexibility.

A buffer layer 111 may be disposed on the substrate 110. The buffer layer 111 may suppress the permeation of moisture or impurities through the substrate 110. The buffer layer 111 may be formed as a single layer of silicon oxide SiOx or silicon nitride SiNx, or a multi-layer of silicon oxide SiOx and silicon nitride SiNx, but is not limited thereto. However, the buffer layer 111 may be omitted depending on the type of the substrate 110 or the type of the transistor, but is not limited thereto.

The transistor 120 may be disposed on the buffer layer 111. The transistor 120 may include a gate electrode 121, an active layer 122, a source electrode 123 and a drain electrode 124.

The transistor 120 shown in FIG. 4 has a structure in which the active layer 122 is disposed on the gate electrode 121, the source electrode 123 and the drain electrode 124 are disposed on the active layer 122. That is, the transistor 120 has a bottom gate structure in which the gate electrode 121 is located at the lowest layer, but the present disclosure is not limited thereto.

The gate electrode 121 may be disposed on the buffer layer 111.

The gate electrode 121 may be made of a conductive material such as copper Cu, aluminum Al, molybdenum Mo, nickel Ni, titanium Ti, chromium Cr or an alloy thereof, but is not limited thereto.

A gate insulating layer 112 may be disposed on the gate electrode 121.

The gate insulating layer 112 is configured to insulate the active layer 122 from the gate electrode 121. The gate insulating layer 112 may be formed as a single layer of silicon oxide SiOx or silicon nitride SiNx, or a multi-layer of silicon oxide SiOx and silicon nitride SiNx, but is not limited thereto.

The active layer 122 may be disposed on the gate insulating layer 112.

The active layer 122 may be made of a semiconductor material such as oxide semiconductor, amorphous silicon or poly-silicon, but is not limited thereto. For example, if the active layer 122 is made of oxide semiconductor, the active layer 122 is composed of a channel region, a source region and a drain region. The source region and the drain region may be made conductive, but the present disclosure is not limited thereto.

An etch stopper 117 may be disposed on the active layer 122. When the source electrode 123 and the drain electrode 124 are formed by etching and patterning, the etch stopper 117 may serve to suppress damage to the surface of the active layer 122 caused by plasma. One end of the etch stopper 117 may overlap the source electrode 123 and the other end of the etch stopper 117 may overlap the drain electrode 124. Otherwise, the etch stopper 117 may be omitted.

The source electrode 123 and the drain electrode 124 may be disposed on the active layer 122 and the etch stopper 117. The source electrode 123 and the drain electrode 124 are spaced apart from each other and may be electrically connected to the active layer 122. The source electrode 123 and the drain electrode 124 may be made of a conductive material such as copper Cu, aluminum Al, molybdenum Mo, nickel Ni, titanium Ti, chromium Cr or an alloy thereof, but are not limited thereto.

The overcoating layer 113 may be disposed on the transistor 120. The overcoating layer 113 is an insulating layer configured to flatten an upper portion of the substrate 110. The overcoating layer 113 may be made of an organic material. The overcoating layer 113 may be formed as a single layer of, for example, polyimide or photo acryl, or a multi-layer of polyimide and photo acryl, but is not limited thereto.

A plurality of light emitting elements 130 may be disposed in a plurality of sub-pixels on the overcoating layer 113. Each light emitting element 130 may include the first electrode 131, the organic layer 132 and the second electrode 133. Although not illustrated in the drawings, the organic layer 132 may be composed of an emission layer disposed in the emission area EA and a common layer disposed on the entire surface of the substrate 110 including the emission area EA and the non-emission area NEA.

The first electrode 131 may be disposed on the overcoating layer 113.

The first electrode 131 may be electrically connected to the transistor 120 and thus may be supplied with a driving current of the pixel circuit. The first electrode 131 may be made of a conductive material having a high work function to supply holes to the emission layer. The first electrode 131 may be made of a transparent conductive material such as indium tin oxide ITO or indium zinc oxide IZO, but is not limited thereto.

The display device may be implemented as a top emission type or a bottom emission type. In case of the top emission type display device, light emitted from the emission layer is reflected by the first electrode 131 in an upward direction, i.e., toward the second electrode 133. To this end, a reflective layer made of a metal material having high reflection efficiency, such as aluminum Al or silver Ag, may be further disposed under the first electrode 131. In case of the bottom emission type display device, the first electrode 131 may be made of a transparent conductive material only. Hereinafter, descriptions will be made assuming that the display device of the present disclosure is a top emission display device.

For example, the first electrode 131 may have a stack structure of two or more layers including a reflective layer.

The organic layer 132 may be disposed between the first electrode 131 and the second electrode 133.

Electrons and holes supplied from the first electrode 131 and the second electrode 133 are combined in the organic layer 132, causing the organic layer 132 to emit light.

Various organic light emitting element structures for improving efficiency and lifetime and reducing power consumption of an organic light emitting element have been proposed to improve quality and productivity of an organic light emitting diode display device.

Accordingly, an organic light emitting element adopting a single stack, i.e., a single electroluminescence unit (EL unit) has been proposed. Also, a tandem organic light emitting element 130 adopting a plurality of stacks, i.e., a stack of a plurality of EL units, has been proposed to improve efficiency and lifetime. However, the present disclosure is not limited to the tandem structure. Hereinafter, for convenience in explanation, the tandem structure will be described as an example.

In the tandem structure, (e.g., the organic light emitting element 130 adopting a stack of a first EL unit and a second EL unit) an emission area where light is emitted by recombination between electrons and holes is located in each of the first EL unit and the second EL unit. Further, light emitted from a first emission layer of the first EL unit and light emitted from a second emission layer of the second EL unit cause constructive interference. Thus, the tandem organic light emitting element 130 may provide higher brightness than the organic light emitting element 130 adopting a single stack structure.

The stack structure may include, for example, a charge generating layer disposed between the first electrode 131 and the second electrode 133. Further, the stack structure may include a first stack disposed between the charge generating layer and the first electrode 131, and a second stack disposed between the second electrode 133 and the charge generating layer. The charge generating layer may be disposed between the first stack and the second stack and may generate charges. The charge generating layer may have a structure in which a p-type charge generating layer and an n-type charge generating layer are laminated. That is, the charge generating layer may include the p-type charge generating layer and the n-type charge generating layer to generate positive charges and negative charges in both directions. The charge generating layer may substantially function as an electrode.

Each of the first stack and the second stack includes at least one emission layer, and may include common layers on and under the emission layer.

The distance between a plurality of sub-pixels consisting of a single pixel in the organic light emitting element 130 decreases as the resolution of the organic light emitting diode display device increases. Auxiliary organic layers such as hole injecting layer HIL, a hole transporting layer HTL, a charge generating layer CGL, an electron injecting layer EIL and an electron transporting layer ETL except an emission layer EML are deposited and formed into a common layer corresponding to all of a plurality of sub-pixels by using a common mask. Emission layers inside a plurality of sub-pixels that generates light of different wavelengths may be individually deposited and formed corresponding to the respective sub-pixels by using a fine metal mask.

As for the organic light emitting element 130 as described above, when a voltage is applied between the first electrode 131 and the second electrode 133, a lateral leakage current occurs in a horizontal direction of the organic light emitting element 130 through a common layer formed inside the organic light emitting element 130. Thus, color mixing caused by undesired emission of a sub-pixel adjacent to a sub-pixel required to emit light occurs.

Such color mixing may occur more seriously in the organic light emitting element 130 having a 2-stack structure in which the first EL unit and the second EL unit using constructive interference of light are laminated than in the organic light emitting element having a single stack structure.

Accordingly, in the present disclosure, as shown in FIG. 3A, FIG. 3B and FIG. 4, the protrusion 140 is formed in the inclined second non-emission area NEA2 of the bank 114. Thus, the organic layer 132 and the second electrode 133 between adjacent sub-pixels are disconnected in part. Therefore, particularly, when a display device having a multi-stack structure is driven, a leakage current may be reduced.

Referring to FIG. 3B and FIG. 4 again, the bank 114 may be disposed on the first electrode 131 and the overcoating layer 113. The bank 114 is an insulating layer disposed between a plurality of sub-pixels to separate the plurality of sub-pixels.

The bank 114 may include an opening OP through which a part of the first electrode 131 is exposed. The bank 114 may be an organic insulating material disposed to cover an edge or a peripheral portion of the first electrode 131. The bank 114 may be made of polyimide or acryl- or benzocyclobutene (BCB)-based resin, but is not limited thereto.

A plurality of spacers may be disposed on the bank 114 in the first non-emission area NEA1. That is, the spacers may be disposed on the flat top surface of the bank 114 in the first non-emission area NEA1. The spacers may be disposed on the bank 114 in the first non-emission area NEA1 to maintain a predetermined distance from a deposition mask when the light emitting element 130 is formed. A predetermined distance between the bank 114 and the first electrode 131 under the spacers and the deposition mask may be maintained by the spacers. Also, the spacers suppress damage caused by a contact. Herein, each of the plurality of spacers may be formed into, for example, a taper shape having a width decreasing toward an upper side thereof to minimize a contact area with the deposition mask.

The organic layer 132 may be disposed on the first electrode 131. The organic layer 132 may include an emission layer disposed in each of a plurality of sub-pixels and a common layer disposed in the plurality of sub-pixels in common. The emission layer is an organic layer configured to emit light of a specific color. Different emission layers may be disposed in a first sub-pixel, a second sub-pixel and a third sub-pixel, respectively. However, the present disclosure is not limited thereto. Each of the sub-pixels may include a plurality of emission layers to emit white light.

The common layer is an organic layer configured to improve the emission efficiency of the emission layer. The common layer may be formed as a single layer across the plurality of sub-pixels. That is, the common layer in each of the plurality of sub-pixels may be connected to each other and integrated as one body. The common layer may include an HIL, an HTL, an ETL, an EIL, a CGL and the like, but is not limited thereto.

The second electrode 133 may be disposed on the organic layer 132.

The second electrode 133 is an electrode configured to supply electrons to the organic light emitting element 130 according to the first exemplary embodiment of the present disclosure. The second electrode 133 may be made of a material having a low work function. The second electrode 133 may contain a transparent conductive material. For example, the second electrode 133 may be made of indium tin oxide ITO or indium zinc oxide IZO, indium gallium zinc oxide IGZO or the like. Alternatively, the second electrode 133 may contain any one of the group consisting of metal materials such as gold Au, silver Ag, aluminum Al, molybdenum Mo, magnesium Mg, palladium Pd and copper Cu or alloys thereof. For example, the second electrode 133 may be made of an alloy (Mg:Ag) of magnesium Mg and silver Ag. Alternatively, the second electrode 133 may have a stack of a layer made of a transparent conductive material, such as indium tin oxide ITO or indium zinc oxide IZO or indium gallium zinc oxide IGZO, and a layer made of a metal material, such as gold Au, silver Ag, aluminum Al, molybdenum Mo, magnesium Mg, palladium Pd or copper Cu, or an alloy thereof, but is not limited thereto.

Although not illustrated in the drawings, the second electrode 133 may be electrically connected to a low-potential power line and thus may be supplied with a low-potential power signal.

The sealing member 150 may be disposed on the second electrode 133. The sealing member 150 may be disposed on the bank 114 and the light emitting element 130. The sealing member 150 may suppress or at least reduce the permeation of oxygen and moisture into the display device from the outside. For example, when the display device is exposed to moisture or oxygen, a pixel shrinkage in which the emission area EA is reduced may occur or dark spots may appear in the emission area EA. Thus, the sealing member 150 blocks oxygen and moisture to protect the display device.

The sealing member 150 may include a first encapsulation layer, a second encapsulation layer and a third encapsulation layer.

The first encapsulation layer may be disposed on the second electrode 133 to suppress or at least reduce the permeation of moisture or oxygen. The first encapsulation layer may be made of an inorganic material such as silicon nitride SiNx, silicon oxynitride SiNxOy or aluminum oxide AlyOz, but is not limited thereto.

The second encapsulation layer may be disposed on the first encapsulation layer to flatten the surface of the first encapsulation layer. Also, the second encapsulation layer may cover foreign materials or particles which may be generated during a manufacturing process of the display device. The second encapsulation layer may be made of an organic material such as silicon oxycarbon SiOxCz or acryl- or epoxy-based resin, but is not limited thereto.

The third encapsulation layer may be disposed on the second encapsulation layer to suppress or at least reduce the permeation of moisture or oxygen like the first encapsulation layer. The third encapsulation layer may be made of an inorganic material such as silicon nitride SiNx, silicon oxynitride SiNxOy, silicon oxide SiOx or aluminum oxide AlyOz, but is not limited thereto.

As described above, a common layer of a plurality of light emitting elements 130 may be formed as a single layer across a plurality of sub-pixels. Since the light emitting elements 130 of the plurality of sub-pixels share the common layer, when the light emitting element 130 of a specific sub-pixel emits light, a current may flow to the light emitting element 130 of an adjacent sub-pixel. That is, current leakage may occur. The current leakage causes the light emitting element 130 of an unintended sub-pixel to emit light, which may result in color mixing between the plurality of sub-pixels and an increase in power consumption. Also, abnormal color, mura, and the like may be observed due to a leakage current, which may degrade the display quality. For example, if only the first sub-pixel of the plurality of sub-pixels emits light, some of the current supplied to drive the light emitting element 130 of the first sub-pixel may leak to the second sub-pixel and/or the third sub-pixel adjacent thereto through the common layer.

In the display device according to the present disclosure, the protrusion 140 is formed in the second non-emission area NEA2, i.e., an inclined side surface of the bank 114 as described above. Thus, current leakage through the common layer of the light emitting element 130 may be reduced. First, the protrusion 140 is formed at the inclined side surface of the bank 114 and the organic layer 132 and the second electrode 133 are deposited on the protrusion 140. Therefore, the length of a leakage current flow path may be increased. Since the common layer of the organic layer 132 serving as a lateral leakage current flow path is formed over the protrusion 140 protruding from the bank 114, a leakage current flow path may be increased regardless of whether the organic layer 132 is disconnected or not. Accordingly, it is possible to reduce a leakage current flowing to the light emitting element 130 of an adjacent sub-pixel. The organic layer 132 may be divided into a first organic layer disposed at the opening OP and a second organic layer disposed from the first non-emission area NEA1 of the bank 114 to an upper portion of the protrusion 140. Here, an end of the second organic layer may be spaced apart from the first organic layer at one side surface of the protrusion 140.

Also, in the display device according to the present disclosure, the protrusion 140 is disposed in the second non-emission area NEA2, i.e., the inclined side surface of the bank 114. Thus, the organic layer 132 and the second electrode 133 between adjacent sub-pixels may be disconnected at least in part. Accordingly, it is possible to reduce a leakage current flowing to an adjacent sub-pixel.

FIG. 3B and FIG. 4 illustrate an example where the organic layer 132 and the second electrode 133 are disconnected from each other on the right side of the protrusion 140, (e.g., between the emission area EA and the second non-emission area NEA2). However, the present disclosure is not limited thereto. The organic layer 132 and the second electrode 133 may be disconnected from each other on the left side as well as the right side of the protrusion 140 depending on the degree of the left side angle $\theta 2$ at the lower base.

Such a disconnection structure between the organic layer 132 and the second electrode 133 may be formed on at least one side surface of the protrusion 140. Since the protrusion 140 is disposed in the second non-emission area NEA2, (e.g., the inclined side surface of the bank 114) the degree of the right side angle $\theta 1$ at the lower base of the protrusion 140 with respect to a horizontal plane may be substantially increased. This will be described in detail with reference to FIG. 5.

Figure 5:
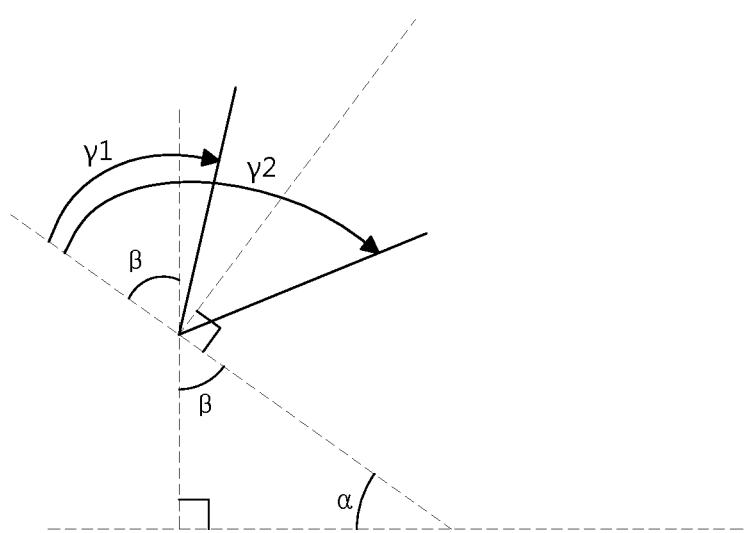
FIG. 5 is a diagram for explaining an angle range of a protrusion according to one embodiment of the present disclosure.

FIG. 5 is a diagram for explaining an angle range of a protrusion according to the present disclosure.

FIG. 5 is a diagram for explaining the protrusion 140, for example, an angle range of the protrusion 140, according to the first exemplary embodiment of the present disclosure and shown in FIG. 3B.

Referring to FIG. 5, the right side angle $\theta 1$ at the lower base of the protrusion 140 of the present disclosure may have an acute angle greater than 90°-α to have the disconnection structure. Also, the left side angle $\theta 2$ at the lower base of the protrusion 140 may have an acute angle.

In this case, the protrusion 140 may be made of an organic material or an inorganic material.

Further, the protrusion 140 may be made of a metal material. If the protrusion 140 is made of a metal, it is possible to completely block a lateral leakage current by discharge (or ground) in an initial timing period.

Herein, a refers to the angle between the top surface of the bank 114 on which the protrusion 140 is disposed and a horizontal line. That is, a refers to the angle between the substrate 110 and a tangent of the top surface of the bank 114 on which the protrusion 140 is disposed in the second non-emission area NEA2. Herein, the horizontal line may lie in the same direction as a deposition direction of the organic layer 132.

Also, β refers to the angle between the top surface of the bank 114 on which the protrusion 140 is disposed and a vertical line.

Further, γ1 and γ2 are illustrated as examples of the right side angle $\theta 1$ at the lower base of the protrusion 140.

As the right side angle $\theta 1$ at the lower base of the protrusion 140 gets closer to a vertical angle (90°), it is more advantageous for the disconnection structure regardless of a taper angle of the bank 114. However, the present disclosure is not limited thereto. The right side angle $\theta 1$ at the end of the lower base of the protrusion 140 may also have 90°.

Since a has a value equal to 90°-β, the right side angle $\theta 1$ at the lower base of the protrusion 140 needs to have an acute angle greater than 13. This is because if the right side angle $\theta 1$ at the lower base of the protrusion 140 is equal to the angle formed with the horizontal angle, the organic layer 132 and the cathode 133 may also be deposited on a side surface of the protrusion 140. However, the right side angle $\theta 1$ at the lower base of the protrusion 140 needs to have an acute angle remarkably greater than 13 in consideration of diffraction and interference margin during deposition of the organic layer 132.

Further, the right side angle $\theta 1$ at the lower base of the protrusion 140 of the present disclosure may have an obtuse angle smaller than 120°. If the right side angle $\theta 1$ at the lower base is 120° or more, the protrusion 140 may collapse due to a great difference in length between the upper base and the lower base. However, the present disclosure is not limited thereto. A range of the obtuse angle may vary depending on the height of the protrusion 140 or a critical dimension CD. The left side angle $\theta 2$ at the lower base of the protrusion 140 may also have an obtuse angle.

In this case, the protrusion 140 may be made of an organic material such as a chemically amplified resist (CAR)-based negative photo resist (PR) that forms a cross linker.

Meanwhile, if the angles $\theta 1$ and $\theta 2$ at the lower base of the protrusion 140 of the present disclosure have acute angles and at least a part of the protrusion 140 is disposed in the second non-emission area NEA2, the disconnection structure may be formed. If the angles $\theta 1$ and $\theta 2$ at the lower base of the protrusion 140 have obtuse angles, the disconnection structure may be formed in any region.

Also, even if the protrusion 140 of the present disclosure is disposed in the second non-emission area NEA2, it is possible to obtain processability more stably in a region where the tangent angle of the taper of the bank 114 is 45° or less than in a region where the tangent angle is between 45° and 90°.

Meanwhile, a protrusion of the present disclosure may be disposed at both side surfaces of a bank as described above. This will be described in detail according to a second exemplary embodiment of the present disclosure.

Figure 6A:
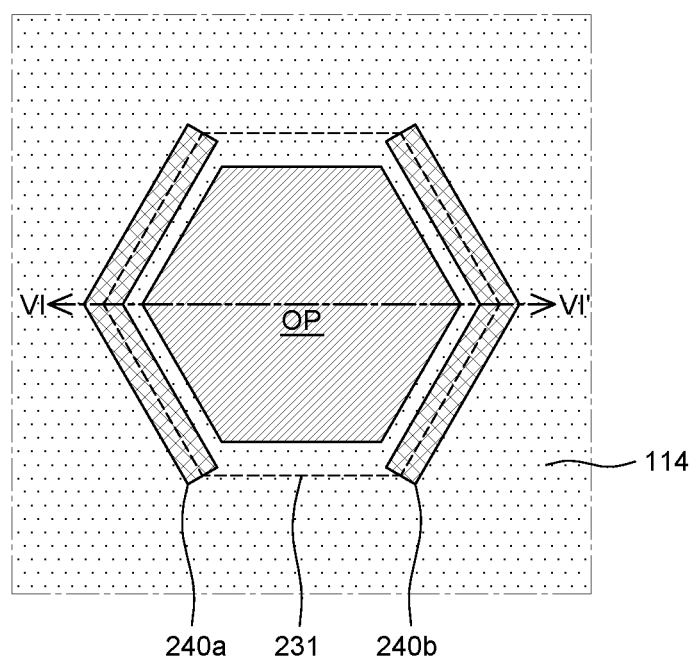
FIG. 6A is an enlarged plan view of a sub-pixel according to a second exemplary embodiment of the present disclosure.

FIG. 6A is an enlarged plan view of a sub-pixel according to the second exemplary embodiment of the present disclosure.

Figure 6B:
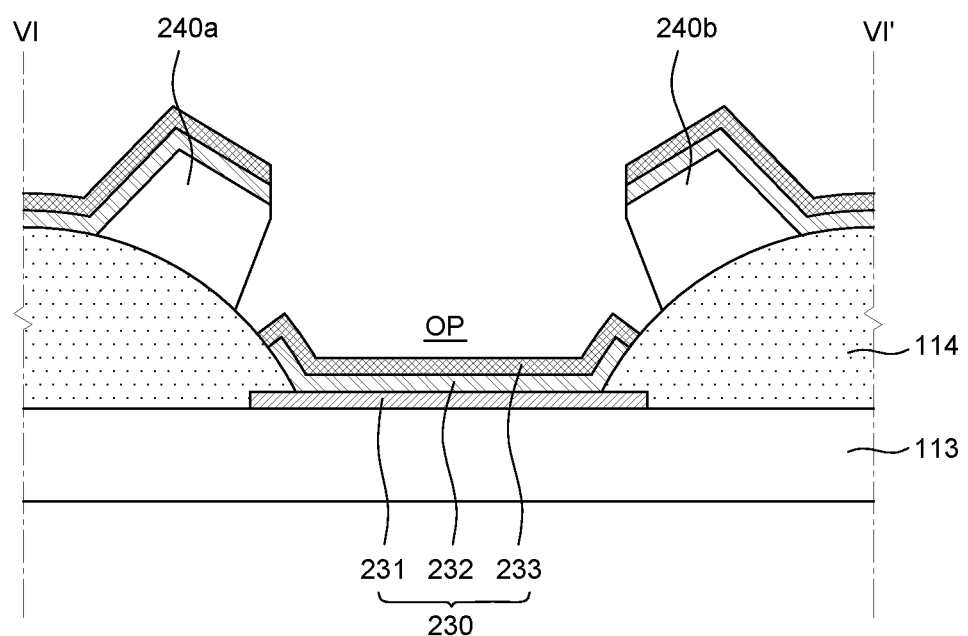
FIG. 6B is a cross-sectional view as taken along a line VI-VI' of FIG. 6A according to one embodiment.

FIG. 6B is a cross-sectional view as taken along a line VI-VI' of FIG. 6A according to one embodiment.

The second exemplary embodiment of the present disclosure shown in FIG. 6A and FIG. 6B has substantially the same configuration as the first exemplary embodiment of the present disclosure except that protrusions 240a and 240b are disposed at both side surfaces of the bank 114, (e.g., at both edges of the opening OP) and thus an organic layer 232 and a cathode 233 are disconnected at the both edges of the opening OP. In the followings, the cathode 233 is sometimes referred to be the second electrode 233. Thus, a repeated description will be omitted.

FIG. 6A illustrates an example where the sub-pixel has a hexagonal shape, but the present disclosure is not limited to the shape of the sub-pixel. For convenience in explanation, FIG. 6B does not illustrate a lower structure under the overcoating layer 113.

For convenience in explanation, FIG. 6A illustrates only a first electrode 231 and the bank 114 from among the components of a light emitting element 230. In the followings, the first electrode 231 is sometimes referred to be the anode 231. The bank 114 may be disposed in any region except a region exposed through the opening OP.

Referring to FIG. 6A and FIG. 6B, in a display device according to the second exemplary embodiment of the present disclosure, the protrusions 240a and 240b may be disposed at the both side surfaces of the bank 114 (i.e., both edges of the opening OP).

Two or more protrusions 240a and 240b may be disposed at the both side surfaces of the bank 114.

As shown in FIG. 6A, the protrusions 240a and 240b may be disposed to surround a part of the first electrode 231 of the sub-pixel. Alternatively, the protrusions 240a and 240b may be disposed at the edges of the first electrode 231 along the shape of the opening OP of the sub-pixel, but the present disclosure is not limited thereto.

The protrusions 240a and 240b are separated as a first protrusion 240a and a second protrusion 240b, but the present disclosure is not limited thereto. The first protrusion 240a and the second protrusion 240b may extend to be connected to each other at an upper or lower portion. The first protrusion 240a and the second protrusion 240b may not be disposed at edges of the first electrode 231 of the sub-pixel to make a connection between the second electrodes 233 between adjacent sub-pixels. Alternatively, the protrusions 240a and 240b of the present disclosure may be disposed at least in part in a first non-emission area rather than in a second non-emission area.

Further, the protrusions 240a and 240b may be disposed to overlap in part the first electrode 231 under the protrusions 240a and 240b, but the present disclosure is not limited thereto.

Each of the protrusions 240a and 240b of the present disclosure may have a substantially trapezoidal shape in a cross-sectional view, but the present disclosure is not limited thereto. In this case, two angles at the ends of the lower base may be acute or obtuse in a predetermined range. Each of the protrusions 240a and 240b of the present disclosure may have various shapes such as a polygonal shape, for example, a triangular or rectangular shape, or a bell shape in a cross-sectional view.

The protrusions 240a and 240b of the present disclosure may be made of a different material from the bank 114, but the present disclosure is not limited thereto. The protrusions 240a and 240b of the present disclosure may be made of the same material as the bank 114, and in this case, the protrusions 240a and 240b and the bank 114 may be formed in the same process.

The protrusions 240a and 240b may be patterned together with the bank 114.

Meanwhile, in the second exemplary embodiment of the present disclosure, the protrusions 240a and 240b are formed at the both inclined side surfaces of the bank 114. The organic layer 232 and the second electrode 233 deposited on the first electrode 231 may be disconnected from each other at the both inclined side surfaces of the bank 114. Therefore, current leakage may be more effectively reduced in the second exemplary embodiment of the present disclosure than in the first exemplary embodiment of the present disclosure. Also, if the protrusions 240a and 240b are symmetrically disposed at left and right edges of the opening OP, a viewing angle may be improved.

As described above, a protrusion of the present disclosure may be disposed to surround a first electrode of a sub-pixel and overlap at least in part a first non-emission area rather than in a second non-emission area. This will be described in detail according to a third exemplary embodiment of the present disclosure.

Figure 7A:
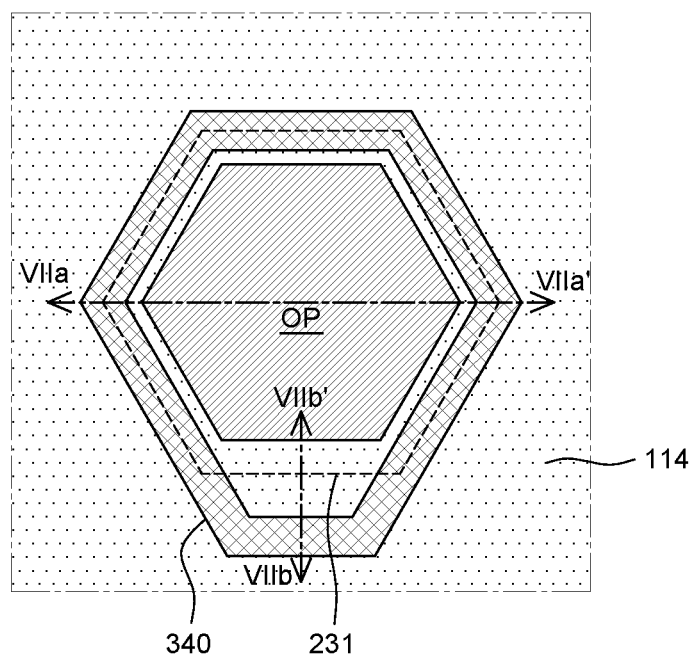
FIG. 7A is an enlarged plan view of a sub-pixel according to a third exemplary embodiment of the present disclosure.

FIG. 7A is an enlarged plan view of a sub-pixel according to the third exemplary embodiment of the present disclosure.

Figure 7B:
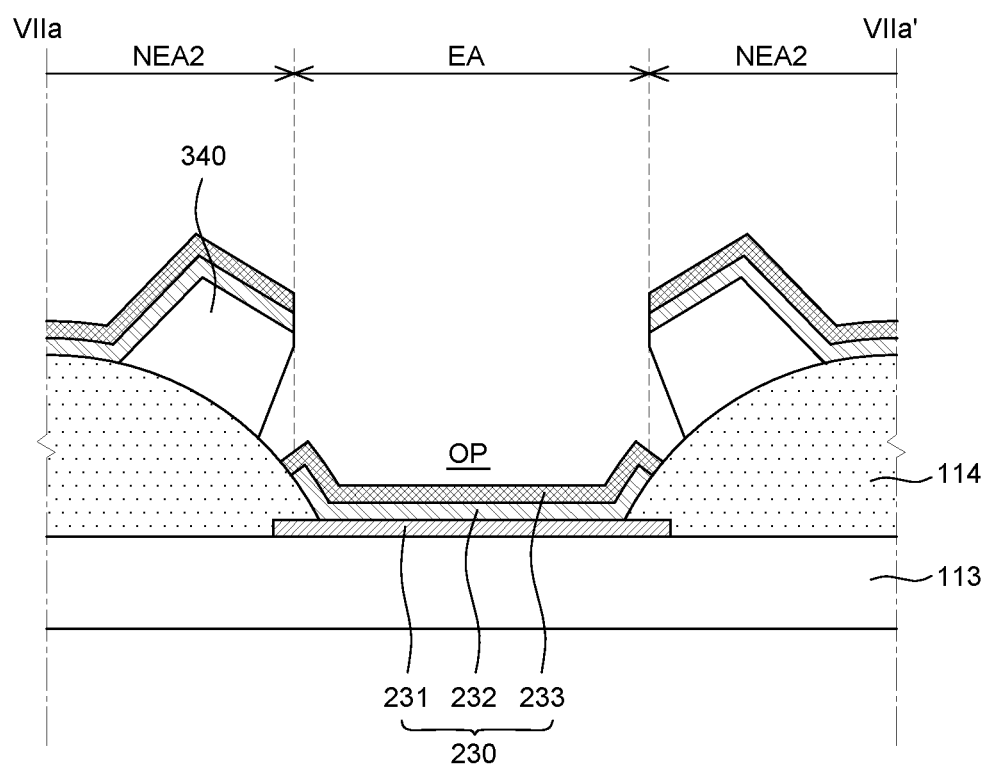
FIG. 7B is a cross-sectional view as taken along a line VIIa-VIIa' of FIG. 7A according to one embodiment.

FIG. 7B is a cross-sectional view as taken along a line VIIa-VIIa' of FIG. 7A according to one embodiment.

Figure 7C:
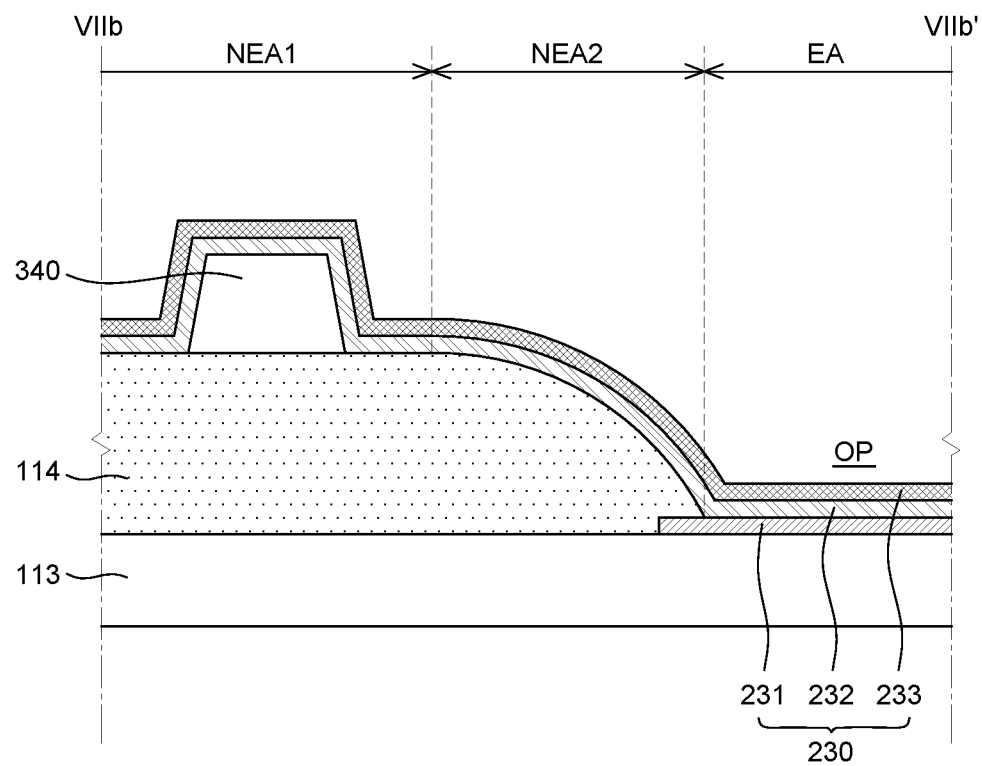
FIG. 7C is a cross-sectional view as taken along a line VIIb-VIIb' of FIG. 7A according to one embodiment.

FIG. 7C is a cross-sectional view as taken along a line VIIb-VIIb' of FIG. 7A according to one embodiment.

The third exemplary embodiment of the present disclosure shown in FIG. 7A to FIG. 7C has substantially the same configuration as the first exemplary embodiment of the present disclosure except that a protrusion 340 is disposed to surround the first electrode 231 of the sub-pixel and disposed at least in part in the first non-emission area NEA1 rather than in the second non-emission area NEA2. Thus, a repeated description will be omitted.

FIG. 7B is a cross-sectional view of left and right portions of the sub-pixel as taken along the line VIIa-VIIa' of FIG. 7A. FIG. 7C is a cross-sectional view of a lower portion of the sub-pixel as taken along the line VIIb-VIIb' of FIG. 7A.

FIG. 7B shows a cross-sectional view of the second non-emission area NEA2 and the emission area EA, and FIG. 7C shows a cross-sectional view of the first and second non-emission areas NEA1 and NEA2 and the emission area EA.

FIG. 7A illustrates an example where the sub-pixel has a hexagonal shape, but the present disclosure is not limited to the shape of the sub-pixel. For convenience in explanation, FIG. 7B and FIG. 7C do not illustrate a lower structure under the overcoating layer 113.

For convenience in explanation, FIG. 7A illustrates only the anode 231 and the bank 114 from among the components of the light emitting element 230. The bank 114 may be disposed in any region except a region exposed through the opening OP.

Referring to FIG. 7A and FIG. 7B, in a display device according to the third exemplary embodiment of the present disclosure, the protrusion 340 may be disposed at the edges of the opening OP of the bank 114.

Here, the protrusion 340 may be disposed to surround the entire circumference of the first electrode 231 of the sub-pixel. Alternatively, the protrusion 340 may be disposed at the edges of the first electrode 231 along the shape of the opening OP of the sub-pixel, but is not limited thereto.

In the third exemplary embodiment of the present disclosure, the protrusion 340 is disposed to surround the entire circumference of the first electrode 231 of the sub-pixel. Thus, the organic layer 232 and the second electrode 233 deposited on the first electrode 231 may be disconnected from each other at least an upper portion and left and right edges of the opening OP. Therefore, current leakage may be more effectively reduced in the third exemplary embodiment of the present disclosure than in the first and second exemplary embodiments of the present disclosure.

Further, the protrusion 340 may be disposed to overlap in part the first electrode 231 under the protrusion 340, but is not limited thereto.

The protrusion 340 of the present disclosure may have a substantially trapezoidal shape in a cross-sectional view, but is not limited thereto. In this case, two angles at the ends of the lower base may be acute or obtuse in a predetermined range. The protrusion 340 of the present disclosure may have various shapes such as a polygonal shape, for example, a triangular or rectangular shape, or a bell shape in a cross-sectional view.

The protrusion 340 of the present disclosure may be made of a different material from the bank 114, but is not limited thereto. The protrusion 340 of the present disclosure may be made of the same material as the bank 114, and in this case, the protrusion 340 and the bank 114 may be formed in the same process.

The protrusion 340 may be patterned together with the bank 114.

Referring to FIG. 7A and FIG. 7C, the protrusion 340 of the present disclosure may be disposed at least in part in the first non-emission area NEA1 rather than in the second non-emission area NEA2 to make a connection between the second electrodes 233 between adjacent sub-pixels.

The protrusion 340 disposed in the first non-emission area NEA1 has a smaller angle at the lower base with respect to the horizontal line than the protrusion 340 disposed at the inclined side surface of the bank 114, (e.g., in the second non-emission area NEA2). Thus, the organic layer 232 and the cathode 233 with the protrusion 340 interposed therebetween may be continuously deposited without a disconnection.

Meanwhile, two substrates may be provided to suppress the permeation of moisture and support the components. This will be described in detail according to a fourth exemplary embodiment of the present disclosure.

Figure 8:
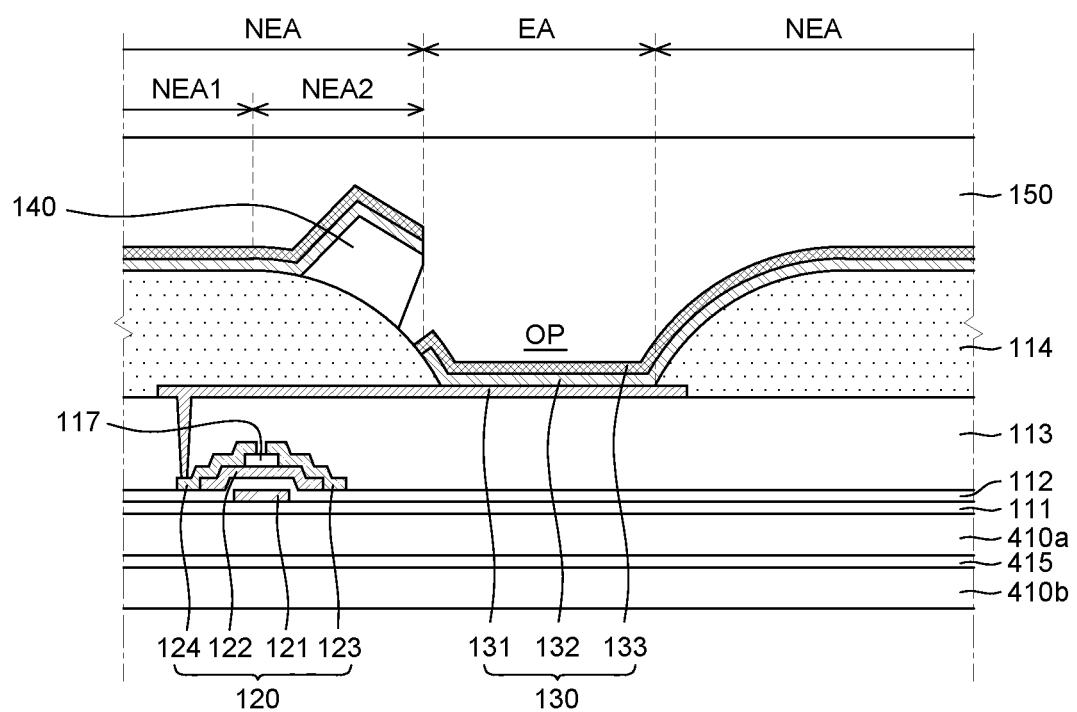
FIG. 8 is a cross-sectional view of a sub-pixel according to a fourth exemplary embodiment of the present disclosure.

FIG. 8 is a cross-sectional view of a sub-pixel according to the fourth exemplary embodiment of the present disclosure.

The fourth exemplary embodiment of the present disclosure shown in FIG. 8 has substantially the same configuration as the first exemplary embodiment of the present disclosure except that two substrates 410a and 410b are provided. Thus, a repeated description will be omitted.

FIG. 8 illustrates an example of a lower structure according to one embodiment, but the present disclosure is not limited thereto.

For convenience in explanation, FIG. 8 illustrates only one transistor 120 from among the plurality of transistors and the capacitor of the pixel circuit in the sub-pixel.

Referring to FIG. 8, a display device according to the fourth exemplary embodiment of the present disclosure may include the first and second substrates 410a and 410b, the transistor 120, the light emitting element 130, the overcoating layer 113, the bank 114 and the sealing member 150. The display device may be implemented as a top emission type, but is not limited thereto.

That is, the display device according to the fourth exemplary embodiment includes the first substrate 410a and the second substrate 410b and may further include a buffer layer 415 between the first substrate 410a and the second substrate 410b.

The first substrate 410a and the second substrate 410b are supporting members for supporting the other components of the display device and may be made of an insulating material. For example, the first substrate 410a and the second substrate 410b may be made of a material including plastic such as polymer or polyimide PI, or may be made of a material having flexibility. Also, a buffer layer 415 may be formed as a single layer of silicon oxide SiOx or silicon nitride SiNx, or a multi-layer of silicon oxide SiOx and silicon nitride SiNx, but is not limited thereto.

The transistor 120 shown in FIG. 8 has a structure in which the active layer 122 is disposed on the gate electrode 121 and the source electrode 123 and the drain electrode 124 are disposed on the active layer 122. That is, the transistor 120 has a bottom gate structure in which the gate electrode 121 is located at the lowest layer, but the present disclosure is not limited thereto.

FIG. 8 illustrates an example where one protrusion 140 is disposed at one side surface of the bank 114 (i.e., in the second non-emission area NEA2), but the present disclosure is not limited thereto. The protrusion 140 of the present disclosure may be disposed at both side surfaces of the bank 114 (e.g., in the second non-emission area NEA2), or two or more protrusions 140 may be disposed on at least one side surface of the bank 114.

Also, the protrusion 140 of the present disclosure may be disposed to surround the first electrode 131 of the sub-pixel except a part of the edges of the first electrode 131 of the sub-pixel. Alternatively, the protrusion 140 of the present disclosure may be disposed at least in part in the first non-emission area NEA1 rather than in the second non-emission area NEA2.

Further, the protrusion 140 of the present disclosure may include two or more parts at least a part of the edges of the first electrode 131 along the shape of the opening of the sub-pixel.

Meanwhile, active layers may be made of different materials from each other in consideration of the function of each of a plurality of transistors of a pixel circuit. This will be described in detail according to a fifth exemplary embodiment of the present disclosure.

Figure 9:
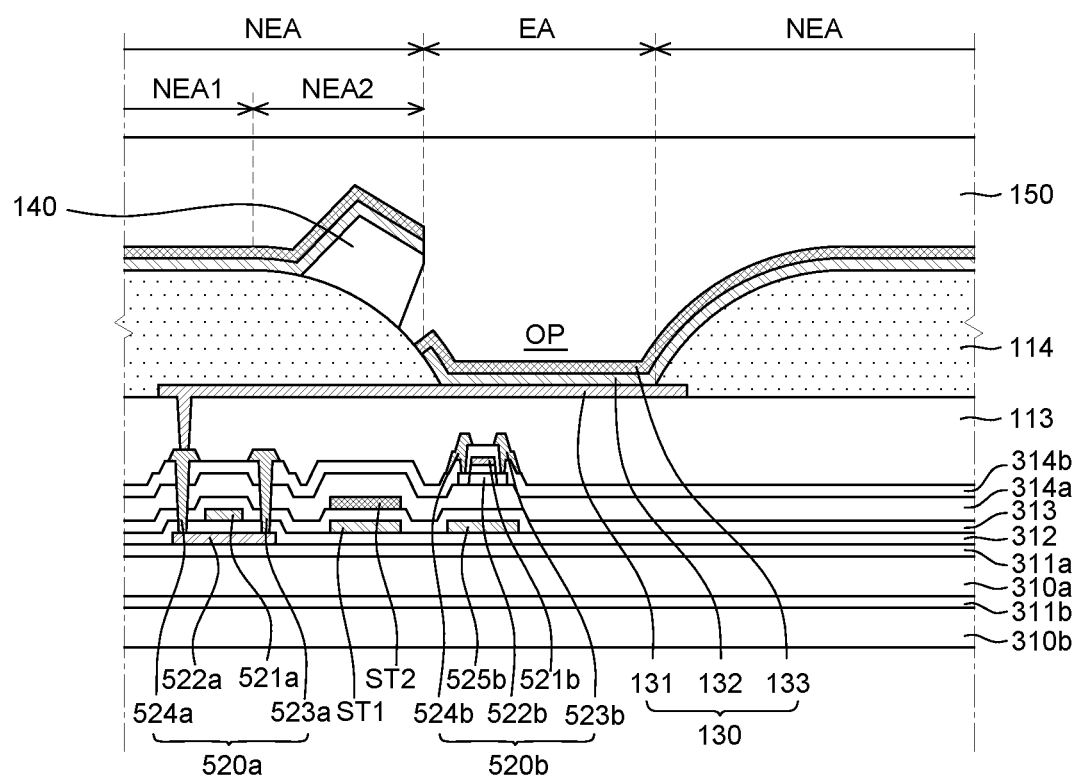
FIG. 9 is a cross-sectional view of a sub-pixel according to a fifth exemplary embodiment of the present disclosure.

FIG. 9 is a cross-sectional view of a sub-pixel according to the fifth exemplary embodiment of the present disclosure.

The fifth exemplary embodiment of the present disclosure shown in FIG. 9 has substantially the same configuration as the display device shown in FIG. 8 except transistors 520a and 520b. Thus, a repeated description will be omitted.

FIG. 9 illustrates an example of a lower structure according to one embodiment, but the present disclosure is not limited thereto.

For convenience in explanation, FIG. 9 illustrates the first and second transistors 520a and 520b from among the plurality of transistors of the pixel circuit in the sub-pixel.

Referring to FIG. 9, a display device according to the fifth exemplary embodiment of the present disclosure may include the first and second substrates 310a and 310b, the first and second transistors 520a and 520b, the light emitting element 130, the overcoating layer 113, the bank 114 and the sealing member 150.

That is, the display device according to the fifth exemplary embodiment includes the first substrate 310a and the second substrate 310b and may further include the buffer layer 311b between the first substrate 310a and the second substrate 310b.

FIG. 9 illustrates an example where one protrusion 140 is disposed at one side surface of the bank 114 (i.e., in the second non-emission area NEA2), but the present disclosure is not limited thereto. The protrusion 140 of the present disclosure may be disposed at both side surfaces of the bank 114 (e.g., in the second non-emission area NEA2), or two or more protrusions 140 may be disposed on at least one side surface of the bank 114.

Also, the protrusion 140 of the present disclosure may be disposed to surround the first electrode 131 of the sub-pixel except a part of the edges of the first electrode 131 of the sub-pixel. Alternatively, the protrusion 140 of the present disclosure may be disposed at least in part in the first non-emission area NEA1 rather than in the second non-emission area NEA2.

The first substrate 310a and the second substrate 310b are supporting members for supporting the other components of the display device and may be made of an insulating material. For example, the first substrate 310a and the second substrate 310b may be made of a material including plastic such as polymer or polyimide PI, or may be made of a material having flexibility. Also, the buffer layer 311b may be formed as a single layer of silicon oxide SiOx or silicon nitride SiNx, or a multi-layer of silicon oxide SiOx and silicon nitride SiNx, but is not limited thereto.

Another buffer layer 311a may be disposed on the first substrate 310a.

The buffer layer 311a may suppress or at least reduce the permeation of moisture or impurities through the first substrate 310a. The buffer layer 311a may be formed as a single layer of silicon oxide SiOx or silicon nitride SiNx, or a multi-layer of silicon oxide SiOx and silicon nitride SiNx, but is not limited thereto.

Although not illustrated in the drawings, yet another buffer layer may be disposed on the buffer layer 311a.

The yet another buffer layer may suppress or at least reduce the permeation of ions or impurities generated during crystallization of the first transistor 520a.

The first and second transistors 520a and 520b may be disposed on the buffer layer 311a.

The first transistor 520a may include a first active layer 522a, a first gate electrode 521a, a first source electrode 523a and a first drain electrode 524a.

The second transistor 520b may include a second active layer 522b, a second gate electrode 521b, a second source electrode 523b and a second drain electrode 524b.

The first active layer 522a may be disposed on the buffer layer 311a.

For example, the first active layer 522a may be made of low-temperature poly-silicon LTPS. The poly-silicon has high mobility, low power consumption and excellent reliability. Thus, the poly-silicon may be applied to a driving transistor and the like.

A gate insulating layer 312 may be disposed on the first active layer 522a.

The first gate electrode 521a may be disposed on the gate insulating layer 312.

A first storage electrode ST1 and a light shielding layer 525b may be disposed on the gate insulating layer 312.

The light shielding layer 525b is disposed to overlap the second active layer 522b of the second transistor 520b and protects the second transistor 520b against light or moisture entering from the outside. Thus, the light shielding layer 525b may reduce a change in element characteristics of the second transistor 520b. Although FIG. 9 illustrates that the light shielding layer 525b is floating, the light shielding layer 525b may be electrically connected to another component such as a plurality of lines, but the present disclosure is not limited thereto.

An interlayer insulating layer 313 may be disposed on the first gate electrode 521a, the first storage electrode ST1 and the light shielding layer 525b.

A second storage electrode ST2 may be disposed on the interlayer insulating layer 313 so as to overlap a part of the first storage electrode ST1.

First and second passivation layers 314a and 314b may be disposed on the second storage electrode ST2. The first and second passivation layers 314a and 314b may include contact holes for connection between the first source electrode 523a and the first drain electrode 524a, respectively, and the first active layer 522a. Also, the second passivation layer 314b may include contact holes for connection between the second source electrode 523b and the second drain electrode 524b, respectively, and the second active layer 522b.

The second active layer 522b may be disposed on the first passivation layer 314a.

The second active layer 522b may be made of an oxide semiconductor material. The oxide semiconductor material has a greater band gap than silicon, so that an electron may not cross the band gap in an off state and an off-current is low. Therefore, a transistor made of the oxide semiconductor material may be applied to a switching transistor which remains on for a short time and off for a long time.

A gate insulating layer may be disposed on the second active layer 522b, and the second gate electrode 521b may be disposed on the gate insulating layer.

The gate insulating layer may be patterned in the same manner as the second gate electrode 521b.

The first source electrode 523a and the first drain electrode 524a may be disposed on the second passivation layer 314b. The first source electrode 523a and the first drain electrode 524a spaced apart from each other may be electrically connected to the first active layer 522a. Also, the second source electrode 523b and the second drain electrode 524b may be disposed on the second passivation layer 314b. The second source electrode 523b and the second drain electrode 524b spaced apart from each other may be electrically connected to the second active layer 522b.

The overcoating layer 113 may be disposed on the second passivation layer 314b.

FIG. 9 illustrates an example where the first active layer 522a of the first transistor 520a is made of LTPS and the second active layer 522b of the second transistor 520b is made of the oxide semiconductor material. However, the first active layer 522a may be made of the oxide semiconductor material, or the second active layer 522b may be made of LTPS, but the present disclosure is not limited thereto.

In the display device according to the fifth exemplary embodiment of the present disclosure, a plurality of transistors 520a and 520b of the pixel circuit are composed of different types from each other. Thus, it is possible to improve the performance of the pixel circuit. The pixel circuit includes the plurality of transistors 520a and 520b and a capacitor, and the plurality of transistors 520a and 520b may be transistors of different types from each other. For example, in the first transistor 520a among the plurality of transistors 520a and 520b, the first active layer 522a may be made of LTPS. Also, in the second transistor 520b, the second active layer 522b may be made of the oxide semiconductor material. The first transistor 520a including LTPS has high mobility and low power consumption and thus may be applied to a driving transistor. The second transistor 520b including the oxide semiconductor material remains on for a short time and off for a long time and thus may be applied to a switching transistor. Therefore, in the display device according to the fifth exemplary embodiment of the present disclosure, the first and second active layers 522a and 522b may be made of different materials from each other in consideration of the function of each of the plurality of transistors 520a and 520b of the pixel circuit. Also, the performance of the pixel circuit may be improved.

As described above, angles at the ends of the lower base of a protrusion of the present disclosure may be obtuse. This will be described in detail according to a sixth exemplary embodiment of the present disclosure.

Figure 10A:
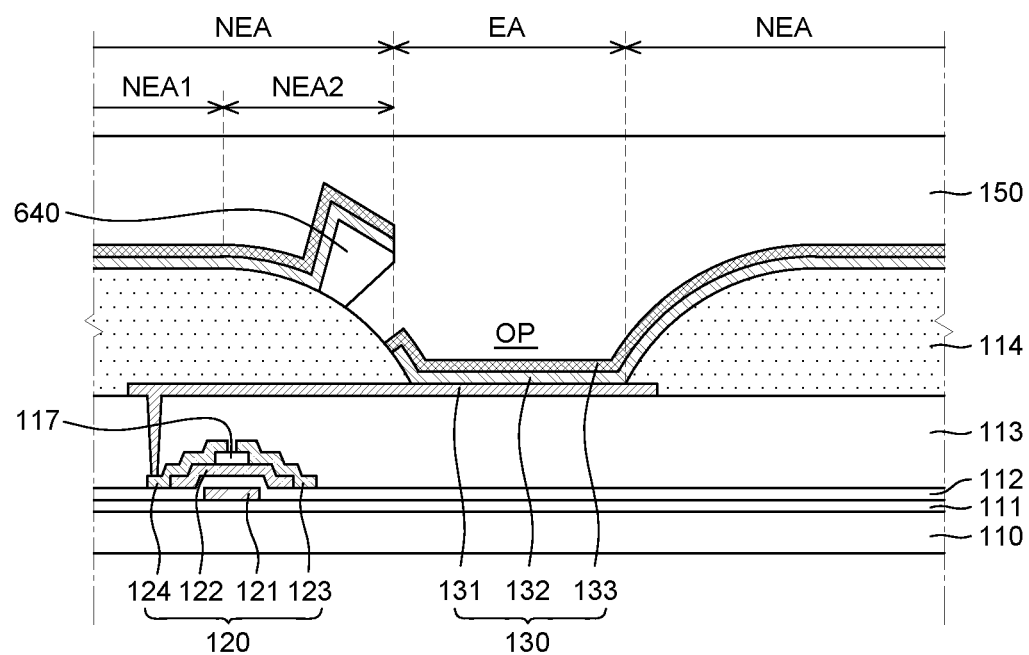
FIG. 10A and FIG. 10B are cross-sectional views of a sub-pixel according to a sixth exemplary embodiment of the present disclosure.
Figure 10B:
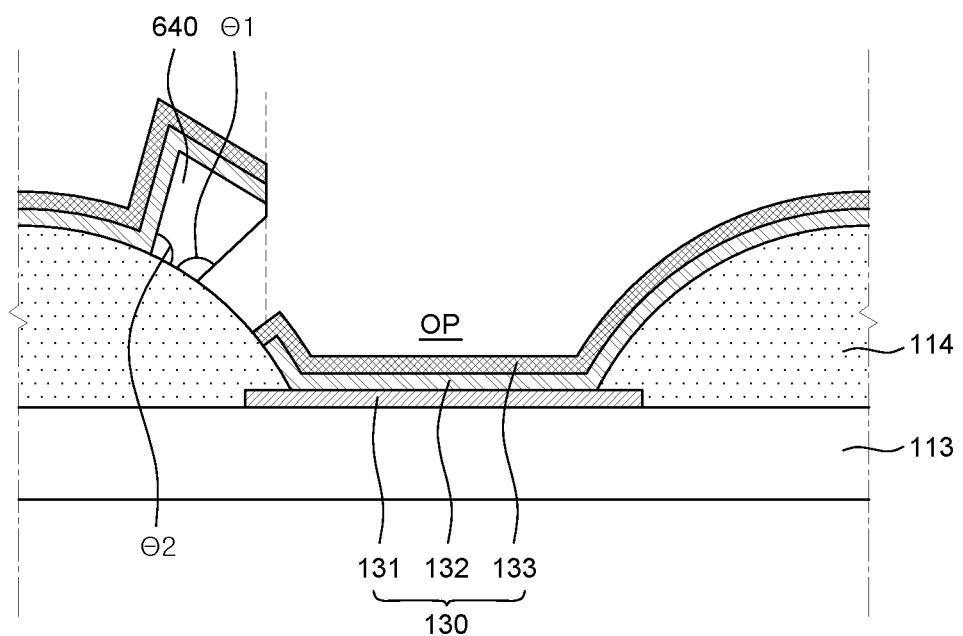

FIG. 10A and FIG. 10B are cross-sectional views of a sub-pixel according to the sixth exemplary embodiment of the present disclosure.

The sixth exemplary embodiment of the present disclosure shown in FIG. 10A and FIG. 10B has substantially the same configuration as the first exemplary embodiment of the present disclosure except that two angles ($\theta1, \theta2$) at the ends of the lower base of a protrusion 640 are obtuse. Thus, a repeated description will be omitted.

For convenience in explanation, FIG. 10B shows an enlarged view of FIG. 10A with the omission of a lower structure under the overcoating layer 113.

Referring to FIG. 10A and FIG. 10B, in a display device according to the sixth exemplary embodiment of the present disclosure, the protrusion 640 may be disposed at one side surface of the bank 114 (e.g., at one edge of the opening OP). However, as described above, the present disclosure is not limited thereto, and the protrusion 640 may be disposed at both side surfaces of the bank 114.

Also, two or more protrusions 640 may be disposed on at least one side surface of the bank 114.

The protrusion 640 may be disposed to surround at least a part of the first electrode 131 of the sub-pixel. Alternatively, the protrusion 640 may be disposed at the edges of the first electrode 131 along the shape of the opening OP of the sub-pixel, but is not limited thereto.

The protrusion 640 may be divided into a plurality of parts, but the present disclosure is not limited thereto. That is, the protrusion 640 may be disconnected at a part of the edges of the first electrode 131 and divided into a plurality of parts. Here, the protrusion 640 may not be disposed at a part of the edges of the first electrode 131 of the sub-pixel to make a connection between the second electrodes 133 between adjacent sub-pixels. Alternatively, the protrusion 640 of the present disclosure may be disposed at least in part in the first non-emission area NEA1 rather than in the second non-emission area NEA2.

Further, the protrusion 640 may be disposed to overlap in part the first electrode 131 under the protrusion 640, but is not limited thereto.

The protrusion 640 of the present disclosure may have a substantially trapezoidal shape in a cross-sectional view, but is not limited thereto. In this case, two angles ($\theta1, \theta2$) at the ends of the lower base may be obtuse in a predetermined range. The protrusion 640 of the present disclosure may have various shapes such as a polygonal shape, for example, a triangular or rectangular shape, or a bell shape in a cross-sectional view.

The protrusion 640 of the present disclosure may be made of a different material from the bank 114, but is not limited thereto. The protrusion 640 of the present disclosure may be made of the same material as the bank 114, and in this case, the protrusion 640 and the bank 114 may be formed in the same process.

The protrusion 640 may be patterned together with the bank 114.

The right side angle $\theta1$ at the lower base of the protrusion 640 according to the sixth exemplary embodiment of the present disclosure may have an obtuse angle smaller than 120°. If the right side angle $\theta1$ at the lower base is 120° or more, the protrusion 640 may collapse due to a great difference in length between the upper base and the lower base. However, the present disclosure is not limited thereto. A range of the obtuse angle may vary depending on the height of the protrusion 640 or a critical dimension CD. The left side angle $\theta2$ at the lower base of the protrusion 640 may also have an obtuse angle.

In this case, the protrusion 640 may be made of an organic material such as a chemically amplified resist (CAR)-based negative photo resist PR that forms a cross linker.

A protrusion of the present disclosure may be made of the same material as a bank and patterned together with the bank. This will be described in detail according to a seventh exemplary embodiment of the present disclosure.

Figure 11A:
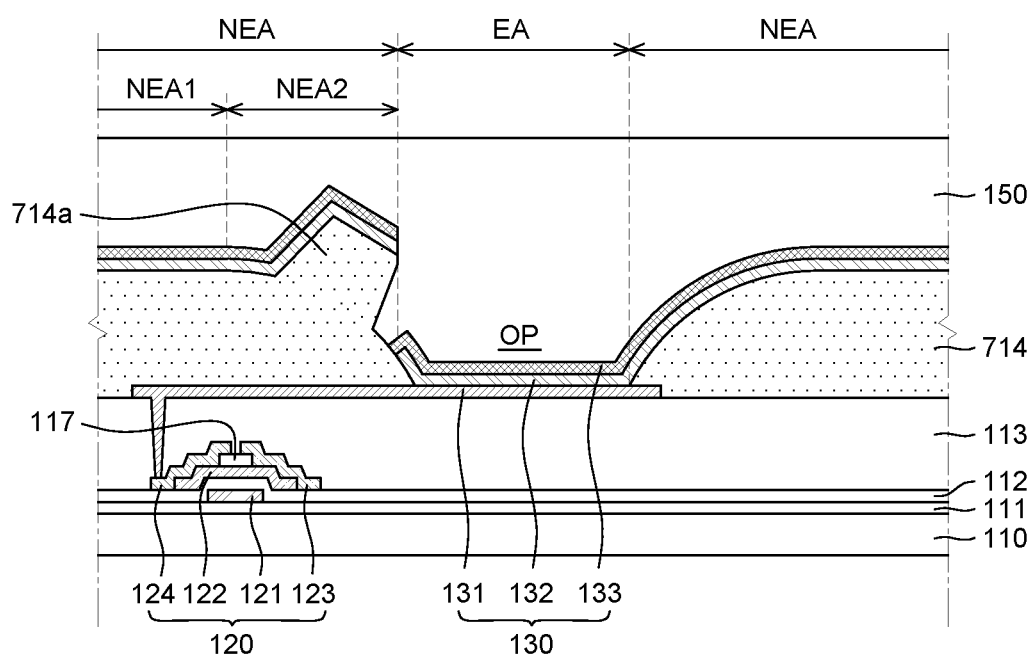
FIG. 11A and FIG. 11B are cross-sectional views of a sub-pixel according to a seventh exemplary embodiment of the present disclosure.
Figure 11B:
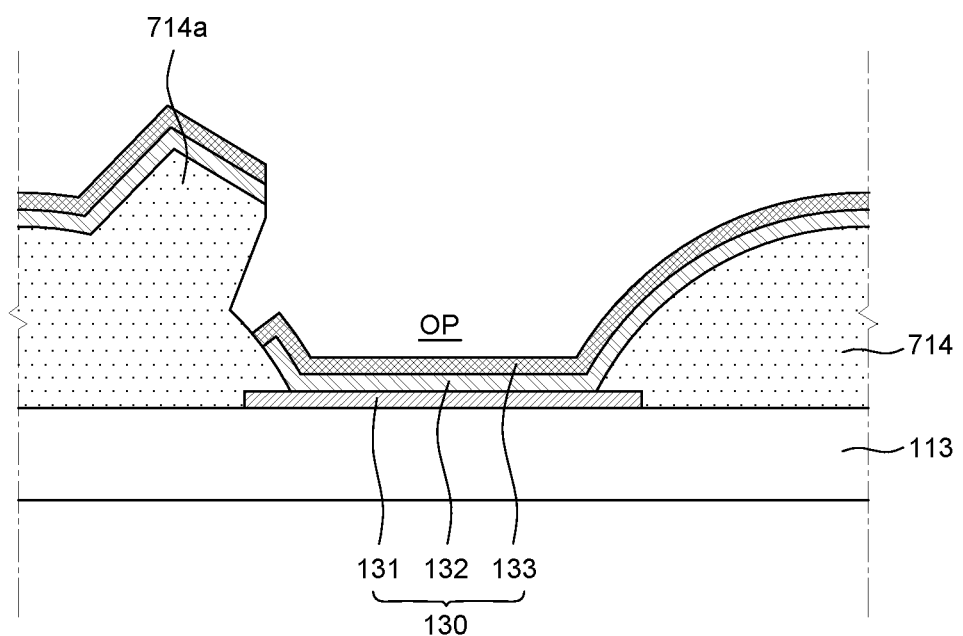

FIG. 11A and FIG. 11B are cross-sectional views of a sub-pixel according to the seventh exemplary embodiment of the present disclosure.

The seventh exemplary embodiment of the present disclosure shown in FIG. 11A and FIG. 11B has substantially the same configuration as the first exemplary embodiment of the present disclosure except that a protrusion 714a is made of the same material as a bank 714 and patterned together with the bank 714. Thus, a repeated description will be omitted.

For convenience in explanation, FIG. 11B shows an enlarged view of FIG. 11A with the omission of a lower structure under the overcoating layer 113.

Referring to FIG. 11A and FIG. 11B, in a display device according to the seventh exemplary embodiment of the present disclosure, the protrusion 714a may be disposed at one side surface of the bank 714 (e.g., at one edge of the opening OP). However, the present disclosure is not limited thereto, and the protrusion 714a may be disposed at both side surfaces of the bank 714.

Also, two or more protrusions 714a may be disposed on at least one side surface of the bank 714.

The protrusion 714a may be disposed to surround at least a part of the first electrode 131 of the sub-pixel. Alternatively, the protrusion 714a may be disposed at the edges of the first electrode 131 along the shape of the opening OP of the sub-pixel, but is not limited thereto.

The protrusion 714a may be divided into a plurality of parts, but the present disclosure is not limited thereto. That is, the protrusion 714a may be disconnected at a part of the edges of the first electrode 131 and divided into a plurality of parts. Here, the protrusion 714a may not be disposed at a part of the edges of the first electrode 131 of the sub-pixel to make a connection between the second electrodes 133 between adjacent sub-pixels. Alternatively, the protrusion 714a of the present disclosure may be disposed at least in part in the first non-emission area NEA1 rather than in the second non-emission area NEA2.

Further, the protrusion 714a may be disposed to overlap in part the first electrode 131 under the protrusion 714a, but is not limited thereto.

The protrusion 714a of the present disclosure may have a substantially trapezoidal shape in a cross-sectional view, but is not limited thereto. In this case, two angles at the ends of the lower base may be acute or obtuse in a predetermined range. The protrusion 714a of the present disclosure may have various shapes such as a polygonal shape, for example, a triangular or rectangular shape, or a bell shape in a cross-sectional view.

The protrusion 714a of the present disclosure may be made of the same material as the bank 714, and in this case, the protrusion 714a and the bank 714 may be formed in the same process.

The bank 714 and the protrusion 714a may be an organic material. For example, the bank 714 and the protrusion 714a may be made of an organic material such as polyimide or acryl- or benzocyclobutene-based resin, but is not limited thereto.

For example, if the bank 714 and the protrusion 714a are made of polyimide, the bank 714 and the protrusion 714a may have a refractive index of about 1.6.

The bank 714 and the protrusion 714a may be patterned together. In this case, a half-tone mask, a triple-tone mask, or a multi-tone mask may be used. In this case, a spacer may also be formed together with the protrusion 714a.

Particularly, in the seventh exemplary embodiment of the present disclosure, it is not necessary to align the bank 714 and the protrusion 714a, which is advantageous for processing.

Meanwhile, as described above, two or more protrusions may be disposed on at least one side surface of a bank. This will be described in detail according to an eighth exemplary embodiment of the present disclosure.

Figure 12A:
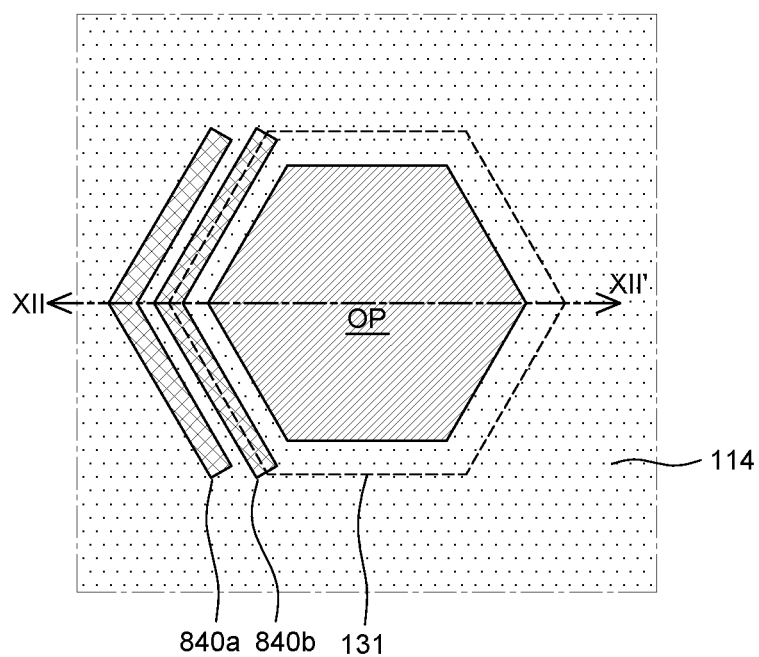
FIG. 12A is an enlarged plan view of a sub-pixel according to an eighth exemplary embodiment of the present disclosure.

FIG. 12A is an enlarged plan view of a sub-pixel according to the eighth exemplary embodiment of the present disclosure.

Figure 12B:
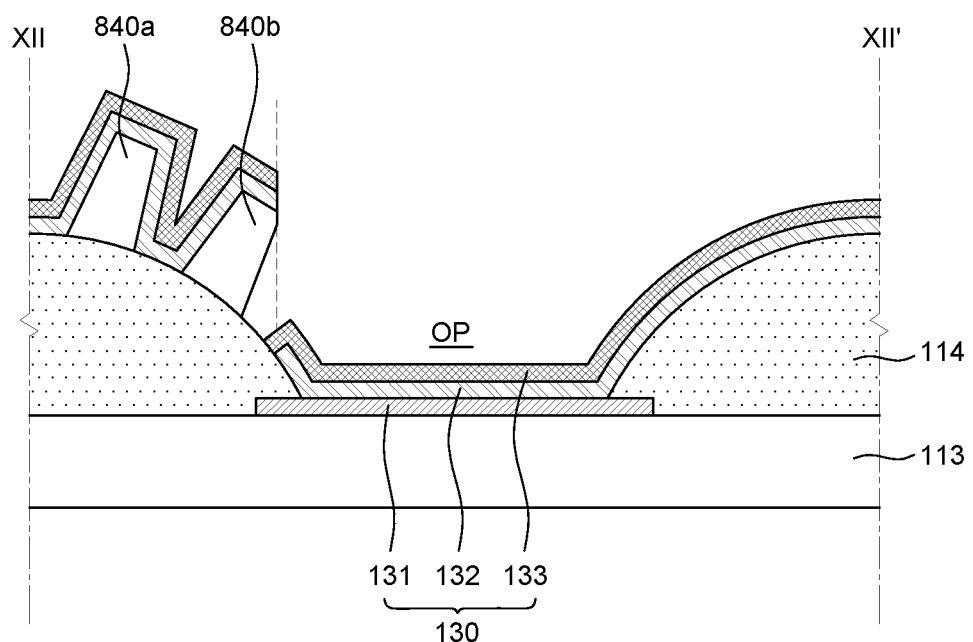
FIG. 12B is a cross-sectional view as taken along a line XII-XII' of FIG. 12A according to one embodiment.

FIG. 12B is a cross-sectional view as taken along a line XII-XII' of FIG. 12A according to one embodiment.

The eighth exemplary embodiment of the present disclosure shown in FIG. 12A and FIG. 12B has substantially the same configuration as the first exemplary embodiment of the present disclosure except that two, first and second, protrusions 840a and 840b are disposed at one side surface of the bank 114. Thus, a repeated description will be omitted.

FIG. 12A illustrates an example where the sub-pixel has a hexagonal shape, but the present disclosure is not limited to the shape of the sub-pixel. For convenience in explanation, FIG. 12B does not illustrate a lower structure under the overcoating layer 113.

For convenience in explanation, FIG. 12A illustrates only the first electrode 131 and the bank 114 from among the components of the light emitting element 130. The bank 114 may be disposed in any region except a region exposed through the opening OP.

Referring to FIG. 12A and FIG. 12B, in a display device according to the eighth exemplary embodiment of the present disclosure, the first and second protrusions 840a and 840b may be disposed at one side surface of the bank 114 (e.g., at one edge of the opening OP).

Alternatively, the two, first and second, protrusions 840a and 840b may be disposed at both side surfaces of the bank 114. That is, two or more first and second protrusions 840a and 840b may be disposed on at least one side surface of the bank 114.

As shown in FIG. 12A, the first and second protrusions 840a and 840b may be disposed to surround a part of the first electrode 131 of the sub-pixel. Alternatively, the first and second protrusions 840a and 840b may be disposed at the edges of the first electrode 131 along the shape of the opening OP of the sub-pixel, but the present disclosure is not limited thereto.

The first and second protrusions 840a and 840b may be separated from each other, but the present disclosure is not limited thereto. The lower base of the first protrusion 840a and the lower base of the second protrusion 840b may be connected to each other.

The first and second protrusions 840a and 840b may not be disposed at a part of the edges of the first electrode 131 of the sub-pixel to make a connection between the second electrodes 133 between adjacent sub-pixels. Alternatively, the first and second protrusions 840a and 840b of the present disclosure may be disposed at least in part in a first non-emission area rather than in a second non-emission area.

Further, the first and second protrusions 840a and 840b may be disposed to overlap in part the first electrode 131 under the first and second protrusions 840a and 840b, but are not limited thereto.

Each of the first and second protrusions 840a and 840b of the present disclosure may have a substantially trapezoidal shape in a cross-sectional view, but the present disclosure is not limited thereto. In this case, two angles at the ends of the lower base may be acute or obtuse in a predetermined range. Each of the first and second protrusions 840a and 840b of the present disclosure may have various shapes such as a polygonal shape, for example, a triangular or rectangular shape, or a bell shape in a cross-sectional view.

The first and second protrusions 840a and 840b of the present disclosure may be made of a different material from the bank 114, but the present disclosure is not limited thereto. The first and second protrusions 840a and 840b of the present disclosure may be made of the same material as the bank 114, and in this case, the first and second protrusions 840a and 840b and the bank 114 may be formed in the same process.

The first and second protrusions 840a and 840b may be patterned together with the bank 114.

The first and second protrusions 840a and 840b may have different sizes from each other.

The first and second protrusions 840a and 840b may have different heights from each other.

The first and second protrusions 840a and 840b may be disposed at different positions from each other.

In the eighth exemplary embodiment of the present disclosure, at least two, first and second, protrusions 840a and 840b are formed on at least one side surface of the bank 114. Therefore, the length of a current path may be increased. Also, when the angles at the ends of the lower bases of the first and second protrusions 840a and 840b are adjusted, the organic layer 132 and the second electrode 133 may be disconnected at one side surface of the second protrusion 840b. Further, the organic layer 132 and the second electrode 133 may be disconnected at one side surface of the first protrusion 840a, (e.g., between the first and second protrusions 840a and 840b). Therefore, current leakage may be more effectively reduced in the eighth exemplary embodiment of the present disclosure than in the first exemplary embodiment of the present disclosure.

A disconnection structure of the present disclosure may be formed through an additional mask process, or may be formed through a mask process for forming a conventional bank or spacer. This will be described in detail with reference to the accompanying drawings.

FIG. 13A through FIG. 13D are cross-sectional views sequentially showing a fabricating process of a part of a display device according to the third exemplary embodiment of the present disclosure.

For convenience in explanation, descriptions will be made with the omission of a lower structure under the overcoating layer 113.

Figure 13A:
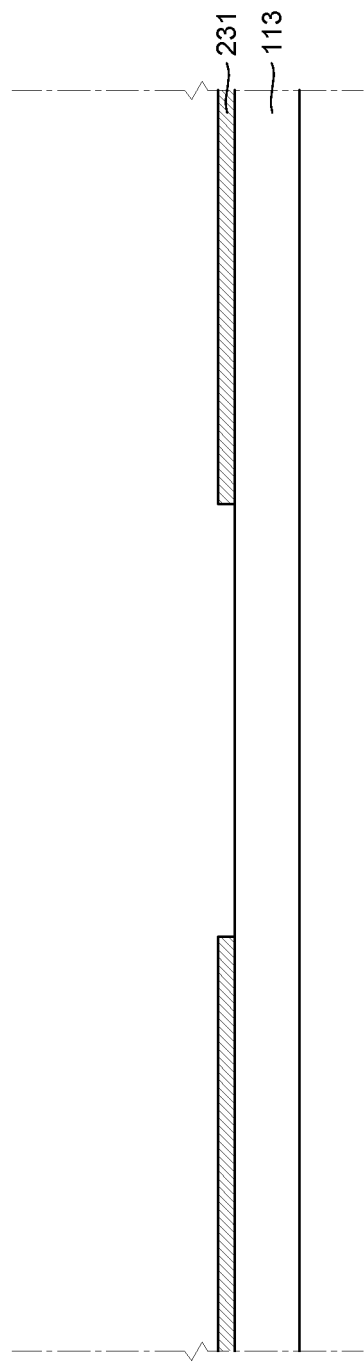
FIG. 13A through FIG. 13D are cross-sectional views sequentially showing a fabricating process of a part of a display device according to the third exemplary embodiment of the present disclosure.

Referring to FIG. 13A, the overcoating layer 113 is formed on a substrate including a plurality of transistors and a capacitor.

The overcoating layer 113 is an insulating layer configured to flatten an upper portion of the substrate. The overcoating layer 113 may be made of an organic material. The overcoating layer 113 may be formed as a single layer of, for example, polyimide or photo acryl, or a multi-layer of polyimide and photo acryl, but is not limited thereto.

The overcoating layer 113 may be formed to a thickness of about 2 μm, but is not limited thereto.

A plurality of light emitting elements may be disposed in a plurality of sub-pixels on the overcoating layer 113. Each light emitting element may include the first electrode 231, an organic layer and a second electrode.

First, the first electrode 231 is formed on the overcoating layer 113.

The first electrode 231 may be electrically connected to a transistor and thus may be supplied with a driving current of a pixel circuit. The first electrode 231 may be made of a conductive material having a high work function to supply holes to an emission layer. The first electrode 231 may be made of a transparent conductive material such as indium tin oxide ITO or indium zinc oxide IZO, but is not limited thereto.

The display device may be implemented as a top emission type or a bottom emission type. In case of the top emission type display device, a reflective layer made of a metal material having high reflection efficiency, such as aluminum Al or silver Ag, may be further disposed under the first electrode 231. In case of the bottom emission type display device, the first electrode 231 may be made of a transparent conductive material only. Hereinafter, descriptions will be made assuming that the display device of the present disclosure is a top emission display device.

For example, the first electrode 231 may have a stack structure of two or more layers including a reflective layer.

The first electrode 231 may be formed to a thickness of about 0.1 μm, but is not limited thereto.

Figure 13B:
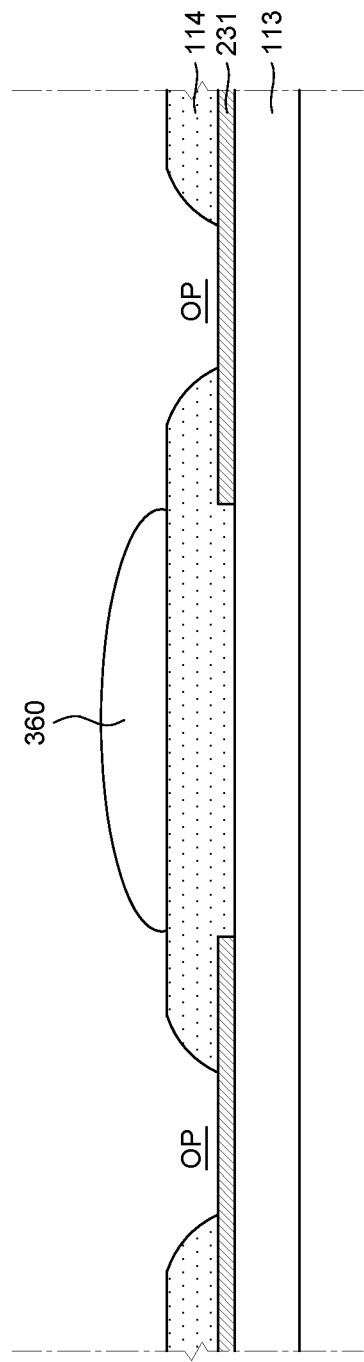

Then, referring to FIG. 13B, the bank 114 and a spacer 360 are formed on the substrate on which the first electrode 231 has been formed.

The bank 114 and the spacer 360 may be formed in the same mask process or in different mask processes, respectively.

The bank 114 may include the opening OP through which a part of the first electrode 231 is exposed. The bank 114 may be an organic insulating material disposed to cover an edge or a peripheral portion of the first electrode 231. The bank 114 may be made of polyimide or acryl- or benzocyclobutene (BCB)-based resin, but is not limited thereto.

The spacer 360 may be formed on the flat top surface of the bank 114, (e.g., on a first non-emission area). The spacer 360 may be disposed on the bank 114 to maintain a predetermined distance from a deposition mask when a light emitting element is formed. A predetermined distance between the bank 114 and the first electrode 231 under the spacer 360 and the deposition mask may be maintained by the spacer 360. Also, the spacer 360 may suppress damage caused by a contact. Herein, each of a plurality of spacers 360 may be formed into, for example, a taper shape having a width decreasing toward an upper side thereof to reduce a contact area with the deposition mask.

The bank 114 and the spacer 360 may be formed to a thickness of 1 μm to 2 μm and 1.5 μm to 2.5 μm, respectively, but are not limited thereto.

Figure 13C:
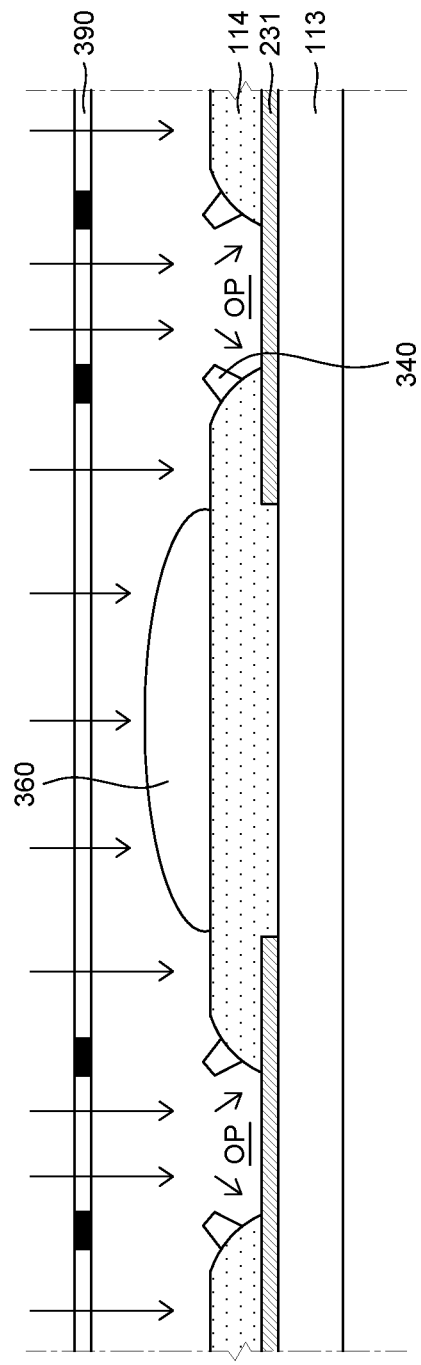

Then, referring to FIG. 13C, a photo-reactive organic material is coated on the entire surface of the substrate.

The photo-reactive organic material may include a photo resist PR.

Herein, a positive type PR may be used. In this case, a protrusion having a normal taper shape may be formed.

The PR may be coated to a thickness of 0.5 μm or less, but is not limited thereto.

Then, exposure and development are performed using a predetermined mask 390 to form the protrusion 340 at a side surface of the bank 114, i.e., in a second non-emission area.

Here, since the positive type PR is used, a blocking region of the mask 390 may be located corresponding to the protrusion 340 to be formed.

The protrusion 340 may have a substantially trapezoidal shape in a cross-sectional view, but is not limited thereto. The protrusion 340 of the present disclosure may have various shapes such as a polygonal shape, for example, a triangular or rectangular shape, or a bell shape in a cross-sectional view.

The protrusion 340 may have a normal taper shape (e.g., acute angles at the ends of the lower base).

Figure 13D:
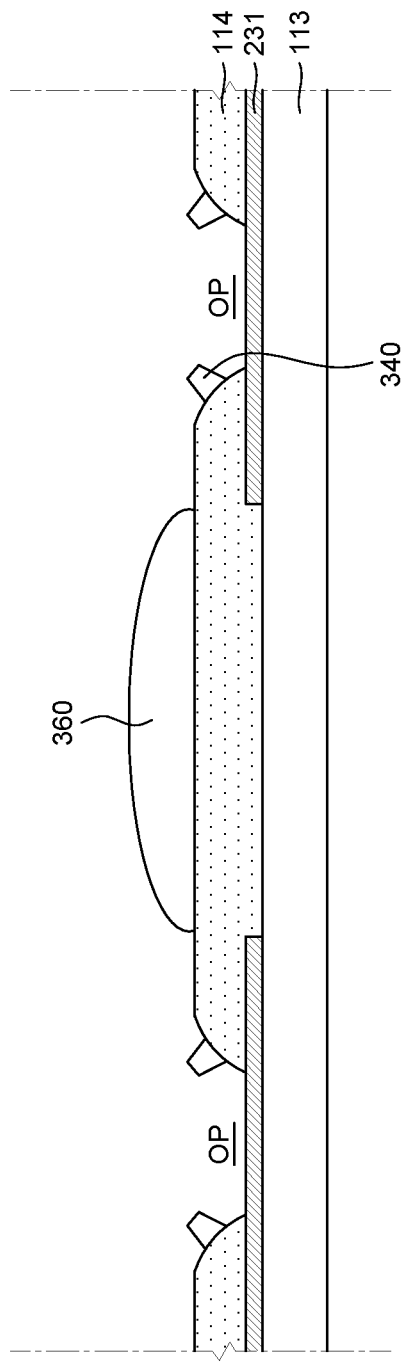

Then, referring to FIG. 13D, the protrusion 340 may be cured through a heat treatment. The curing process may suppress flow down of the protrusion 340, which is made of an organic material, caused by the taper shape.

Here, the formed protrusion 340 may have a smaller height than the spacer 360.

Then, an organic layer and a cathode may be formed. As described above, the organic layer and the cathode may be disconnected from each other at both edges of the opening OP. Processes after forming the organic layer are substantially the same as in the conventional processes, and, thus, a description thereof will be omitted.

FIG. 14A through FIG. 14D are cross-sectional views sequentially showing a fabricating process of a part of a display device according to the sixth exemplary embodiment of the present disclosure.

The fabricating process of a display device according to the sixth exemplary embodiment of the present disclosure shown in FIG. 14A through FIG. 14D is substantially the same as the fabricating process shown in FIG. 13A through FIG. 13D except that a negative type PR is used as an organic material. Thus, a repeated description for the same configuration and fabricating process will be omitted.

Figure 14A:
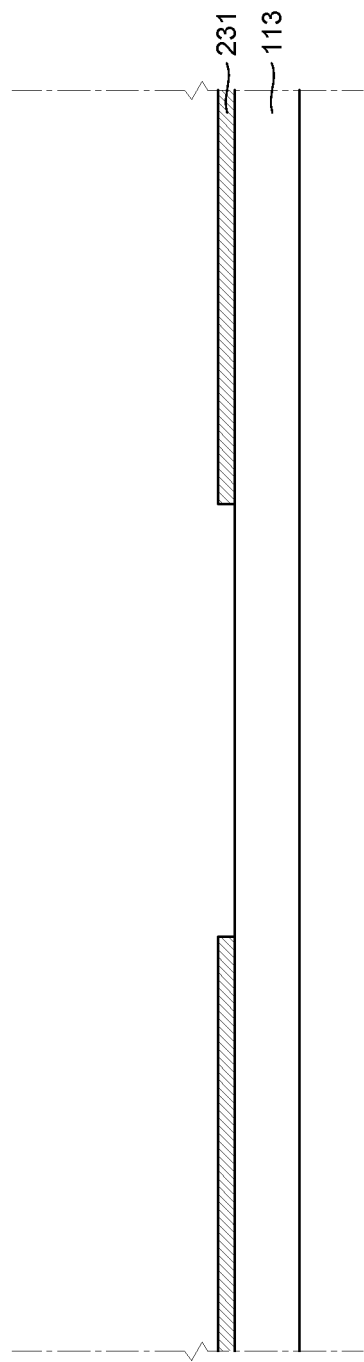
FIG. 14A through FIG. 14D are cross-sectional views sequentially showing a fabricating process of a part of a display device according to the sixth exemplary embodiment of the present disclosure.

Referring to FIG. 14A, the overcoating layer 113 is formed on a substrate including a plurality of transistors and a capacitor.

Then, the first electrode 231 is formed on the overcoating layer 113.

Figure 14B:
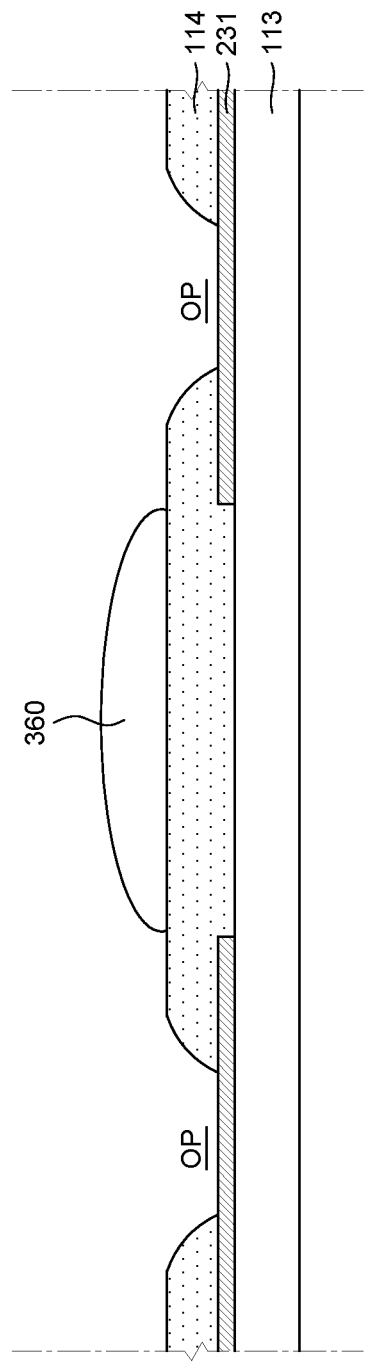

Thereafter, referring to FIG. 14B, the bank 114 and the spacer 360 are formed on the substrate on which the first electrode 231 has been formed.

Figure 14C:
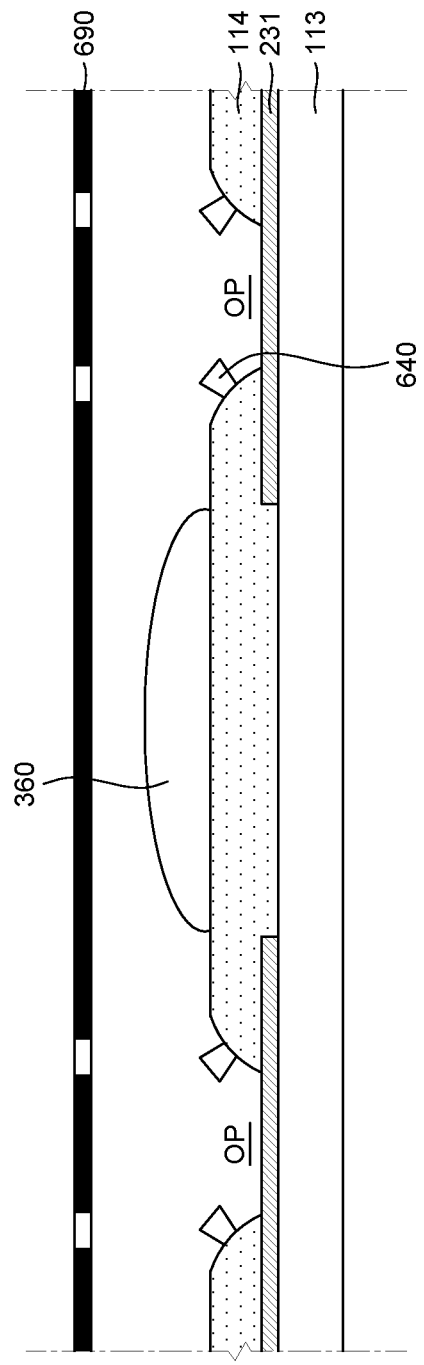

Then, referring to FIG. 14C, a photo-reactive organic material is coated on the entire surface of the substrate.

The photo-reactive organic material may include a PR.

Herein, a negative type PR may be used. In this case, a protrusion having an inverse taper shape may be formed.

The PR may be coated to a thickness of about 1.5 μm, but is not limited thereto.

Then, exposure and development are performed using a predetermined mask 690 to form the protrusion 640 at a side surface of the bank 114, i.e., in a second non-emission area.

Here, since the negative type PR is used, a transmission region of the mask 690 may be located corresponding to the protrusion 640 to be formed.

The protrusion 640 may have a substantially trapezoidal shape in a cross-sectional view, but is not limited thereto. The protrusion 640 of the present disclosure may have various shapes such as a polygonal shape, for example, a triangular or rectangular shape, or a bell shape in a cross-sectional view.

The protrusion 640 may have an inverse taper shape, (e.g., obtuse angles at the ends of the lower base). In this case, a stable disconnection structure may be formed due to the inverse taper shape.

Figure 14D:
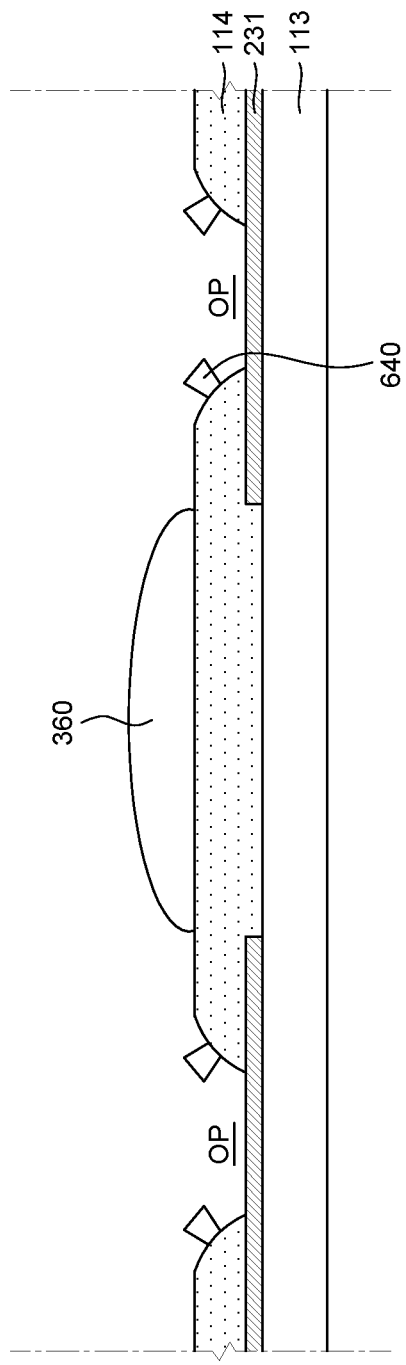

Then, referring to FIG. 14D, the protrusion 640 may be cured through a heat treatment.

Here, the formed protrusion 640 may have a smaller height than the spacer 360.

Meanwhile, if the protrusions 340 and 640 are formed through an additional mask process, an inorganic material may be used instead of the above-described organic materials. In case of using an inorganic material, it is easy to control the taper shape and height of the protrusions 340 and 640.

FIG. 15A through FIG. 15D are cross-sectional views sequentially showing another fabricating process of a part of the display device according to the third exemplary embodiment of the present disclosure.

Another fabricating process of a display device according to the third exemplary embodiment of the present disclosure shown in FIG. 15A through FIG. 15D is substantially the same as the fabricating process shown in FIG. 13A through FIG. 13D except that a protrusion is made of an inorganic material using a fine metal mask FMM. Thus, a repeated description for the same configuration and fabricating process will be omitted.

Figure 15A:
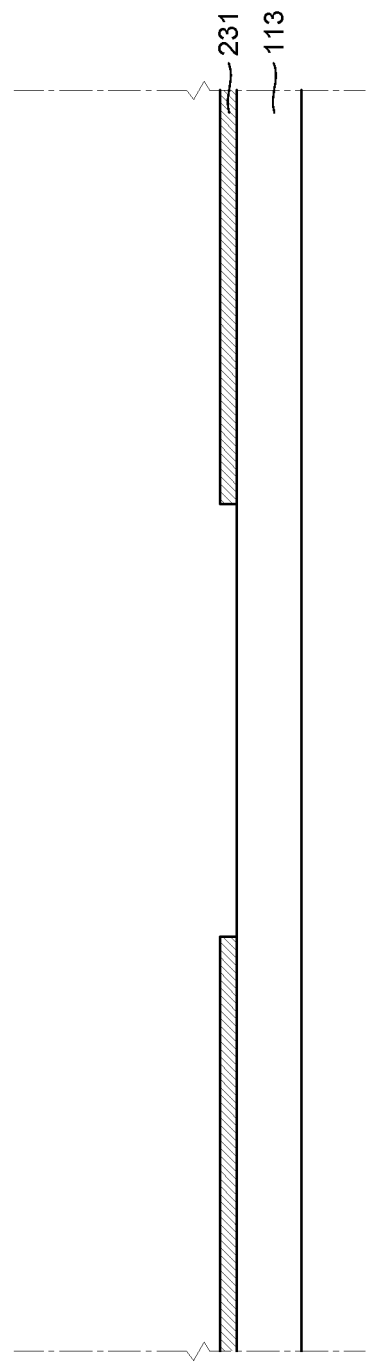
FIG. 15A through FIG. 15D are cross-sectional views sequentially showing another fabricating process of a part of the display device according to the third exemplary embodiment of the present disclosure.

Referring to FIG. 15A, the overcoating layer 113 is formed on a substrate including a plurality of transistors and a capacitor.

Then, the first electrode 231 is formed on the overcoating layer 113.

Figure 15B:
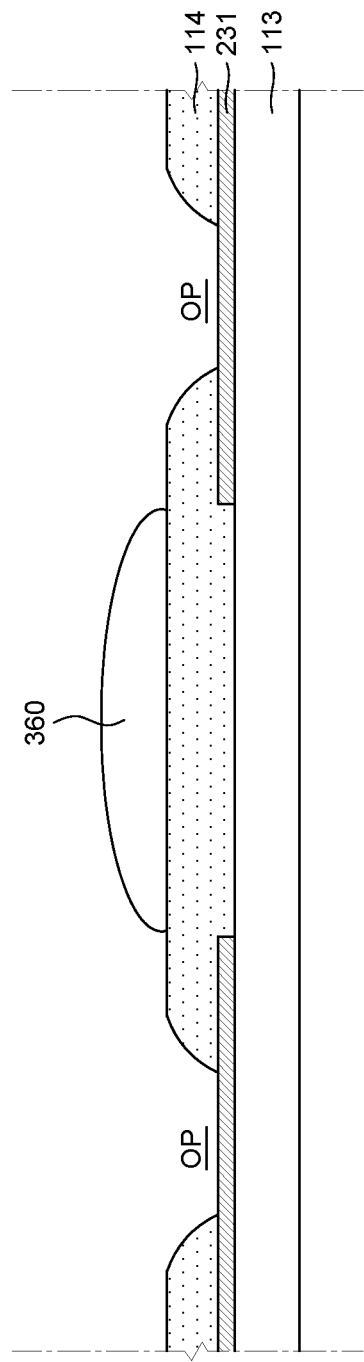

Thereafter, referring to FIG. 15B, the bank 114 and the spacer 360 are formed on the substrate on which the first electrode 231 has been formed.

Figure 15C:
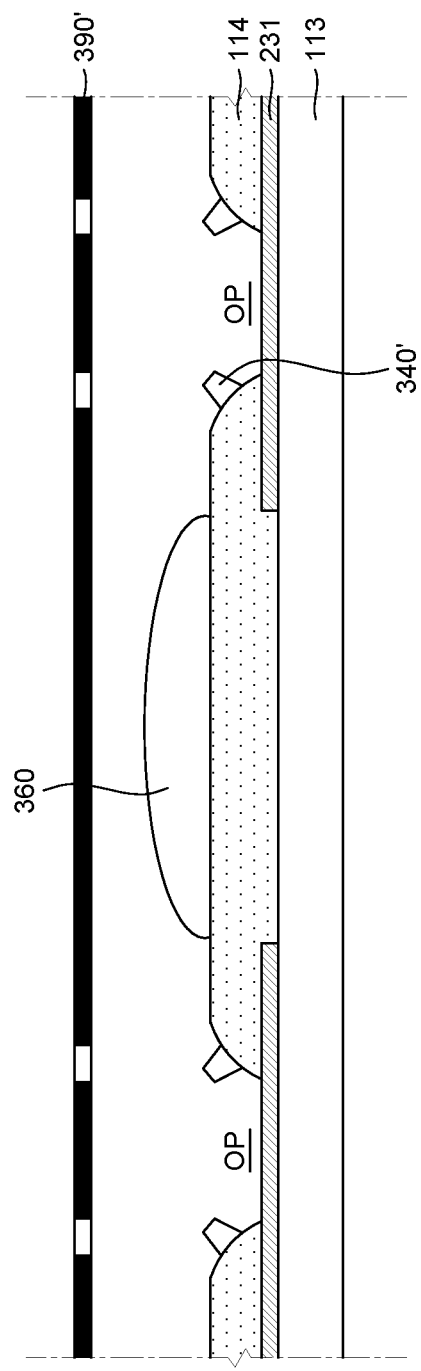
Figure 15D:
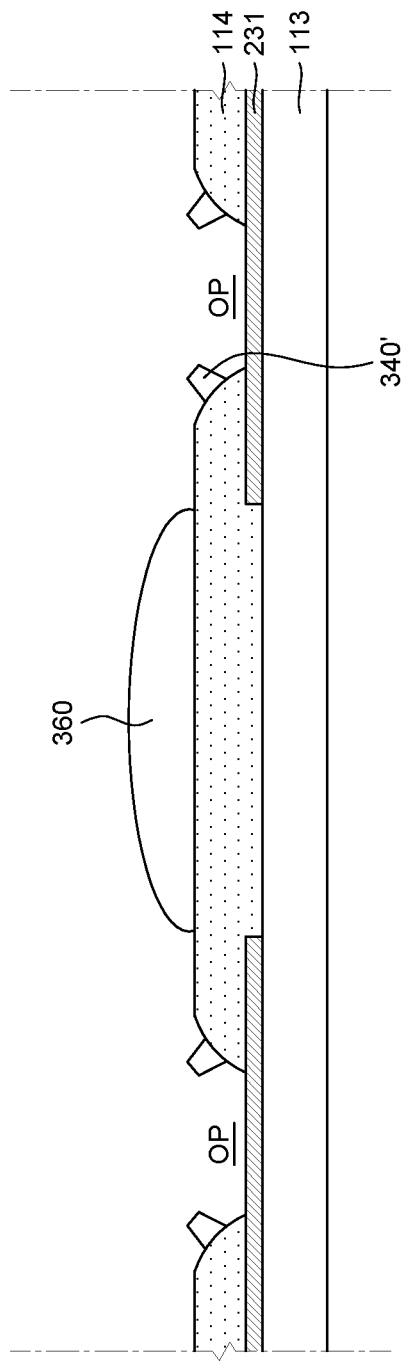

Then, referring to FIG. 15C and FIG. 15D, a FMM which is a deposition mask 390' is disposed above the substrate.

Thereafter, an inorganic material such as silicon oxide SiOx is deposited on the substrate through the deposition mask 390' so that a protrusion 340' is formed at a side surface of the bank 114, i.e., in a second non-emission area.

In this case, the protrusion 340' having a normal taper shape may be deposited.

The protrusion 340' may be formed to a thickness of about 0.7 μm to 1.5 μm, but is not limited thereto.

Then, etching may be performed using a buffered oxide etch BOE.

When the protrusion 340' is formed using the deposition mask 390', it is possible to suppress damage to an exposed region caused by exposure and development.

FIG. 16A through FIG. 16F are cross-sectional views sequentially showing yet another fabricating process of a part of the display device according to the third exemplary embodiment of the present disclosure.

Yet another fabricating process of a display device according to the third exemplary embodiment of the present disclosure shown in FIG. 16A through FIG. 16F is substantially the same as the fabricating process shown in FIG. 13A through FIG. 13D except that a protrusion is made of an inorganic material or a metal. Thus, a repeated description for the same configuration and fabricating process will be omitted.

Figure 16A:
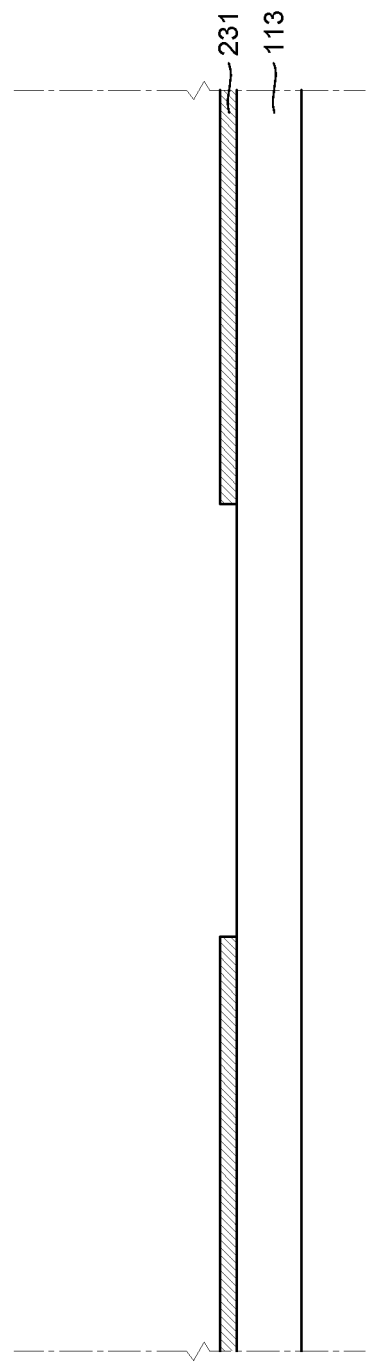
FIG. 16A through FIG. 16F are cross-sectional views sequentially showing yet another fabricating process of a part of the display device according to the third exemplary embodiment of the present disclosure.

Referring to FIG. 16A, the overcoating layer 113 is formed on a substrate including a plurality of transistors and a capacitor.

Then, the first electrode 231 is formed on the overcoating layer 113.

Figure 16B:
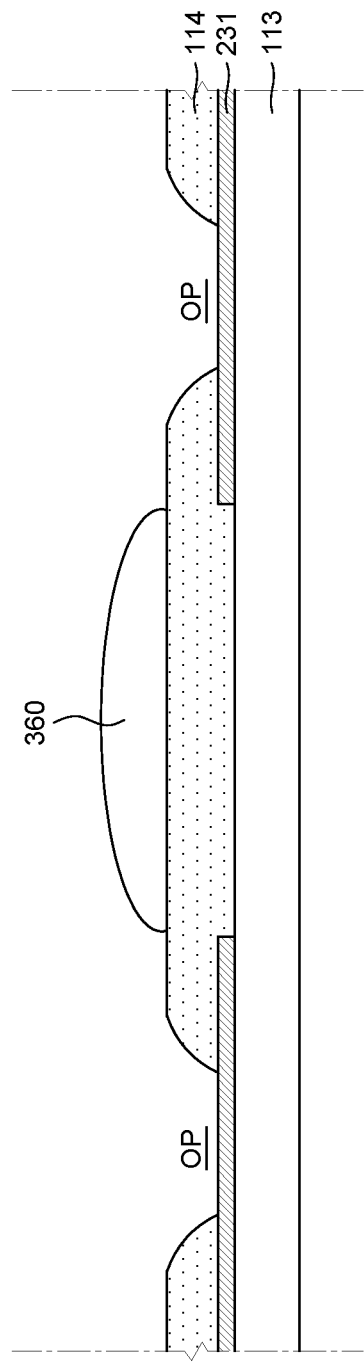

Thereafter, referring to FIG. 16B, the bank 114 and the spacer 360 are formed on the substrate on which the first electrode 231 has been formed.

Figure 16C:
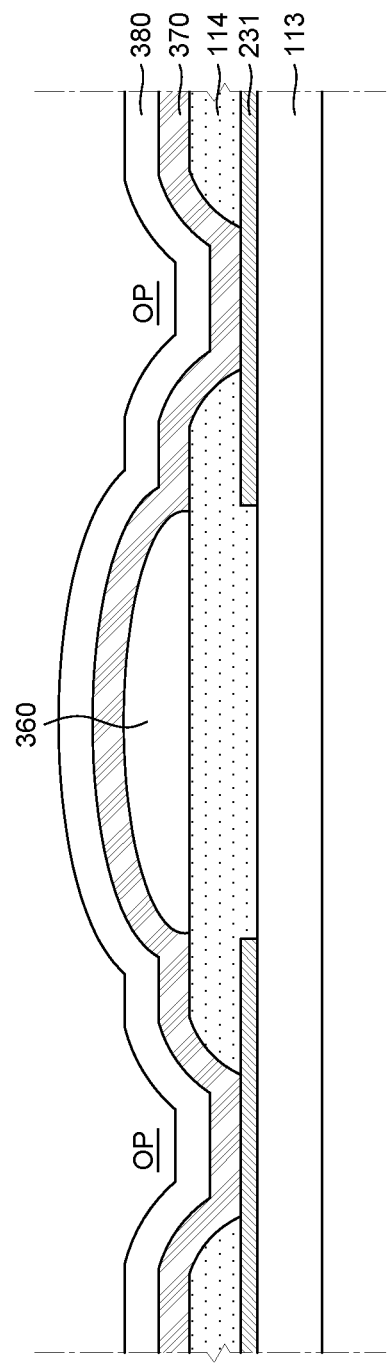

Then, referring to FIG. 16C, a first layer 370 and a second layer 380 are formed on the entire surface of the substrate.

The first layer 370 is provided to form a protrusion and may be made of an inorganic material such as silicon oxide SiOx or silicon nitride SiNx or a conductive metal such as Mo or Cu.

The inorganic material may be deposited by chemical vapor deposition CVD, and the metal may be deposited by sputtering.

The second layer 380 may be made of a photo-reactive organic material such as a PR.

Herein, a positive type PR may be used. In this case, a protrusion having a normal taper shape may be formed.

Figure 16D:
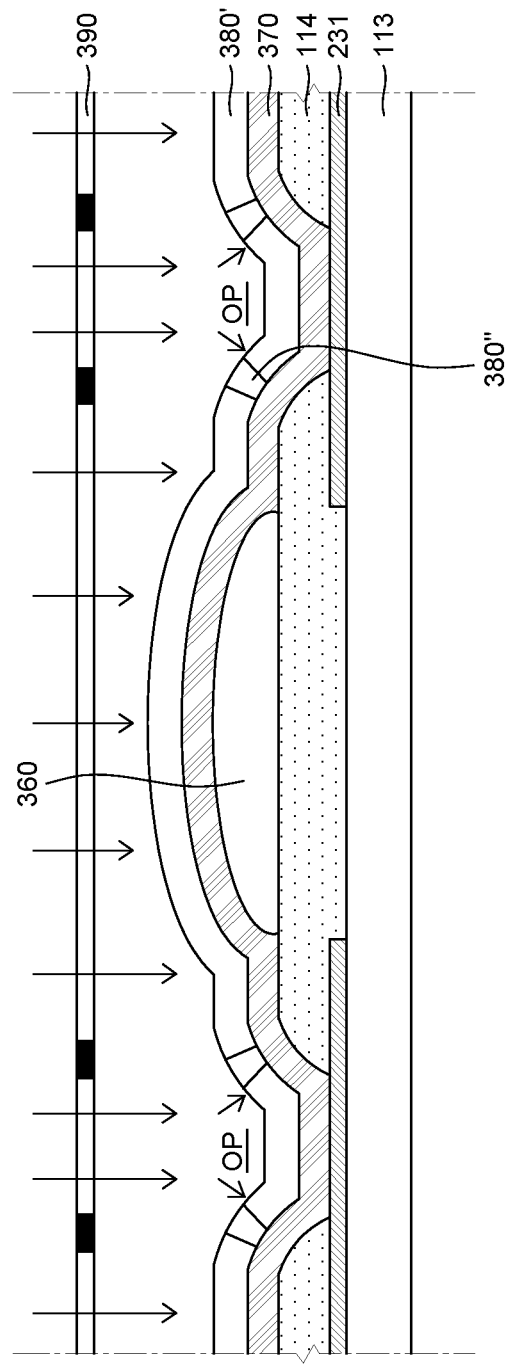

Then, referring to FIG. 16D, a predetermined mask 390 may be disposed above the substrate on which the first layer 370 and the second layer 380 have been formed.

Thereafter, the second layer is selectively exposed through the mask 390 so as to form a first PR pattern 380' and a second PR pattern 380" made of the second layer.

The exposed first PR pattern 380' may be removed by a developing solution.

Figure 16E:
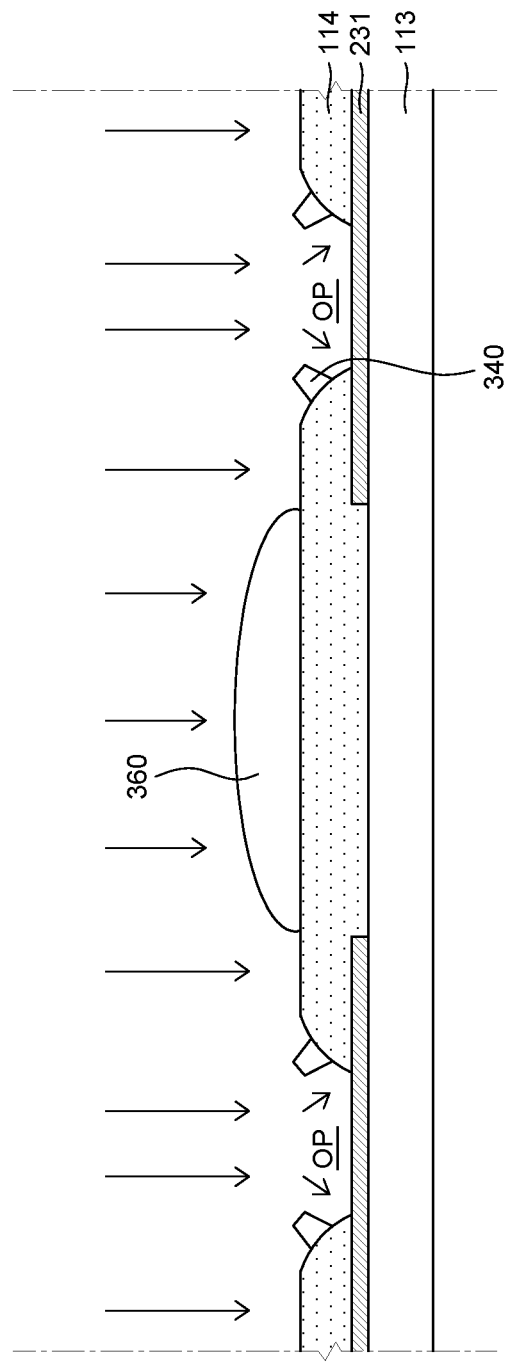

Then, referring to FIG. 16E, the first layer in a lower portion thereof is selectively etched using the second PR pattern 380" remaining without being removed by the developing solution as a mask. Thus, the protrusion 340 is formed at a side surface of the bank 114, i.e., in a second non-emission area.

Here, if the first layer is made of an inorganic material, a BOE may be used as an etchant.

The protrusion 340 may have a substantially trapezoidal shape in a cross-sectional view, but is not limited thereto. The protrusion 340 of the present disclosure may have various shapes such as a polygonal shape, for example, a triangular or rectangular shape, or a bell shape in a cross-sectional view.

The protrusion 340 may have a normal taper shape, (e.g., acute angles at the ends of the lower base).

Figure 16F:
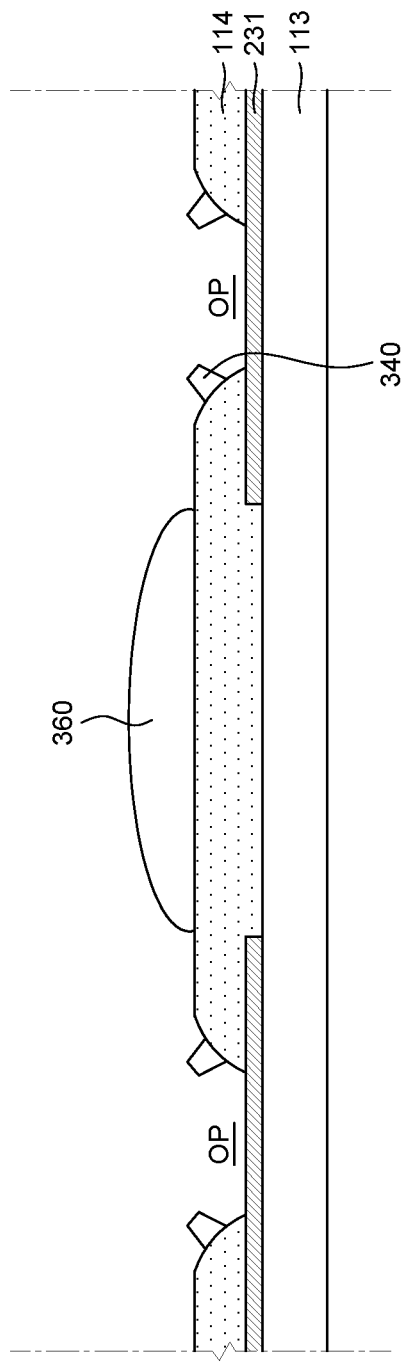

Then, referring to FIG. 16F, the remaining second PR pattern 380" may be removed by stripping.

FIG. 17A through FIG. 17F are cross-sectional views sequentially showing another fabricating process of a part of the display device according to the sixth exemplary embodiment of the present disclosure.

Another fabricating process of a display device according to the sixth exemplary embodiment of the present disclosure shown in FIG. 17A through FIG. 17F is substantially the same as the fabricating process shown in FIG. 16A through FIG. 16F except that a negative type PR is used. Thus, a repeated description for the same configuration and fabricating process will be omitted.

Figure 17A:
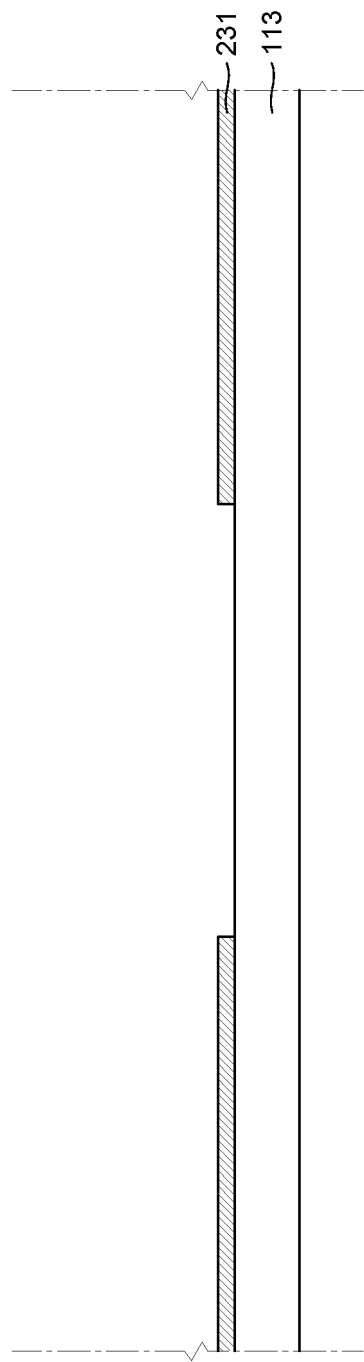
FIG. 17A through FIG. 17F are cross-sectional views sequentially showing another fabricating process of a part of the display device according to the sixth exemplary embodiment of the present disclosure.

Referring to FIG. 17A, the overcoating layer 113 is formed on a substrate including a plurality of transistors and a capacitor.

Then, the first electrode 231 is formed on the overcoating layer 113.

Figure 17B:
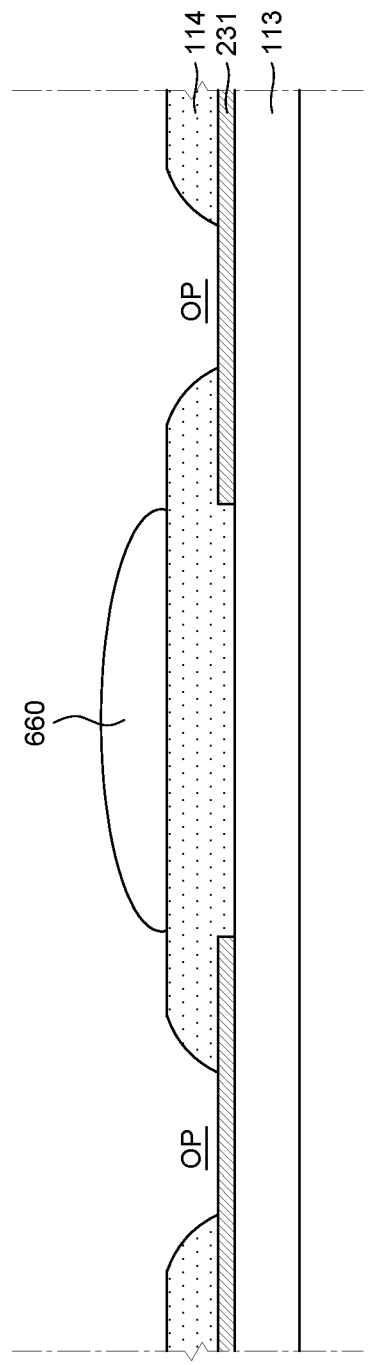

Thereafter, referring to FIG. 17B, the bank 114 and a spacer 660 are formed on the substrate on which the first electrode 231 has been formed.

Figure 17C:
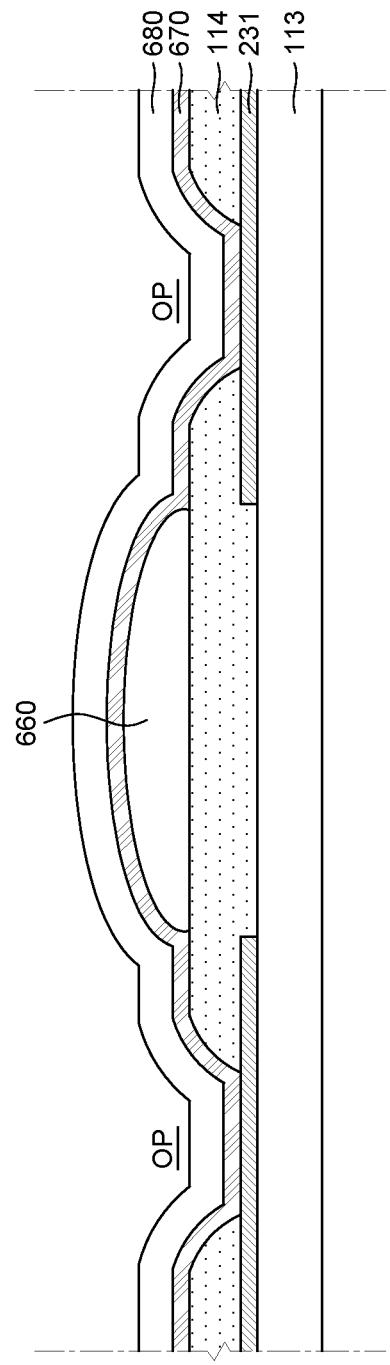

Then, referring to FIG. 17C, a first layer 670 and a second layer 680 are formed on the entire surface of the substrate.

The first layer 670 is provided to form a protrusion and may be made of an inorganic material such as silicon oxide SiOx or silicon nitride SiNx or a conductive metal such as Mo or Cu.

The second layer 680 may be made of a photo-reactive organic material such as a PR.

Herein, a negative type PR may be used. In this case, a protrusion having an inverse taper shape may be formed.

Figure 17D:
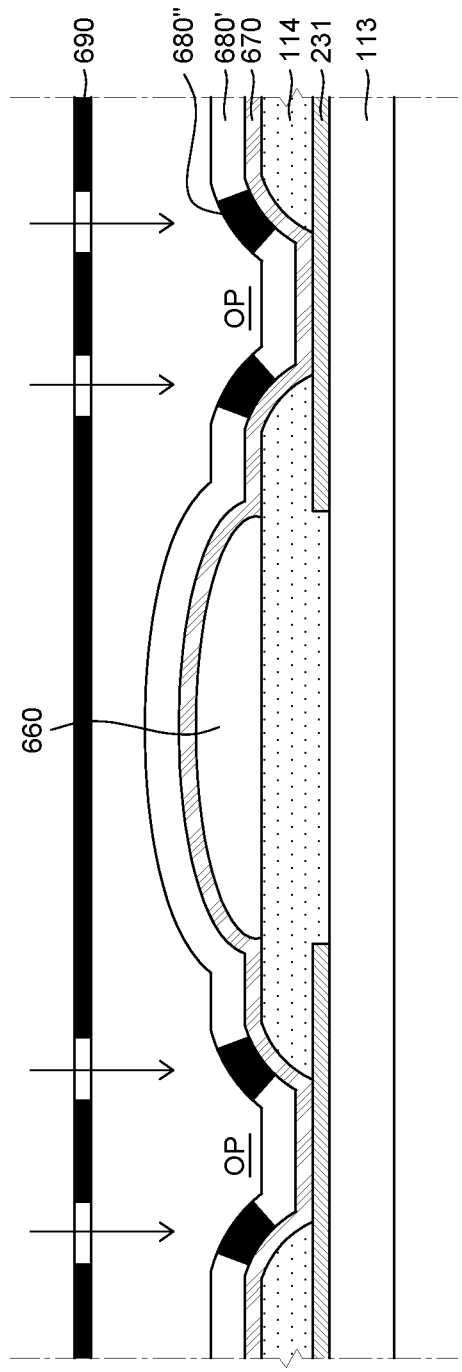

Then, referring to FIG. 17D, a predetermined mask 690 may be disposed above the substrate on which the first layer 670 and the second layer 680 have been formed.

Thereafter, the second layer is selectively exposed through the mask 690 so as to form a first PR pattern 680' and a second PR pattern 680" made of the second layer.

Since the negative type PR is used, the non-exposed first PR pattern 680' may be removed by a developing solution.

Figure 17E:
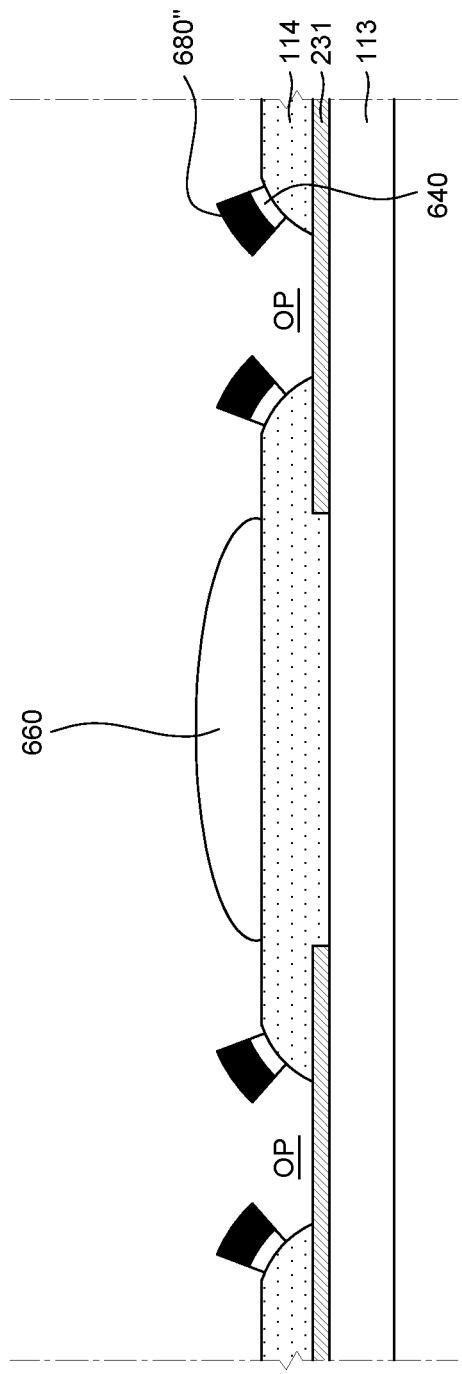

Then, referring to FIG. 17E, the first layer in a lower portion thereof is selectively etched using the second PR pattern 680" remaining without being removed by the developing solution as a mask. Thus, the protrusion 640 is formed at a side surface of the bank 114, (e.g., in a second non-emission area).

The protrusion 640 may have a substantially trapezoidal shape in a cross-sectional view, but is not limited thereto. The protrusion 640 of the present disclosure may have various shapes such as a polygonal shape, for example, a triangular or rectangular shape, or a bell shape in a cross-sectional view.

The protrusion 640 may have an inverse taper shape, (e.g., obtuse angles at the ends of the lower base). However, the present disclosure is not limited thereto. The protrusion 640 may also have a normal taper shape depending on the process conditions.

Figure 17F:
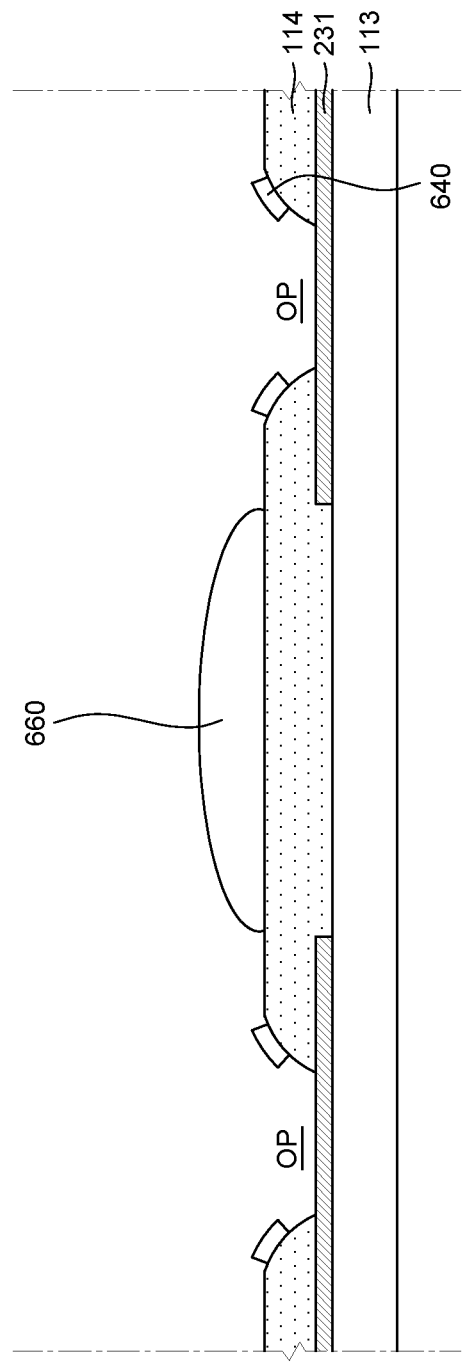

Then, referring to FIG. 17F, the remaining second PR pattern 680" may be removed by stripping.

Meanwhile, if the protrusions 340 and 640 are formed of an inorganic material, it is easy to form a pattern having a steep taper, or the like and it is possible to suppress flow down of the protrusions 340 and 640.

Also, if a negative type PR is used, an exposed region may be minimized Therefore, it is possible to reduce damage caused by exposure and development. Particularly, the first electrode 231, the bank 114 and the spacer 660 may not be exposed to the process.

Figure 18A:
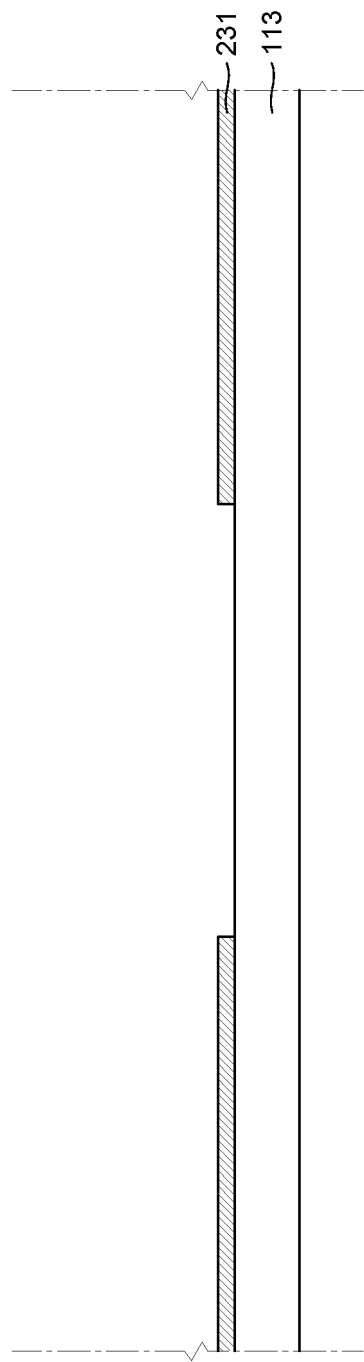
FIG. 18A through FIG. 18C are cross-sectional views sequentially showing a fabricating process of a part of a display device according to a ninth exemplary embodiment of the present disclosure.
Figure 18B:
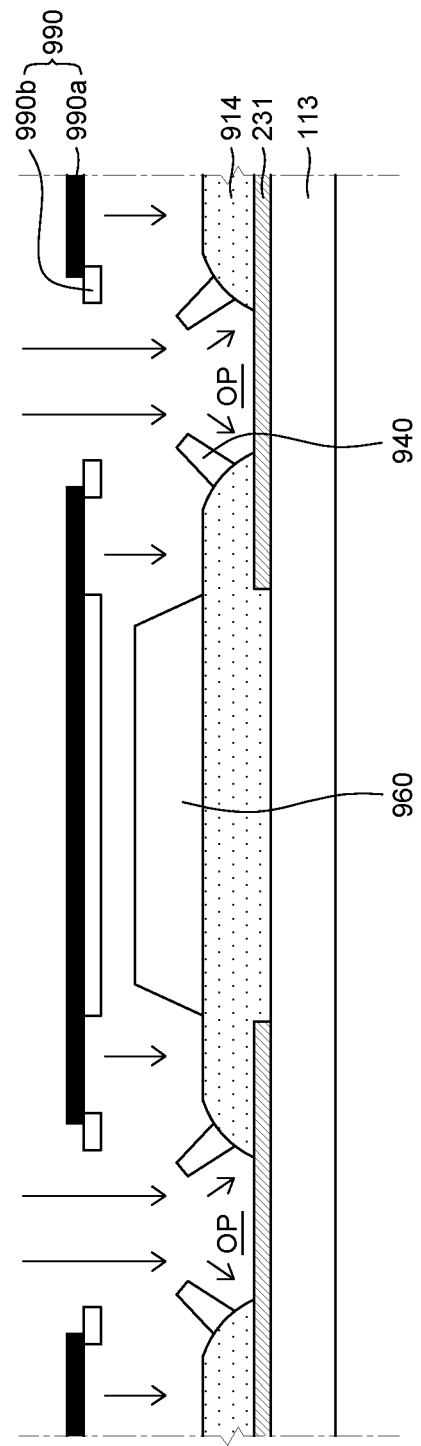
Figure 18C:
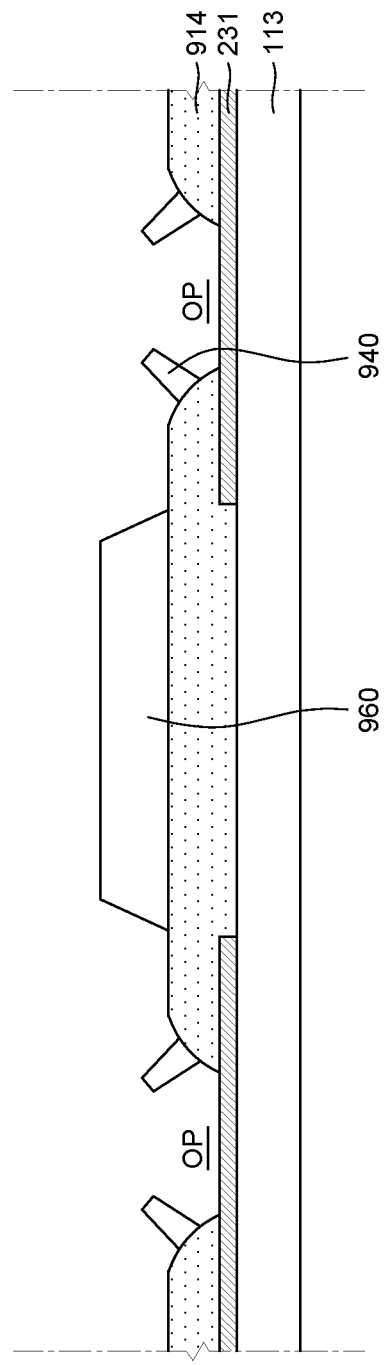

FIG. 18A through FIG. 18C are cross-sectional views sequentially showing a fabricating process of a part of a display device according to a ninth exemplary embodiment of the present disclosure.

In the fabricating process of a display device according to the ninth exemplary embodiment of the present disclosure shown in FIG. 18A through FIG. 18C, a bank 914, a spacer 960 and a protrusion 940 are formed through a single mask process using a half-tone mask. Thus, a repeated description for the same configuration and fabricating process will be omitted.

Referring to FIG. 18A, the overcoating layer 113 is formed on a substrate including a plurality of transistors and a capacitor.

Then, the first electrode 231 is formed on the overcoating layer 113.

Thereafter, referring to FIG. 18B, a first layer and a second layer are formed on the substrate on which the first electrode 231 has been formed.

Although not illustrated in the drawings, the first layer may be made of an organic material to form the bank 914 and the second layer may be made of a photo-reactive organic material to form the spacer 960 and the protrusion 940.

The photo-reactive organic material may include a PR.

Then, a half-tone mask 990 is disposed above the substrate on which the first layer and the second layer have been formed.

The half-tone mask 990 may include a bank photo-mask part 990a and a spacer photo-mask part 990b.

Thereafter, exposure and development may be performed using the half-tone mask 990 to form the bank 914, the spacer 960 and the protrusion 940.

The bank 914, the spacer 960 and the protrusion 940 may be similar to each other in taper angle.

Each of the spacer 960 and the protrusion 940 may have a dome shape instead of a trapezoidal shape illustrated in the drawings, but the trapezoidal shape is easier to form a structure. Each of the spacer 960 and the protrusion 940 may have a normal taper shape, (e.g., acute angles at the ends of the lower base). However, the present disclosure is not limited thereto.

Then, referring to FIG. 18C, the spacer 960 and the protrusion 940 may be cured through a heat treatment.

Here, the formed protrusion 940 may have the same height as the spacer 960.

Figure 19A:
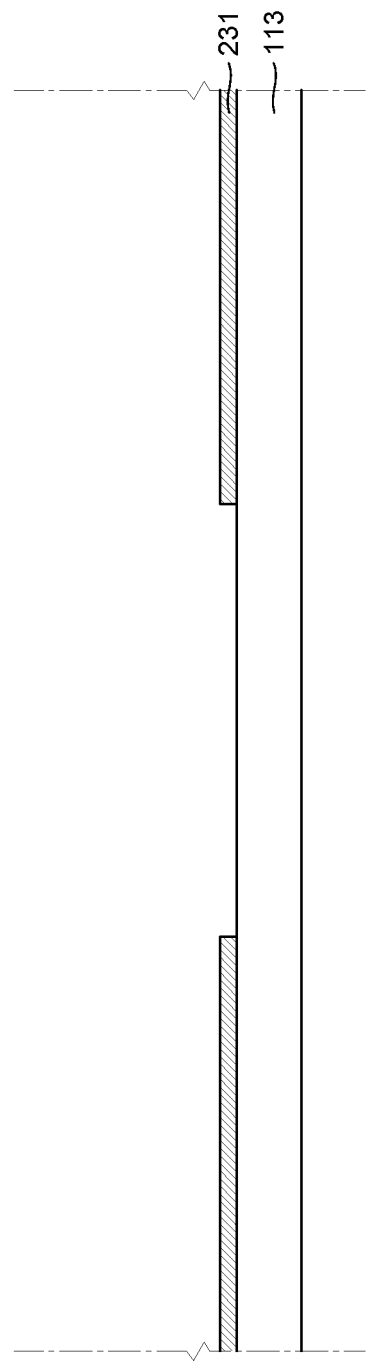
FIG. 19A through FIG. 19C are cross-sectional views sequentially showing a fabricating process of a part of a display device according to a tenth exemplary embodiment of the present disclosure.
Figure 19B:
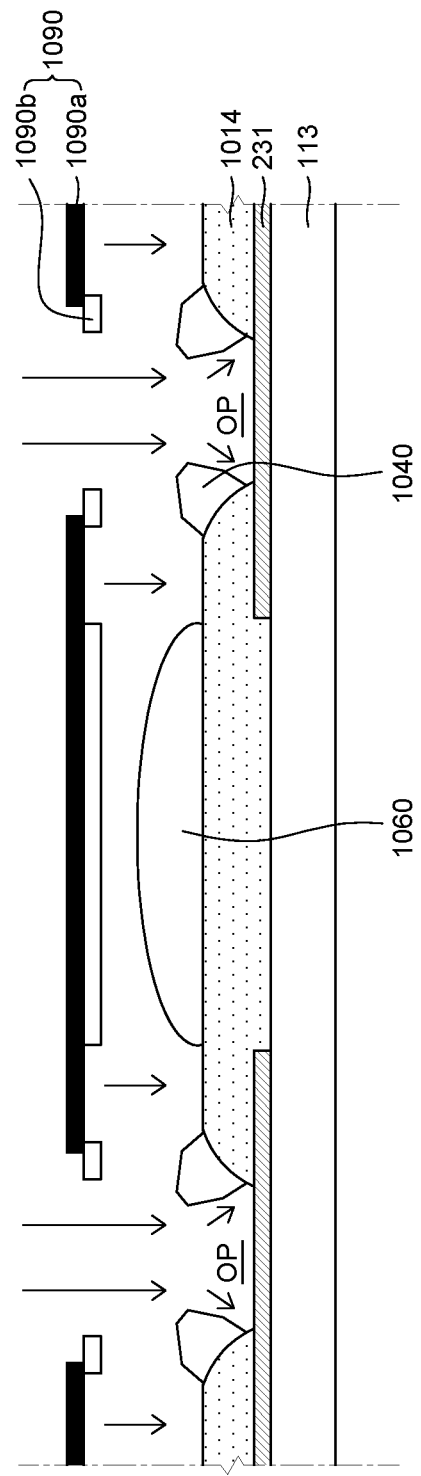
Figure 19C:
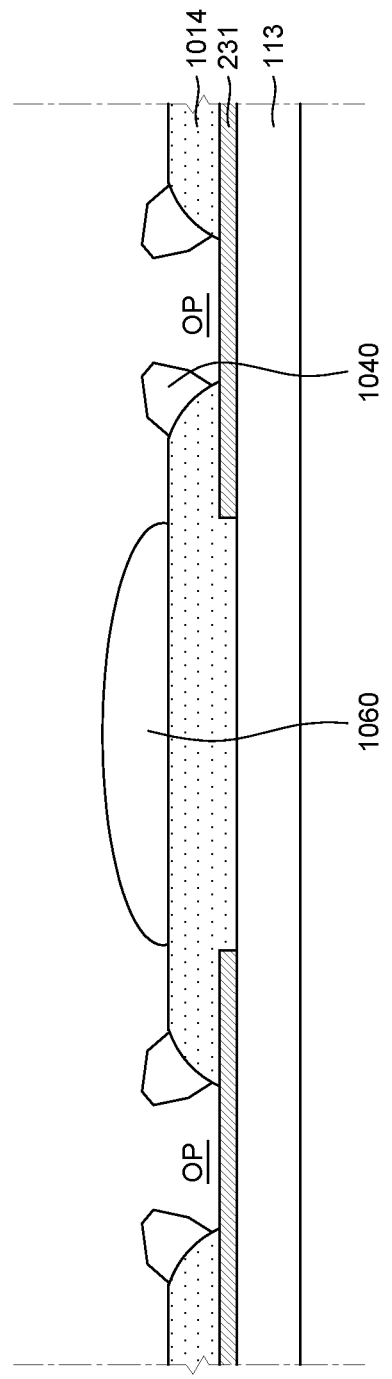

FIG. 19A through FIG. 19C are cross-sectional views sequentially showing a fabricating process of a part of a display device according to a tenth exemplary embodiment of the present disclosure.

The fabricating process of a display device according to the tenth exemplary embodiment of the present disclosure shown in FIG. 19A through FIG. 19C is substantially the same as the fabricating process according to the ninth exemplary embodiment except that each of a spacer 1060 and a protrusion 1040 has a dome shape. Thus, a repeated description for the same configuration and fabricating process will be omitted.

Referring to FIG. 19A, the overcoating layer 113 is formed on a substrate including a plurality of transistors and a capacitor.

Then, the first electrode 231 is formed on the overcoating layer 113.

Thereafter, referring to FIG. 19B, a first layer and a second layer are formed on the substrate on which the first electrode 231 has been formed.

Although not illustrated in the drawings, the first layer may be made of an organic material to form a bank 1014 and the second layer may be made of a photo-reactive organic material to form the spacer 1060 and the protrusion 1040.

The photo-reactive organic material may include a PR.

Then, a half-tone mask 1090 is disposed above the substrate on which the first layer and the second layer have been formed.

The half-tone mask 1090 may include a bank photo-mask part 1090a and a spacer photo-mask part 1090b.

Thereafter, exposure and development may be performed using the half-tone mask 1090 to form the bank 1014, the spacer 1060 and the protrusion 1040.

The bank 1014, the spacer 1060 and the protrusion 1040 may be similar to each other in taper angle.

Each of the spacer 1060 and the protrusion 1040 may have a dome shape.

The protrusion 1040 may be double-sloped, and its lower part may be steeper sloped than its upper part, but is not limited thereto.

Then, referring to FIG. 19C, the spacer 1060 and the protrusion 1040 may be cured through a heat treatment.

Figure 20A:
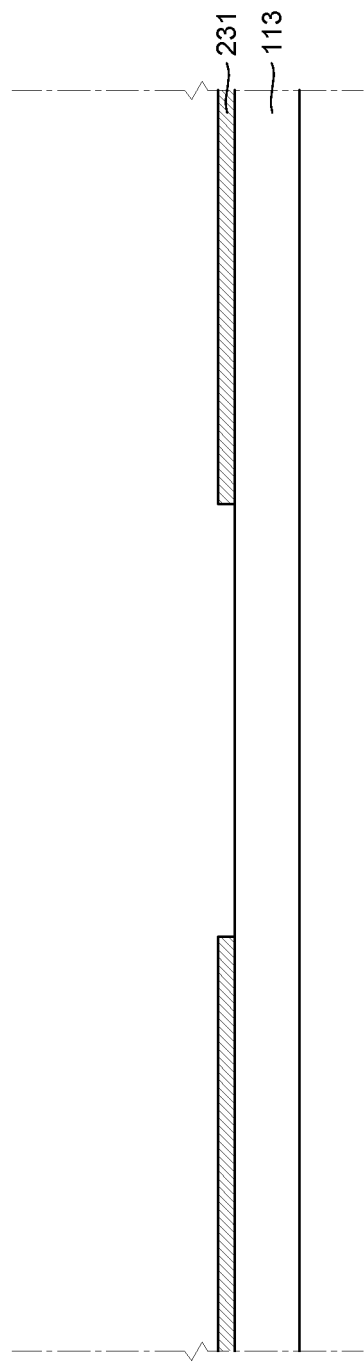
FIG. 20A through FIG. 20C are cross-sectional views sequentially showing a fabricating process of a part of a display device according to an eleventh exemplary embodiment of the present disclosure.
Figure 20B:
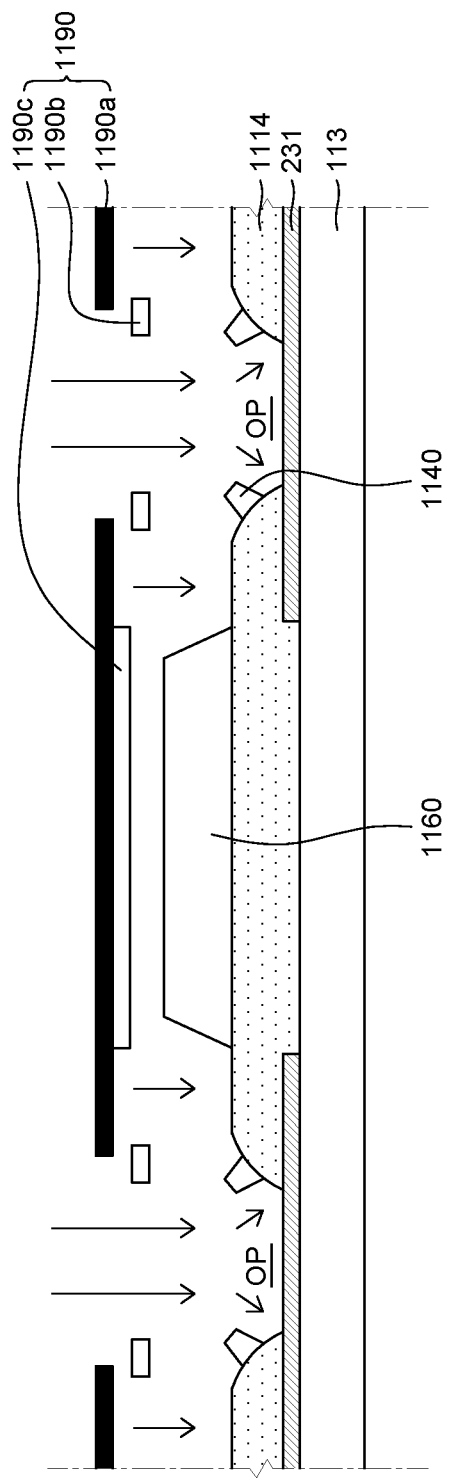
Figure 20C:
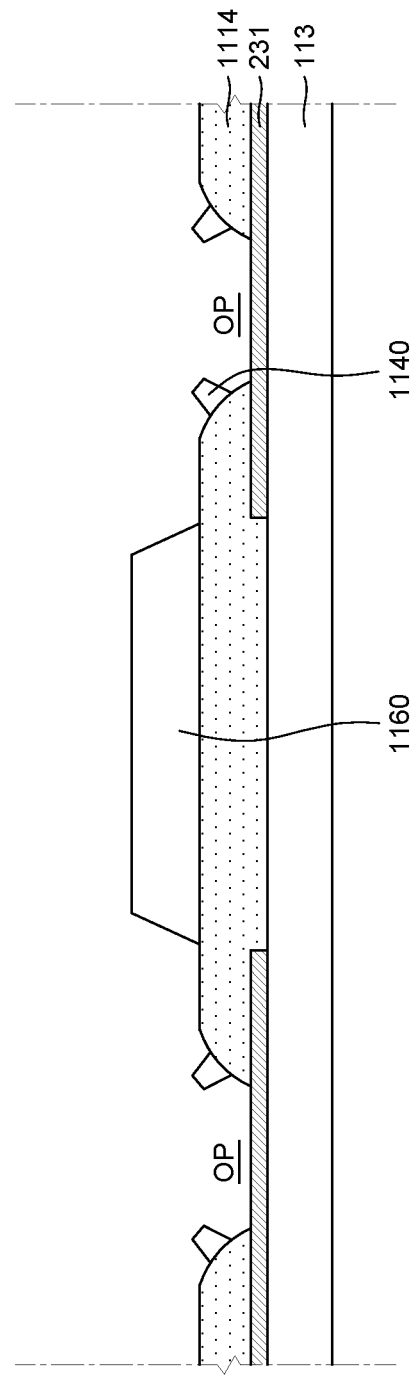

FIG. 20A through FIG. 20C are cross-sectional views sequentially showing a fabricating process of a part of a display device according to an eleventh exemplary embodiment of the present disclosure.

The fabricating process of a display device according to the eleventh exemplary embodiment of the present disclosure shown in FIG. 20A through FIG. 20C is substantially the same as the fabricating process according to the ninth exemplary embodiment except that each of a bank 1114, a spacer 1160 and a protrusion 1140 are formed through a single mask process using a triple-tone mask. Thus, a repeated description for the same configuration and fabricating process will be omitted.

Referring to FIG. 20A, the overcoating layer 113 is formed on a substrate including a plurality of transistors and a capacitor.

Then, the first electrode 231 is formed on the overcoating layer 113.

Thereafter, referring to FIG. 20B, a first layer and a second layer are formed on the substrate on which the first electrode 231 has been formed.

Although not illustrated in the drawings, the first layer may be made of an organic material to form the bank 1114 and the second layer may be made of a photo-reactive organic material to form the spacer 1160 and the protrusion 1140.

The photo-reactive organic material may include a PR.

Then, a triple-tone mask 1190 is disposed above the substrate on which the first layer and the second layer have been formed.

The triple-tone mask 1190 may include a bank photo-mask part 1190a, a spacer photo-mask part 1190b and a protrusion photo-mask part 1190c.

Thereafter, exposure and development may be performed using the triple-tone mask 1190 to form the bank 1114, the spacer 1160 and the protrusion 1140.

The bank 1114, the spacer 1160 and the protrusion 1140 may be similar to each other in taper angle.

Each of the spacer 1160 and the protrusion 1140 may have a trapezoidal shape.

Then, referring to FIG. 20C, the spacer 1160 and the protrusion 1140 may be cured through a heat treatment.

Figure 21A:
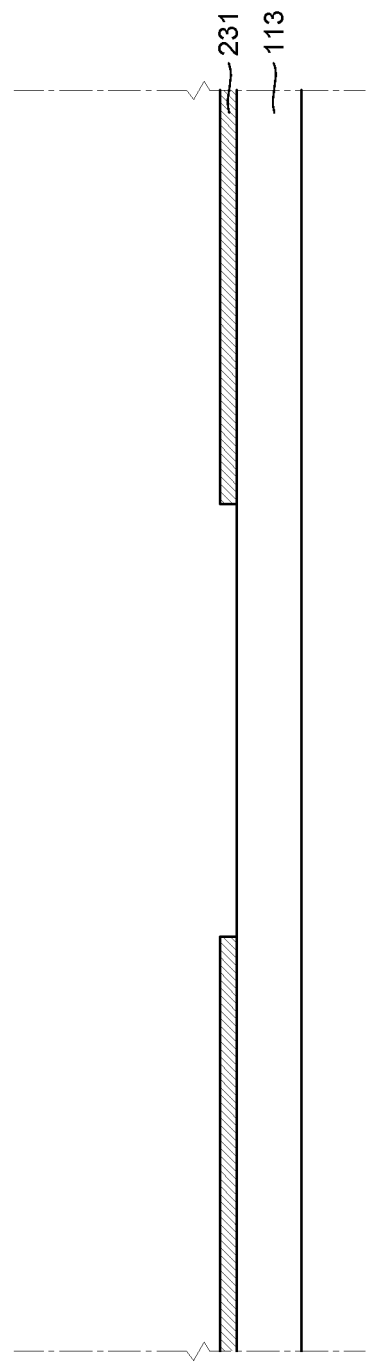
FIG. 21A through FIG. 21C are cross-sectional views sequentially showing a fabricating process of a part of a display device according to a twelfth exemplary embodiment of the present disclosure.
Figure 21B:
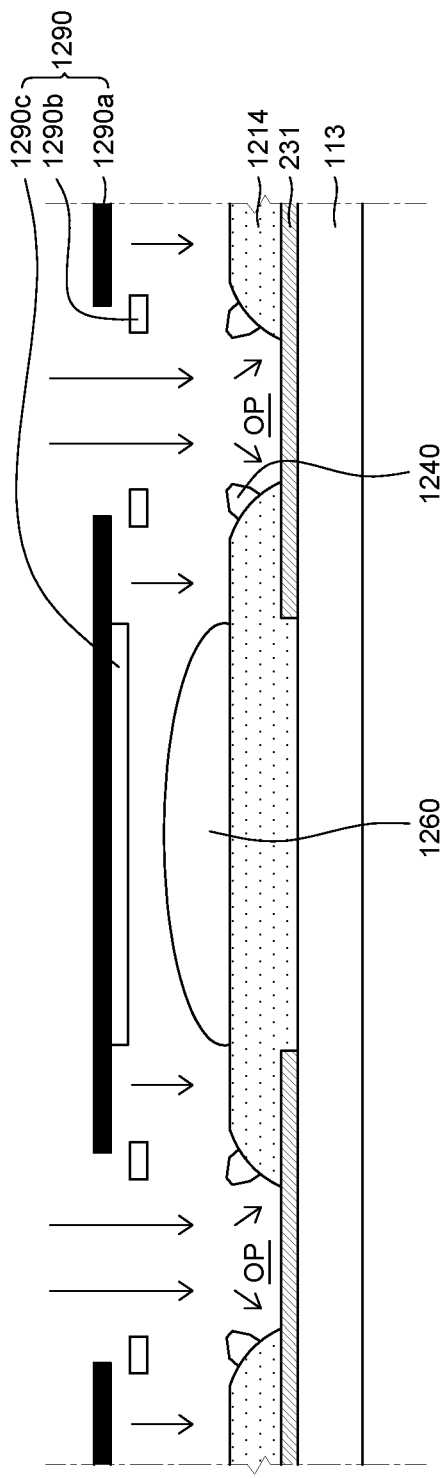
Figure 21C:
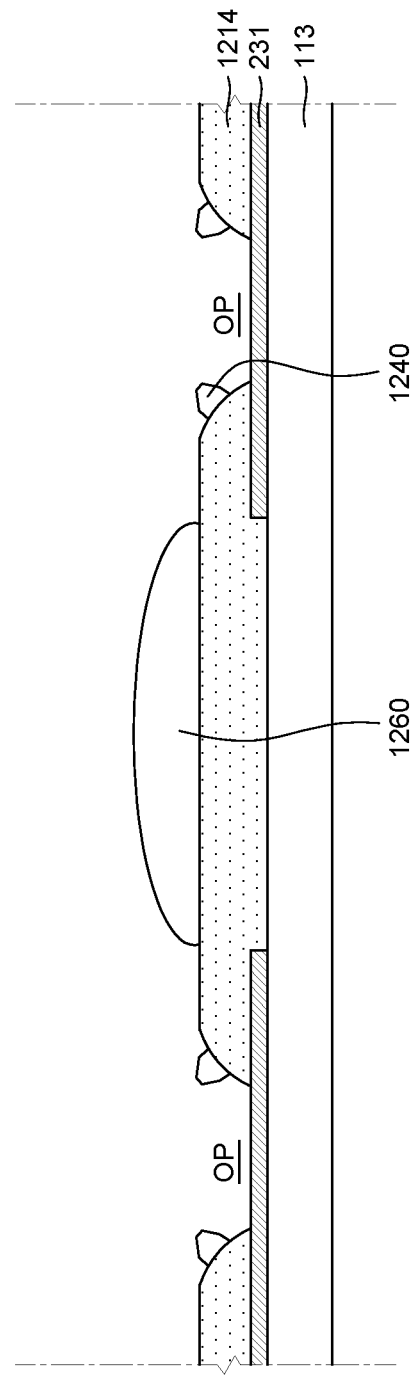

FIG. 21A through FIG. 21C are cross-sectional views sequentially showing a fabricating process of a part of a display device according to a twelfth exemplary embodiment of the present disclosure.

The fabricating process of a display device according to the twelfth exemplary embodiment of the present disclosure shown in FIG. 21A through FIG. 21C is substantially the same as the fabricating process according to the eleventh exemplary embodiment except that each of a spacer 1260 and a protrusion 1240 has a dome shape. Thus, a repeated description for the same configuration and fabricating process will be omitted.

Referring to FIG. 21A, the overcoating layer 113 is formed on a substrate including a plurality of transistors and a capacitor.

Then, the first electrode 231 is formed on the overcoating layer 113.

Thereafter, referring to FIG. 21B, a first layer and a second layer are formed on the substrate on which the first electrode 231 has been formed.

Although not illustrated in the drawings, the first layer may be made of an organic material to form a bank 1214 and the second layer may be made of a photo-reactive organic material to form the spacer 1260 and the protrusion 1240.

The photo-reactive organic material may include a PR.

Then, a triple-tone mask 1290 is disposed above the substrate on which the first layer and the second layer have been formed.

The triple-tone mask 1290 may include a bank photo-mask part 1290a, a spacer photo-mask part 1290b and a protrusion photo-mask part 1290c.

Thereafter, exposure and development may be performed using the triple-tone mask 1290 to form the bank 1214, the spacer 1260 and the protrusion 1240.

The bank 1214, the spacer 1260 and the protrusion 1240 may be similar to each other in taper angle.

Each of the spacer 1260 and the protrusion 1240 may have a dome shape.

Meanwhile, if the triple-tone masks 1190 and 1290 are used, the spacers 1160 and 1260 may have different heights from the protrusions 1140 and 1240, respectively.

Figure 22:
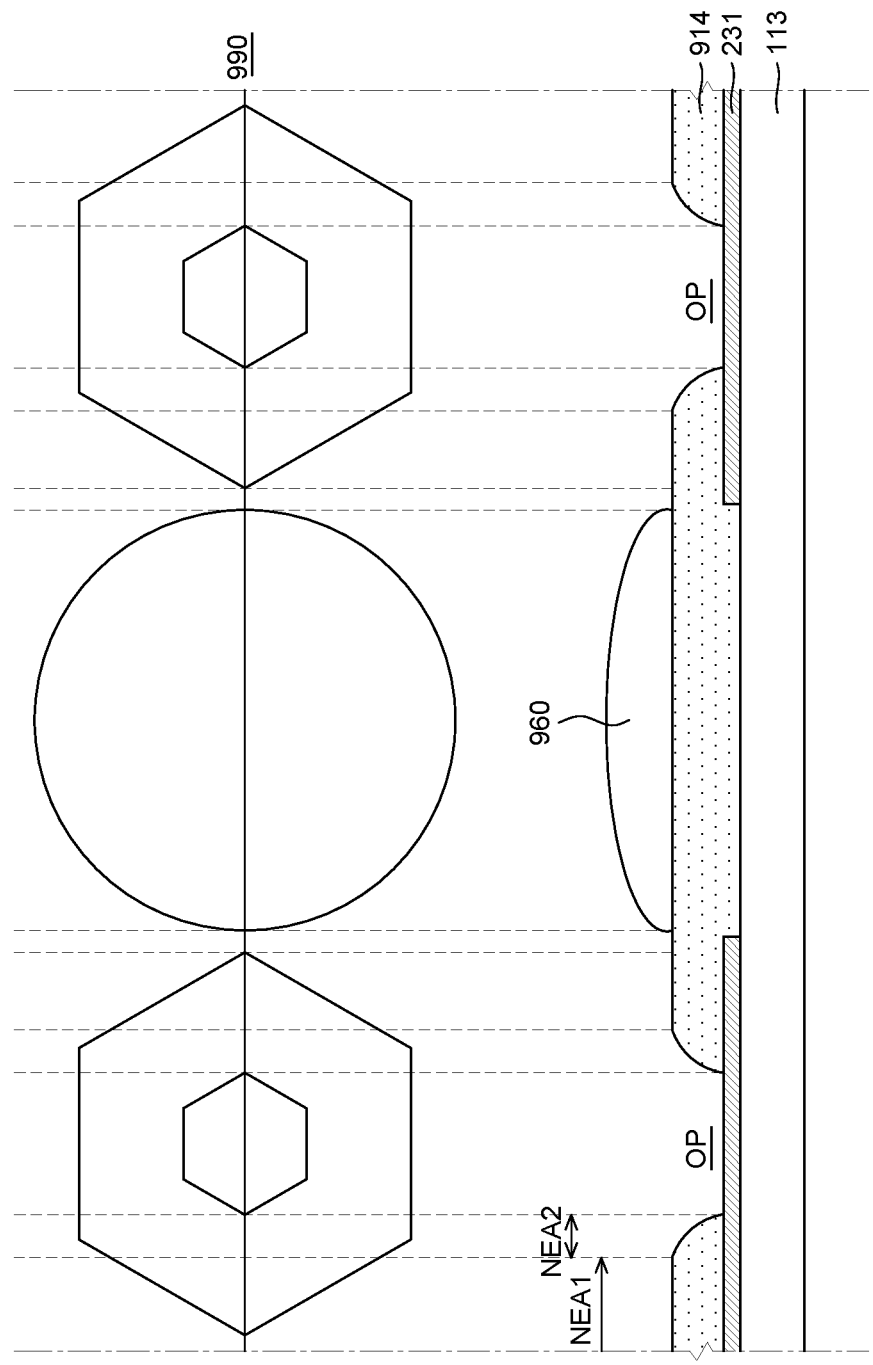
FIG. 22 is a cross-sectional view illustrating a part of a sub-pixel according to the ninth exemplary embodiment of the present disclosure.

FIG. 22 is a cross-sectional view illustrating a part of a sub-pixel according to the ninth exemplary embodiment of the present disclosure.

Figure 23:
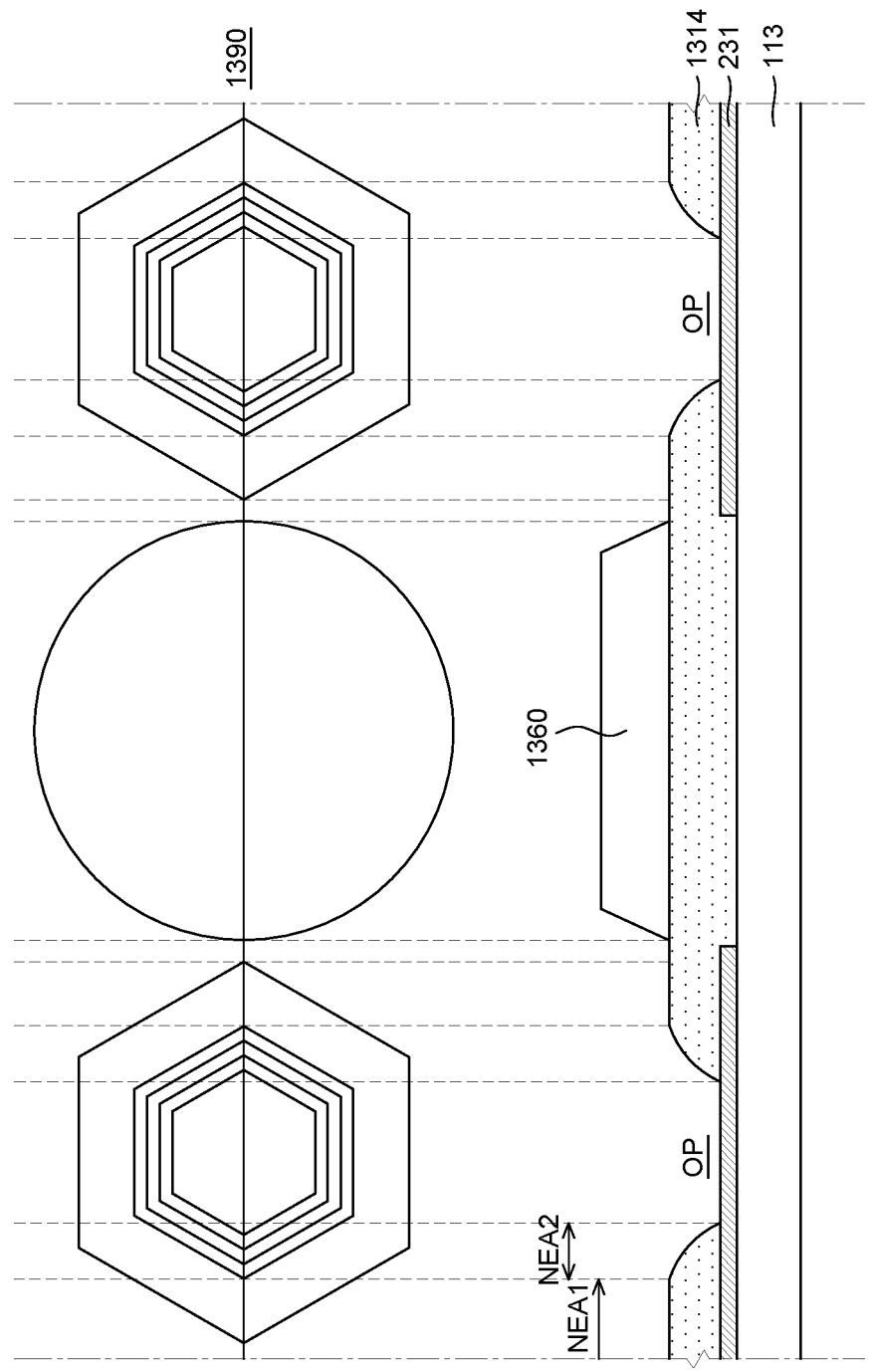
FIG. 23 is a cross-sectional view illustrating a part of a sub-pixel according to a thirteenth exemplary embodiment of the present disclosure.

FIG. 23 is a cross-sectional view illustrating a part of a sub-pixel according to a thirteenth exemplary embodiment of the present disclosure.

FIG. 22 shows the layout of the general mask 990 and a cross-sectional view illustrating a part of a sub-pixel formed using the same.

FIG. 23 shows the layout of a multi-tone mask 1390 and a cross-sectional view illustrating a part of a sub-pixel formed using the same.

Here, for convenience in explanation, an illustration of a protrusion is omitted.

Referring to FIG. 22 and FIG. 23, it can be seen that if the multi-tone mask 1390 is used to form a bank 1314 and the spacer 1360, a photo-exposure region is increased, as compared with a case where the general mask 990 is used. Thus, a taper region of the bank 1314 is increased.

That is, it can be seen that if the multi-tone mask 1390 is used, the second non-emission area NEA2 is further increased and a taper angle of the bank 1314 is decreased.

Although not illustrated in the drawings, if the multi-tone mask 1390 is used, the bank 1314, a spacer 1360 and the protrusion may be similar to each other in taper angle.

Each of the spacer 1360 and the protrusion may have a dome shape instead of a trapezoidal shape illustrated in the drawings, but the trapezoidal shape is easier to form a structure.

According to the present disclosure, the protrusion formed as described above may be applied to a sub-pixel having a pentile structure or a real structure. This will be described in detail with reference to the following drawings.

Figure 24:
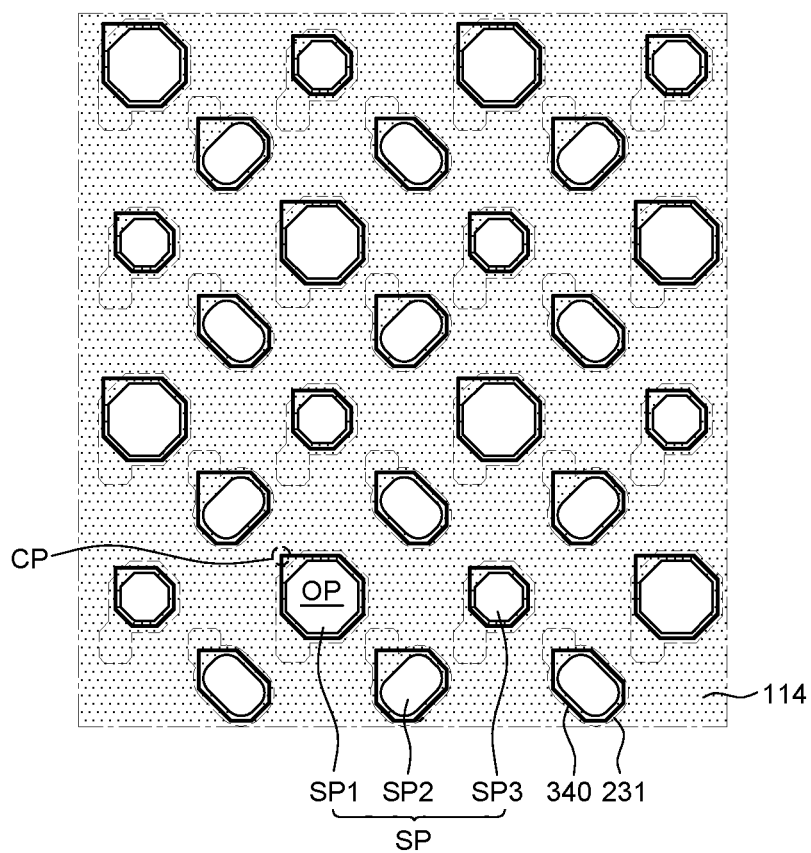
FIG. 24 is a plan view of a display device according to an exemplary embodiment of the present disclosure.

FIG. 24 is a plan view of a display device according to an exemplary embodiment of the present disclosure.

Figure 25:
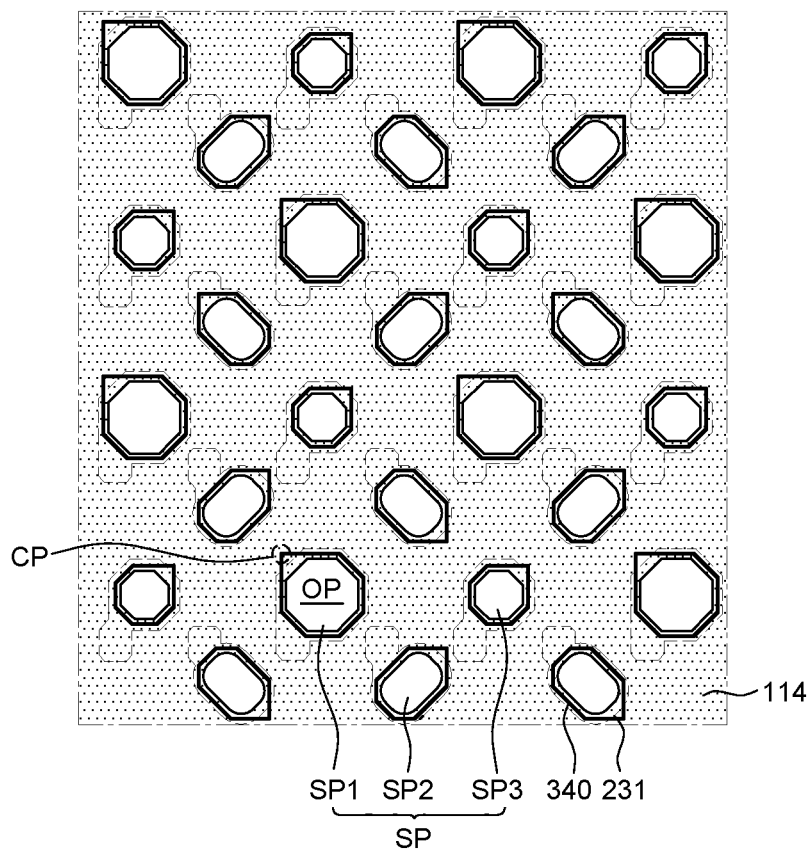
FIG. 25 is a plan view of a display device according to another exemplary embodiment of the present disclosure.

FIG. 25 is a plan view of a display device according to another exemplary embodiment of the present disclosure.

Figure 26:
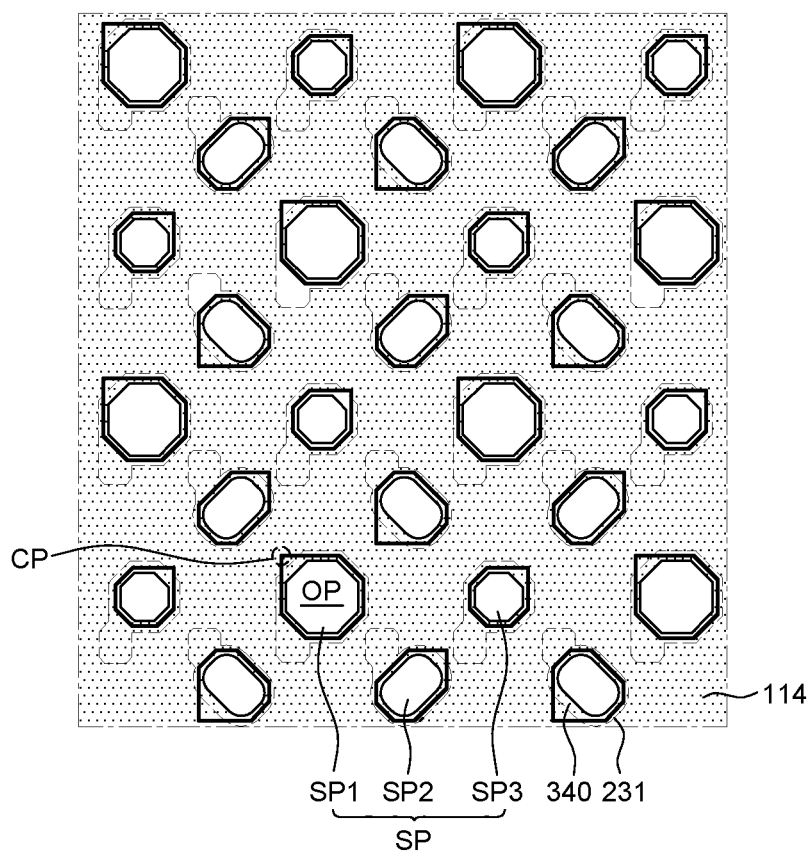
FIG. 26 is a plan view of a display device according to yet another exemplary embodiment of the present disclosure.

FIG. 26 is a plan view of a display device according to yet another exemplary embodiment of the present disclosure.

Figure 27:
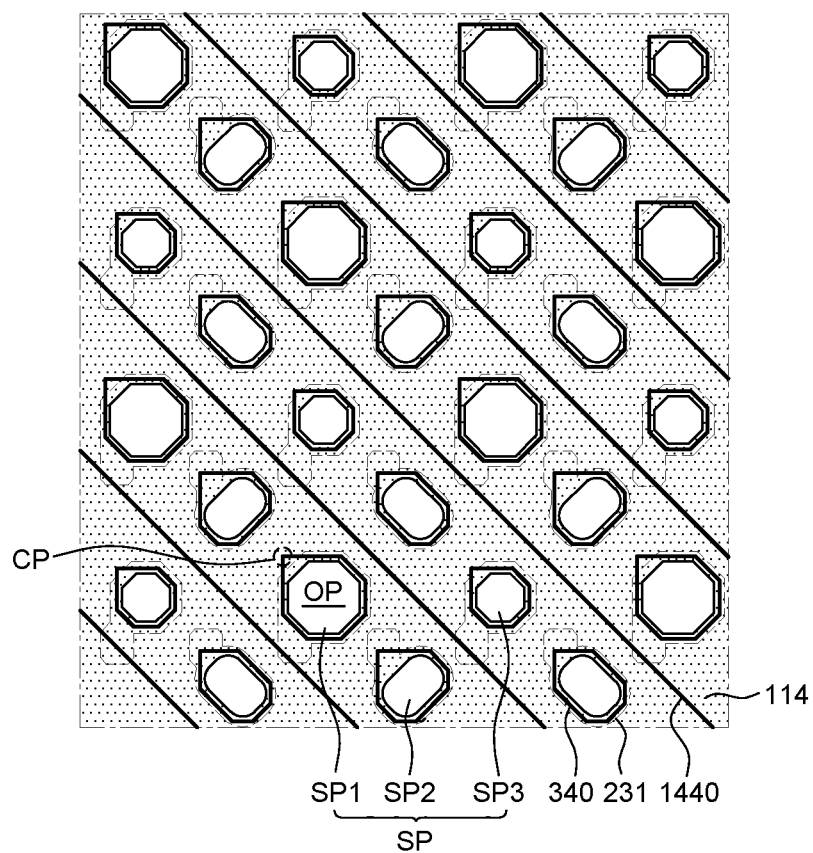
FIG. 27 is a plan view of a display device according to still another exemplary embodiment of the present disclosure.

FIG. 27 is a plan view of a display device according to still another exemplary embodiment of the present disclosure.

Figure 28:
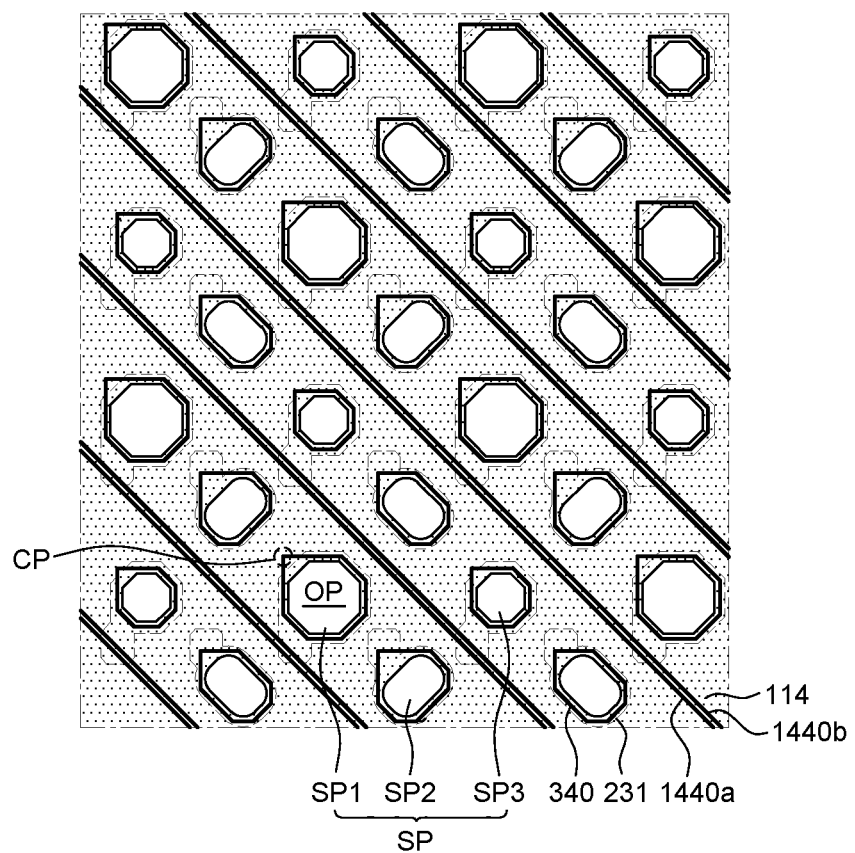
FIG. 28 is a plan view of a display device according to still another exemplary embodiment of the present disclosure.

FIG. 28 is a plan view of a display device according to still another exemplary embodiment of the present disclosure.

Figure 29:
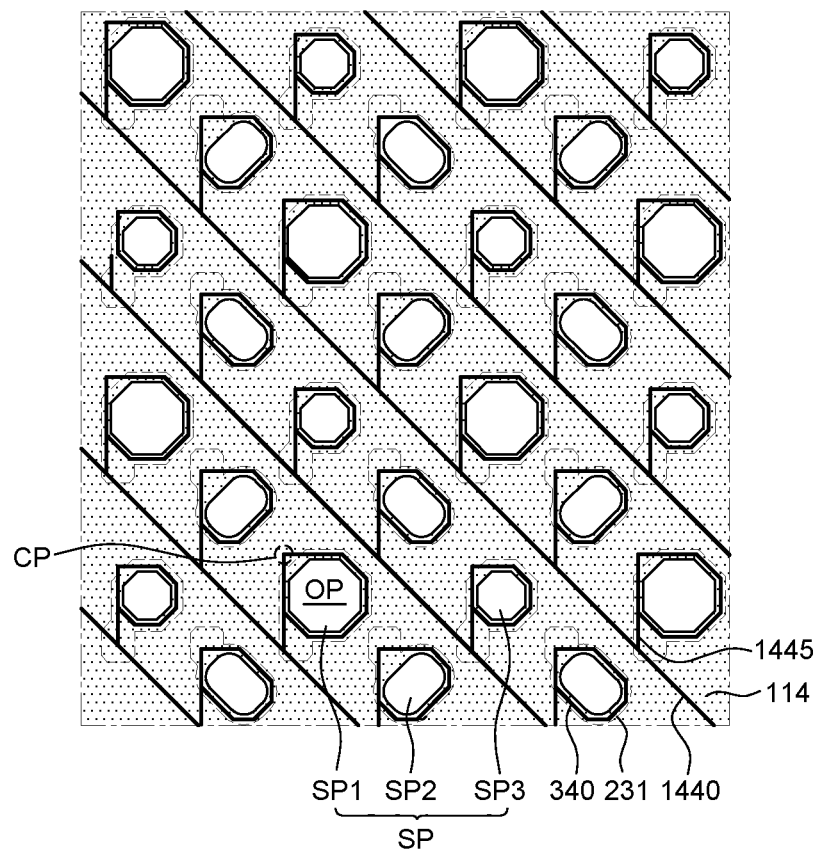
FIG. 29 is a plan view of a display device according to still another exemplary embodiment of the present disclosure.

FIG. 29 is a plan view of a display device according to still another exemplary embodiment of the present disclosure.

Figure 30:
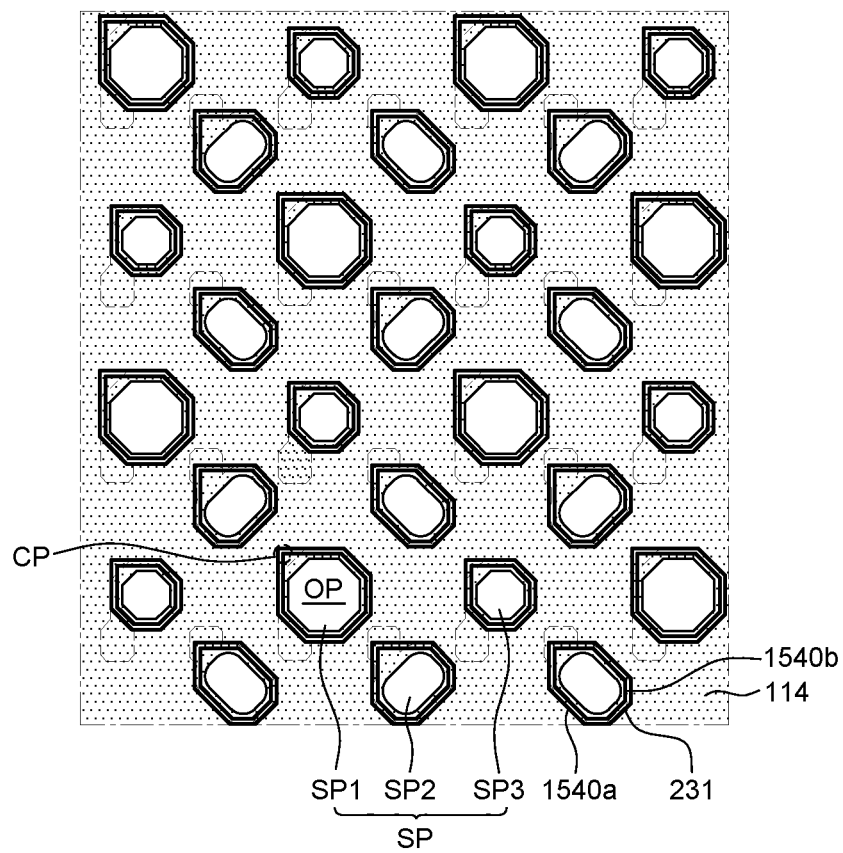
FIG. 30 is a plan view of a display device according to still another exemplary embodiment of the present disclosure.

FIG. 30 is a plan view of a display device according to still another exemplary embodiment of the present disclosure.

FIG. 24 through FIG. 30 illustrate a diamond pentile pixel array structure in which first, second and third sub-pixels SP1, SP2 and SP3 are arrayed in a diamond shape. The diamond pentile pixel array structure is known as having excellent perceptual image quality. However, the present disclosure is not limited to a pixel structure.

Referring to FIG. 24 through FIG. 30, sub-pixels SP may include a first sub-pixel SP1, a second sub-pixel SP2 and a third sub-pixel SP3.

A plurality of first sub-pixels SP1 and a plurality of third sub-pixels SP3 may be alternately disposed in the same column or in the same row. For example, the first sub-pixels SP1 and the third sub-pixels SP3 may be alternately disposed in the same column, and the first sub-pixels SP1 and the third sub-pixels SP3 may be alternately disposed in the same row.

A plurality of second sub-pixels SP2 may be disposed in different columns and in different rows from the plurality of first sub-pixels SP1 and the plurality of third sub-pixels SP3. For example, the plurality of second sub-pixels SP2 may be disposed in one row, and the plurality of first sub-pixels SP1 and the plurality of third sub-pixels SP3 may be alternately disposed in another row adjacent to the one row. The plurality of second sub-pixels SP2 may be disposed in one column, and the plurality of first sub-pixels SP1 and the plurality of third sub-pixels SP3 may be alternately disposed in another column adjacent to the one column. Alternatively, the plurality of first sub-pixels SP1 may diagonally face the plurality of second sub-pixels SP2, and the plurality of third sub-pixels SP3 may also diagonally face the plurality of second sub-pixels SP2. Therefore, the plurality of sub-pixels SP may be disposed in a lattice pattern.

FIG. 24 through FIG. 30 illustrate that the plurality of first sub-pixels SP1 and the plurality of third sub-pixels SP3 are disposed in the same column and in the same row, and the plurality of second sub-pixels SP2 is disposed in a different column and in a different row from the plurality of first sub-pixels SP1 and the plurality of third sub-pixels SP3. However, an array of the plurality of sub-pixels SP is not limited thereto.

Meanwhile, the plurality of second sub-pixels SP2 is different from each other in shape, but is not limited thereto.

Referring to FIG. 24 through FIG. 29, the protrusion 340 may be disposed to surround the first electrode 231 of each sub-pixel SP. The protrusion 340 may be disposed at the edges of the first electrode 231 along the shape of the opening OP of each sub-pixel SP, but is not limited thereto.

Also, as shown in FIG. 7A through FIG. 7C, at least a part of the protrusion 340 of the present disclosure may be disposed in the first non-emission area NEA1 rather than in the second non-emission area NEA2. That is, at least a part of the protrusion 340 is disposed in the first non-emission area NEAT so that second electrodes may be connected to each other between adjacent sub-pixels SP.

FIG. 24 through FIG. 29 (and FIG. 30) illustrate an example where the part of the protrusion 340 disposed in the first non-emission area NEA1 protrudes outwards further than the other part and forms a connection part CP. However, the present disclosure is not limited thereto.

The protrusion 340 may be disposed to overlap in part the first electrode 231 under the protrusion 340, but is not limited thereto.

The protrusion 340 of the present disclosure may have a substantially trapezoidal shape in a cross-sectional view, but is not limited thereto. In this case, angles at the ends of the lower base of the protrusion 340 may be acute or obtuse in a predetermined range. The protrusion 340 of the present disclosure may have various shapes such as a polygonal shape, for example, a triangular or rectangular shape, or a bell shape in a cross-sectional view.

The protrusion 340 of the present disclosure may function to suppress a lateral leakage current that occurs in a multi-stack structure. That is, the protrusion 340 of the present disclosure may disconnect in part an organic layer and a cathode from each other between adjacent sub-pixels SP.

The protrusion 340 of the present disclosure may be made of an organic material or an inorganic material.

The protrusion 340 of the present disclosure may be made of a different material from the bank 114, but is not limited thereto. The protrusion 340 of the present disclosure may be made of the same material as the bank 114, and in this case, the protrusion 340 and the bank 114 may be formed in the same process.

The protrusion 340 may be patterned together with the bank 114.

FIG. 24 through FIG. 26 illustrate various shapes of the protrusion 340, and FIG. 24 illustrates an example where the connection part CP is located at the same position in each of the sub-pixels SP. That is, the connection part CP of the protrusion 340 may be located at, for example, a left upper corner of each sub-pixel SP. The connection part CP of the protrusion 340 may be located between the first sub-pixel SP1 and the second sub-pixel SP2 and between the second sub-pixel SP2 and the third sub-pixel SP3.

FIG. 25 and FIG. 26 illustrate an example where the connection part CP of the protrusion 340 of the first sub-pixel SP1 is located at a different position from that of the second sub-pixel SP2 and the third sub-pixel SP3.

FIG. 27 and FIG. 28 illustrate substantially the same configuration as that in the exemplary embodiment of FIG. 24 except that dummy patterns 1440, 1440a and 1440b are formed between the sub-pixels SP.

FIG. 27 and FIG. 28 illustrate an example where each of the dummy patterns 1440, 1440a and 1440b is formed as a diagonal line between the sub-pixels SP, but is not limited thereto.

Each of the dummy patterns 1440, 1440a and 1440b may function to increase the length of a current path between adjacent sub-pixels SP.

FIG. 28 illustrates an example where dummy patterns include a first dummy pattern 1440a and a second dummy pattern 1440b, but the number of dummy patterns is not limited.

The dummy patterns 1440, 1440a and 1440b may be made of the same material as the protrusion 340, but are not limited thereto.

FIG. 29 illustrates an example where the protrusion 340 and the dummy pattern 1440 are made of metals, and in this case, the protrusion 340 and the dummy pattern 1440 may be connected to each other through a connection pattern 1445.

An initial signal or a ground signal may be applied to the dummy pattern 1440. The dummy pattern 1440 may function to discharge a voltage during an initial period.

FIG. 30 illustrates substantially the same configuration as that in the exemplary embodiment of FIG. 24 except that protrusions 1540a and 1540b are double-formed. The present disclosure is not limited to the number of protrusions 1540a and 1540b.

Figure 31:
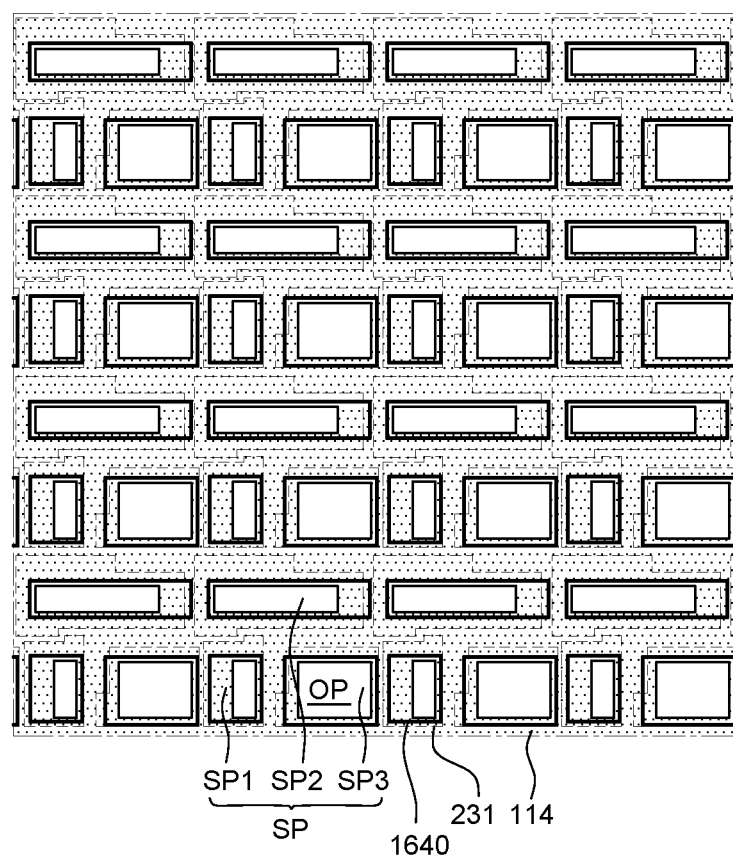
FIG. 31 is a plan view of a display device according to still another exemplary embodiment of the present disclosure.

FIG. 31 is a plan view of a display device according to still another exemplary embodiment of the present disclosure.

Figure 32:
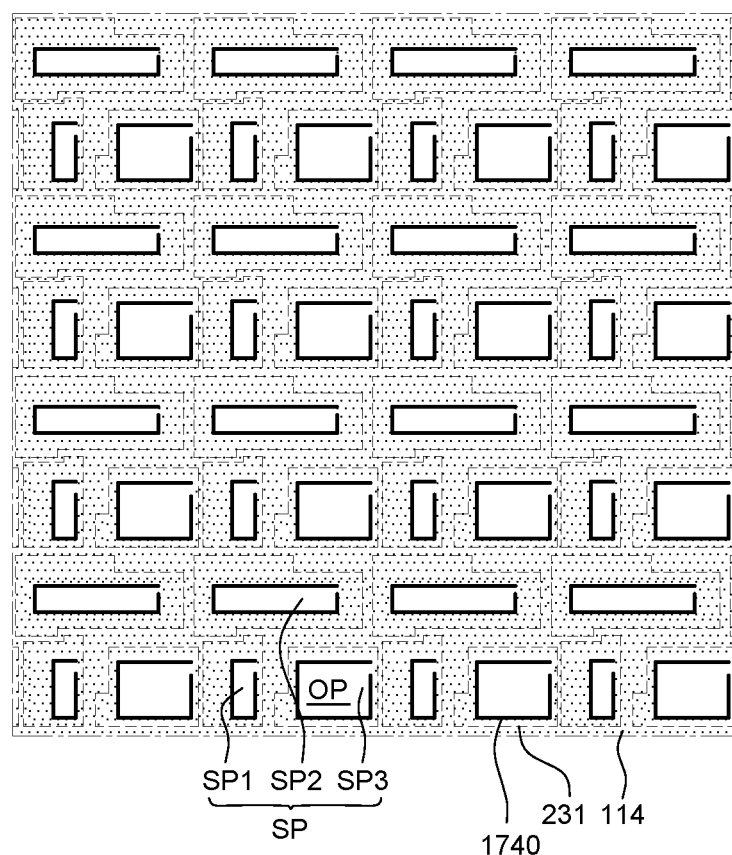
FIG. 32 is a plan view of a display device according to still another exemplary embodiment of the present disclosure.

FIG. 32 is a plan view of a display device according to still another exemplary embodiment of the present disclosure.

FIG. 31 and FIG. 32 illustrate sub-pixels each having a real structure.

Referring to FIG. 31 and FIG. 32, sub-pixels SP may include a first sub-pixel SP1, a second sub-pixel SP2 and a third sub-pixel SP3.

A plurality of first sub-pixels SP1 and a plurality of third sub-pixels SP3 may be alternately disposed in the same column or in the same row. For example, the first sub-pixels SP1 and the third sub-pixels SP3 may be alternately disposed in the same column.

A plurality of second sub-pixels SP2 may be disposed in a different column or in a different row from the plurality of first sub-pixels SP1 and the plurality of third sub-pixels SP3. For example, the plurality of second sub-pixels SP2 may be disposed in one row, and the plurality of first sub-pixels SP1 and the plurality of third sub-pixels SP3 may be alternately disposed in another row adjacent to the one row.

FIG. 31 and FIG. 32 illustrate an example where the plurality of first sub-pixels SP1 and the plurality of third sub-pixels SP3 are disposed in the same column and the plurality of second sub-pixels SP2 is disposed in a different column from the plurality of first sub-pixels SP1 and the plurality of third sub-pixels SP3. However, an array of the plurality of sub-pixels SP is not limited thereto.

Meanwhile, the plurality of sub-pixels SP is different from each other in shape, but is not limited thereto.

Referring to FIG. 31 and FIG. 32, each of protrusions 1640 and 1740 may be disposed to surround the first electrode 231 of each sub-pixel SP. Each of the protrusions 1640 and 1740 may be disposed at the edges of the first electrode 231 along the shape of the opening OP of each sub-pixel SP, but is not limited thereto.

Also, as shown in FIG. 7A through FIG. 7C, at least a part of the protrusion 1640 of the present disclosure may be disposed in the first non-emission area NEA1 rather than in the second non-emission area NEA2. That is, at least a part of the protrusion 1640 is disposed in the first non-emission area NEA1 so that second electrodes may be connected to each other between adjacent sub-pixels SP.

However, the present disclosure is not limited thereto. Referring to FIG. 32, at least a part of the protrusion 1740 of the present disclosure may not be disposed in the first non-emission area NEA1.

The exemplary embodiments of the present disclosure can also be described as follows:

According to an aspect of the present disclosure, there is provided a display device. The display device includes a substrate which includes an emission area and a non-emission area and in which a plurality of sub-pixels is defined; first electrodes disposed in the plurality of sub-pixels, respectively; a bank which is disposed in the non-emission area between the plurality of sub-pixels, and exposes the first electrode through an opening; a protrusion disposed at least in part in a second non-emission area of the non-emission area which is divided into a first non-emission area at a flat top surface of the bank and the second non-emission area at an inclined top surface of the bank; an organic layer disposed on the plurality of first electrodes; and a second electrode disposed on the organic layer.

The organic layer may include an emission layer disposed in each of the plurality of sub-pixels and a common layer disposed in in the plurality of sub-pixels in common, and the common layer and the second electrode may be disconnected from each other between adjacent sub-pixels at the protrusion.

The protrusion may be disposed on at least a part of edges of the first electrode along a shape of the opening of the sub-pixel, and the protrusion may be not disposed in another part of the edges of the first electrode.

The protrusion may be disposed along edges of the opening, and at least one part may be disposed in the first non-emission area and the other part may be disposed in the second non-emission area, and the other part disposed in the second non-emission area may be greater in length than the at least one part of the protrusion disposed in the first non-emission area.

The protrusion may be disconnected at a part of edges of the first electrode and divided into a plurality of parts.

The protrusion may be disposed to overlap in part the first electrode.

The protrusion may be made of a different material from the bank.

The protrusion may be made of the same material as the bank and becomes as a part of the bank.

The organic layer may include a first organic layer disposed at the opening; and a second organic layer disposed from the first non-emission area of the bank to an upper portion of the protrusion, and an end of the second organic layer may be spaced apart from the first organic layer at one side surface of the protrusion.

The display device may further include a spacer disposed over the bank in the first non-emission area.

The protrusion may be made of the same material as the spacer.

The protrusion may have a polygonal shape including a rectangular shape or a trapezoidal shape, a dome shape or a bell shape in a cross-sectional view.

If the protrusion may have the trapezoidal shape in a cross-sectional view, angles at ends of a lower base of the protrusion may have an acute angle greater than 90°-α, and the a may refer to an angle between the substrate and a tangent of a top surface of the bank on which the protrusion is disposed.

If the protrusion may have the trapezoidal shape in a cross-sectional view, angles at ends of a lower base of the protrusion may have an obtuse angle smaller than 120°.

Two or more protrusions may be disposed on at least a part of edges of the first electrode along a shape of the opening of the sub-pixel.

The plurality of sub-pixels may include a first sub-pixel, a second sub-pixel and a third sub-pixel, and a plurality of first sub-pixels and a plurality of third sub-pixels may be alternately disposed in the same column or in the same row, and a plurality of second sub-pixels may be disposed in a different column and in a different row from the plurality of first sub-pixels and the plurality of third sub-pixels.

The protrusion disposed in the first non-emission area may protrude outwards further than the other part and forms a connection part, and the organic layer and the second electrode may be disconnected from each other between adjacent sub-pixels at the connection part.

The display device may further include a dummy pattern disposed as a diagonal line between the sub-pixels, wherein the dummy pattern may be made of the same material at the same layer as the protrusion.

The protrusion and the dummy pattern may be made of metals, and the protrusion and the dummy pattern may be connected to each other through a connection pattern.

According to another aspect of the present disclosure, there is provided a display device. The display device includes first electrodes disposed in a plurality of sub-pixels, respectively; a bank which is disposed to cover a part of edges of the first electrode and includes a first area at a flat top surface and a second area at an inclined top surface; a protrusion disposed on the bank; an organic layer disposed on the first electrodes; and a second electrode disposed on the organic layer, wherein the protrusion may be disposed in the second area, and the organic layer and the second electrode may be disconnected from each other at a side surface of the protrusion between adjacent sub-pixels.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a plurality of first electrodes disposed in a plurality of sub-pixels, respectively;
    a bank that is disposed to cover a part of edges of a first electrode from the plurality of first electrodes and includes a first area at a flat top surface and a second area at an inclined top surface;
    a protrusion disposed on the bank;
    an organic layer disposed on the plurality of first electrodes; and
    a second electrode disposed on the organic layer; and
    a spacer over the bank in the first area,
    wherein the protrusion is disposed in the second area, and
    the organic layer and the second electrode are disconnected from each other at a side surface of the protrusion between adjacent sub-pixels from the plurality of sub-pixels.

2. The display device according to claim 1, wherein the bank exposes a first electrode from the plurality of first electrodes through an opening.

3. The display device according to claim 2, wherein the protrusion is disposed at least at a part of edges of the first electrode along a shape of the opening, and the protrusion is not disposed in another part of the edges of the first electrode.

4. The display device according to claim 3, wherein the protrusion is divided into a plurality of parts that are disconnected from each other at the part of edges of the first electrode.

5. The display device according to claim 1, wherein the protrusion overlaps in part the first electrode.

6. The display device according to claim 1, wherein the protrusion includes a different material from the bank.

7. The display device according to claim 1, wherein the protrusion includes a same material as the bank and is a part of the bank.

8. The display device according to claim 1, wherein the protrusion includes a same material as the spacer.

9. The display device according to claim 1, wherein the protrusion has a polygonal shape including a rectangular shape or a trapezoidal shape, a dome shape or a bell shape in a cross-sectional view of the display device.

* * * * *